(12) United States Patent
Frimpong et al.

(10) Patent No.: US 11,914,057 B2
(45) Date of Patent: *Feb. 27, 2024

(54) SYSTEM FOR DETECTING AN OBJECT APPROACHING AND/OR IMPACTING ELECTRICAL EQUIPMENT

(71) Applicant: HITACHI ENERGY LTD, Zürich (CH)

(72) Inventors: George K. Frimpong, Raleigh, NC (US); Alberto Prieto Colmenero, Cary, NC (US); Claire Pitois, Sundbyberg (SE)

(73) Assignee: HITACHI ENERGY LTD, Zürich (CH)

( * ) Notice: Subject to any disclaimer, the term of this patent is extended or adjusted under 35 U.S.C. 154(b) by 1113 days.

This patent is subject to a terminal disclaimer.

(21) Appl. No.: 16/709,181

(22) Filed: Dec. 10, 2019

(65) Prior Publication Data

US 2020/0114393 A1   Apr. 16, 2020

Related U.S. Application Data

(63) Continuation of application No. 15/456,431, filed on Mar. 10, 2017, now Pat. No. 10,543,511, which is a (Continued)

(51) Int. Cl.
*G01S 3/808* (2006.01)
*B05D 7/00* (2006.01)
(Continued)

(52) U.S. Cl.
CPC .............. *G01S 3/808* (2013.01); *B05C 1/003* (2013.01); *B05D 7/56* (2013.01); *C09D 5/082* (2013.01);
(Continued)

(58) Field of Classification Search
CPC .......... G01S 3/803; G01S 3/808; G01S 11/14; G01S 5/18; Y10S 367/906
(Continued)

(56) References Cited

U.S. PATENT DOCUMENTS

| 5,092,607 A | 3/1992 | Ramsay et al. |
| 5,241,518 A | 8/1993 | Mcnelis et al. |

(Continued)

FOREIGN PATENT DOCUMENTS

| CN | 85107388 A | 4/1987 |
| CN | 101111778 A | 1/2008 |

(Continued)

OTHER PUBLICATIONS

International Search Report and Written Opinion issued in corresponding international application No. PCT/US2015/056910, dated Feb. 11, 2016, 18 pp.

(Continued)

*Primary Examiner* — Ian J Lobo
(74) *Attorney, Agent, or Firm* — Sage Patent Group

(57) ABSTRACT

A system for detecting an object approaching and/or impacting electrical equipment is disclosed. The system includes a housing for the electrical equipment and acoustic sensor(s) for measuring a sound pressure of the object approaching the housing, the acoustic sensor(s) disposed at a location at which the acoustic sensor(s) is not in contact with the housing. The system further includes vibration sensor(s) for measuring an acceleration of a surface of the housing caused by the object striking the housing, the vibration sensor(s) disposed at a location at which the vibration sensor(s) is in contact with the housing, and a computer readable storage medium having thereon machine-readable instructions that (Continued)

when executed determine the approach of the object for impact on the housing and/or the impact of the object to the housing.

22 Claims, 51 Drawing Sheets

Related U.S. Application Data continuation-in-part of application No. 14/919,956, filed on Oct. 22, 2015, now Pat. No. 10,431,375.

(60) Provisional application No. 62/238,196, filed on Oct. 7, 2015.

(51) Int. Cl.
| | | |
|---|---|---|
| *C09D 5/08* | (2006.01) | |
| *B05C 1/00* | (2006.01) | |
| *G01S 5/00* | (2006.01) | |
| *G01R 31/62* | (2020.01) | |
| *G01S 3/803* | (2006.01) | |
| *G01S 11/14* | (2006.01) | |
| *G01S 5/18* | (2006.01) | |
| *C09D 5/00* | (2006.01) | |
| *C08K 3/22* | (2006.01) | |
| *C08K 5/29* | (2006.01) | |
| *C09D 7/00* | (2018.01) | |
| *C08K 3/30* | (2006.01) | |
| *F41H 5/06* | (2006.01) | |
| *G01H 1/00* | (2006.01) | |

(52) U.S. Cl.
CPC ............ *G01R 31/62* (2020.01); *G01S 3/803* (2013.01); *G01S 5/0018* (2013.01); *G01S 5/18* (2013.01); *G01S 11/14* (2013.01); *C08K 3/22* (2013.01); *C08K 5/29* (2013.01); *C08K 2003/3045* (2013.01); *C09D 5/002* (2013.01); *C09D 7/00* (2013.01); *F41H 5/06* (2013.01); *G01H 1/00* (2013.01); *G01S 5/0027* (2013.01); *Y10S 367/906* (2013.01)

(58) Field of Classification Search
USPC ........................................ 367/124, 129, 906
See application file for complete search history.

(56) References Cited

U.S. PATENT DOCUMENTS

| | | | |
|---|---|---|---|
| 5,949,343 A * | 9/1999 | Sesekura ............ | G01R 31/1281 361/37 |
| 6,601,436 B1 * | 8/2003 | Senda .................... | G10H 3/146 73/12.09 |
| 7,365,856 B2 | 4/2008 | Everett et al. | |
| 7,954,359 B1 | 6/2011 | Paderewski et al. | |
| 8,580,387 B1 | 11/2013 | Fedderly et al. | |
| 9,004,490 B2 * | 4/2015 | Kazakov ................... | F41J 5/06 273/408 |
| 9,377,341 B1 | 6/2016 | Watson | |
| 10,679,787 B2 * | 6/2020 | Frimpong ............. | F41H 5/0457 |
| 2002/0185324 A1 | 12/2002 | Campbell et al. | |
| 2005/0156417 A1 | 7/2005 | Breed et al. | |
| 2007/0070583 A1 | 3/2007 | Callsen et al. | |
| 2008/0124020 A1 | 5/2008 | Neiwczas et al. | |
| 2008/0192389 A1 | 8/2008 | Muench et al. | |
| 2009/0315657 A1 | 12/2009 | Hoffman et al. | |
| 2009/0319212 A1 | 12/2009 | Cech et al. | |
| 2010/0122626 A1 | 5/2010 | Drever | |
| 2010/0326192 A1 | 12/2010 | Petelenz et al. | |
| 2011/0272319 A1 | 11/2011 | Koivuluoma et al. | |
| 2012/0205175 A1 | 8/2012 | Masserang et al. | |
| 2013/0158897 A1 | 6/2013 | Jain | |
| 2013/0265153 A1 | 10/2013 | Taylor et al. | |
| 2013/0271166 A1 | 10/2013 | Bouffard et al. | |
| 2014/0015329 A1 | 1/2014 | Widmer et al. | |
| 2015/0107363 A1 | 4/2015 | Takahaski et al. | |
| 2015/0171485 A1 | 6/2015 | Rawlinson | |
| 2015/0171486 A1 | 6/2015 | Rawlinson | |
| 2015/0274119 A1 | 10/2015 | Schondorf | |
| 2015/0369751 A1 | 12/2015 | Cheim et al. | |
| 2016/0039378 A1 | 2/2016 | Foo et al. | |
| 2017/0011612 A1 | 1/2017 | Jain | |

FOREIGN PATENT DOCUMENTS

| | | |
|---|---|---|
| CN | 102243041 A | 11/2011 |
| CN | 102709037 A | 10/2012 |
| CN | 103487513 A | 1/2014 |
| CN | 103969555 A | 8/2014 |
| DE | 3729048 A1 | 3/1989 |
| GB | 2496062 A | 5/2013 |

OTHER PUBLICATIONS

European communication and search report for European application No. 15791137.1 dated Nov. 10, 2020, 26 pages.
Bartoletti et al., "Vibro-Acoustic Techniques to Diagnose Power Transformers", IEEE Transactions on Power Delivery, vol. 19, No. 1, Jan. 2004, pp. 221-229.
Langan et al., "Advanced Transformer Performance Analysis For The 90's", 7 pages.
Decision for Grant of Patent for Korean Patent Application No. 10-2017-7013947, dated May 2, 2022, 4 pages.

* cited by examiner

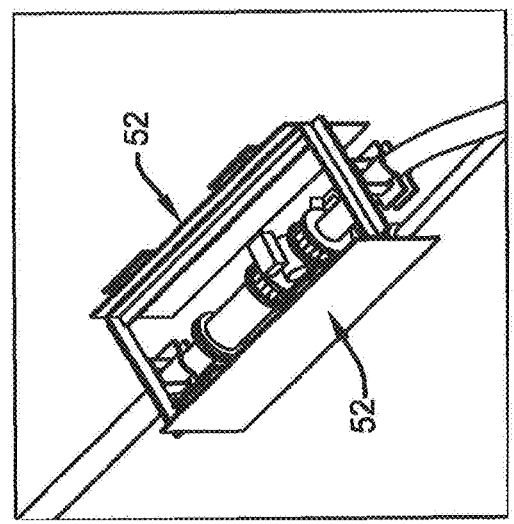
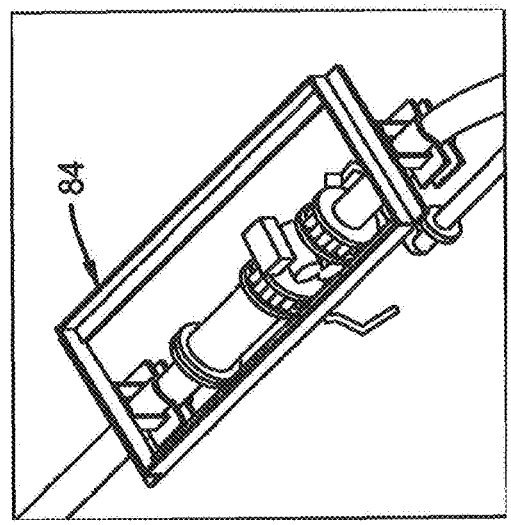
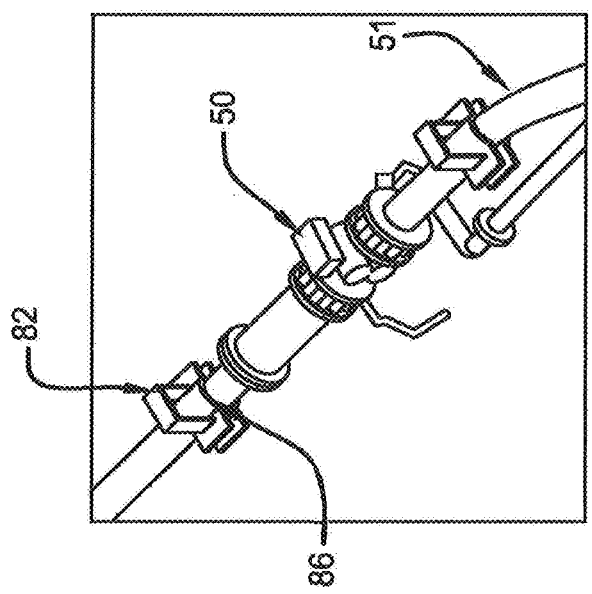
FIG. 6

$L_i$, sound pressure level measured at the ith location for the A-weighted sound level, or for a discrete frequency ONAN No Load Sound Measurements

HC2008007

| Measure Pt. | 1 | 1 | 2 | 2 | 3 | 3 | 4 | 4 | 5 | 5 | 6 | 6 | 7 | 7 | 8 | 8 | 9 | 9 | 10 | 10 | 11 | 11 | 12 | 12 | 13 | 13 |
|---|---|---|---|---|---|---|---|---|---|---|---|---|---|---|---|---|---|---|---|---|---|---|---|---|---|---|
| Ht | 1/3 | 2/3 | 1/3 | 2/3 | 1/3 | 2/3 | 1/3 | 2/3 | 1/3 | 2/3 | 1/3 | 2/3 | 1/3 | 2/3 | 1/3 | 2/3 | 1/3 | 2/3 | 1/3 | 2/3 | 1/3 | 2/3 | 1/3 | 2/3 | 1/3 | 2/3 |
| Freq. 12.5 | | | | | | | | | | | | | | | | | | | | | | | | | | |
| 100 | 31.8 | 31.5 | 23.3 | 24.8 | 31.9 | 31.4 | 35.7 | 35.1 | 31.9 | 31.9 | 23.9 | 25.5 | 30.6 | 34.2 | 36.7 | 35 | 33.3 | 32.3 | 33.7 | 32.7 | 30.7 | 26.3 | 26.7 | 24.4 | 27.1 | 29 |
| 125 | 47 | 46.6 | 38.4 | 39.9 | 47.1 | 46.6 | 50.9 | 50.2 | 47.1 | 46.8 | 39.1 | 39.9 | 45.8 | 49.4 | 51.9 | 48.4 | 48.6 | 47.5 | 48.9 | 47.9 | 45.9 | 41.4 | 41.8 | 39.5 | 42.2 | 44.1 |
| 160 | 27.3 | 28.9 | 23.4 | | 27 | 24.7 | 26.8 | 28.8 | 24 | 26 | 23.9 | 26.1 | 26.5 | 28.4 | 30.8 | 25.9 | 30.6 | 24.1 | 28.7 | 26.9 | 25 | 22 | 21.3 | 23.4 | 28.2 |
| 200 | 31.8 | 35.9 | 31.7 | 34.8 | 35.3 | 29.5 | 33.5 | 31.3 | 28.9 | 31.8 | 34.5 | 31.8 | 30.2 | 32.5 | 34 | 28.4 | 40 | 29.8 | 43.3 | 35.2 | 35.5 | 31.2 | 38.8 | 33.7 | 34 | 34.5 |
| 250 | 41 | 48.3 | 44.8 | 50 | 49 | 41.9 | 48.4 | 36.4 | 42.5 | 42.5 | 48.6 | 41 | 32.3 | 42.5 | 40.3 | 39.7 | 53.9 | 44.1 | 58.3 | 49.2 | 50.1 | 45.2 | 54 | 48.4 | 48.3 | 45.4 |
| 315 | 53.6 | 46 | 56.6 | 50.6 | 48.7 | 47.6 | 39.2 | 47.3 | 44.8 | 35.5 | 48.3 | 41.7 | 51.2 | 47.8 | 51.7 | 49.9 | 41.3 | 47 | 41.9 | 44.1 | 42.5 | 45.7 | 49.6 | 43.9 | 52.5 | 42.1 |
| 400 | 58.5 | 51 | 61.3 | 55.6 | 53.1 | 52 | 43.8 | 52.2 | 49.8 | 38.1 | 53.1 | 45.2 | 56.2 | 52.7 | 56.7 | 54.7 | 46.8 | 52.2 | 48 | 44.1 | 41.8 | 50.6 | 54.3 | 45.5 | 57.3 | 34.8 |
| 500 | 51.8 | 55.5 | 53.6 | 50.7 | 53.3 | 41.2 | 46.3 | 41.4 | 47 | 46.7 | 42.1 | 37.4 | 45 | 44.6 | 44.3 | 51 | 57.5 | 56.8 | 58.7 | 57.4 | 50.2 | 50.2 | 45.9 | 41.1 | 39.9 | 44.4 |
| 630 | 57.1 | 52.7 | 57.3 | 51.9 | 52.2 | 46.6 | 46.2 | 47.3 | 42 | 46.8 | 43.7 | 40.1 | 48 | 44.4 | 48.7 | 48.9 | 50 | 56 | 52.9 | 52.7 | 50.9 | 51.6 | 53.9 | 45.6 | 50.4 | 48.9 |
| 800 | 59.7 | 54.1 | 58 | 49 | 53.6 | 54.1 | 49.3 | 52.6 | 48.2 | 51.4 | 50.9 | 46.6 | 52.3 | 51.6 | 49.7 | 49.8 | 59.7 | 55 | 56.9 | 55.7 | 51.1 | 53 | 59.8 | 51.2 | 55.4 | 52.8 |
| 1000 | 49.3 | 51.4 | 52.9 | 51 | 53.8 | 53 | 52.9 | 44.9 | 44 | 44.2 | 40.7 | 46.4 | 38.1 | 40.1 | 49.5 | 49.5 | 50 | 46.7 | 48.9 | 50.5 | 49 | 46.3 | 47 | 46.9 | 49.6 | 50.1 |
| 1250 | 40.6 | 45.6 | 46.2 | 46.8 | 41.8 | 40.8 | 45.1 | 42.2 | 37 | 33.9 | 36.4 | 33.5 | 37.7 | 40 | 37.7 | 39.5 | 35 | 40.6 | 45.3 | 45.9 | 45.9 | 43.7 | 41.7 | 35.9 | 39.9 | 39 |
| 1600 | 28.6 | 29.3 | 37.7 | 35.1 | 29.7 | 31.2 | 28.1 | 27.8 | 21.6 | 26.4 | 27.4 | 23.6 | 27.4 | 24.8 | 26.4 | 26 | 31.3 | 30.3 | 32.8 | 31.4 | 31.5 | 27.9 | 24.5 | 22.5 | 25.8 | 29.9 |
| 2000 | 25.3 | 25.2 | 27.8 | 25.3 | 22.5 | 25.6 | 24 | | 21.6 | | | | | | 21.5 | | 26.9 | 22.3 | 27.1 | 21 | 28.5 | 22.7 | | | 21.2 | 22 |
| A WT. | 64.5 | 61.1 | 65.6 | 60.5 | 61 | 59.1 | 57.9 | 58.2 | 55.6 | 55.3 | 57.4 | 52.6 | 59.6 | 57.7 | 60.3 | 59.5 | 63.3 | 61.9 | 63.7 | 61.7 | 58.1 | 58.5 | 63.1 | 55.8 | 61.6 | 57 |

FIG. 10

Calculation of Average Sound Pressure (Lp)

| Freq | AVG $AVG = \frac{1}{N}\sum_{i=1}^{N} 10^{\left(\frac{L_i}{10}\right)}$ | Lp $L_p = 10 \times \log_{10}(AVG)$ |
|---|---|---|
| 100 | 1551 | 31.91 |
| 125 | 49635 | 46.96 |
| 160 | 478 | 26.79 |
| 200 | 3315 | 35.21 |
| 250 | 81828 | 49.13 |
| 315 | 79150 | 48.98 |
| 400 | 235879 | 53.73 |
| 500 | 157631 | 51.98 |
| 630 | 140916 | 51.49 |
| 800 | 291307 | 54.64 |
| 1000 | 87177 | 49.40 |
| 1250 | 15861 | 42.00 |
| 1600 | 1017 | 30.07 |
| 2000 | 3031 | 24.92 |
| A Wt | 1166839 | 60.67 |

Equation 34

(from IEEE C57.12.90 Clause 13.5.4)

$$L_p = 10 \times \log_{10}\left\{\frac{1}{N}\sum_{i=1}^{N} 10^{\left(\frac{L_i}{10}\right)}\right\}$$

The measurement instrument always calculates the total sound pressure, but it can also be set to calculate the sound pressure for each measured frequency and for each location.

FIG. 11

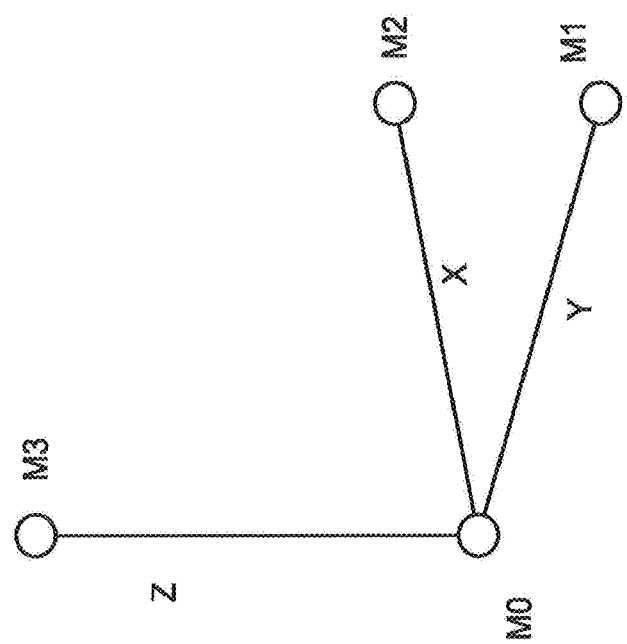

| Type of Detected Waves | With One Array | With Two Arrays | With Three Arrays |
|---|---|---|---|
| SW Only | Ambiguous shot origin direction: two possible azimuths.<br><br>No information on elevation and distance. | Shot origin localization (azimuth, localization, and distance), bullet trajectory and bullet speed if traveling between the two arrays. | Shot origin localization (azimuth, localization, and distance), bullet trajectory and bullet speed if traveling between the two arrays.<br><br>All with a better precision. |
| MB Only | Shot origin direction(azimuth and elevation).<br><br>No information on distance. | Shot origin localization (azimuth, localization, and distance), via triangulation. | Shot origin localization (azimuth, localization, and distance), via triangulation with a better precision. |
| SW and MB | Shot origin localization(azimuth, elevation and distance) via TOA between SW and MB.<br><br>(Distance estimation is reliable if the supersonic if the CPA (*) is within 30 meters of the array)<br><br>(*) Closest Point of Approach | Shot origin localization (azimuth, localization, and distance), via combination of methods of data fusion from MB and SW information (TOA and error range). | Shot origin localization (azimuth, localization, and distance), via combination of methods of data fusion from MB and SW information (TOA and error range) with a better precision. |

FIG. 38

| Table 1 - Dry Film Thickness Application |||
|---|---|---|
| Coating Layer | Thickness Range (mils) | Preferred Range (mils) |
| Primer | 0.1 – 10 | 0.5 – 6 |
| Mid coat | > 1 | > 5 |
| Top coat | 0.1 – 10 | 0.5 – 8 |

FIG. 50

SYSTEM FOR DETECTING AN OBJECT APPROACHING AND/OR IMPACTING ELECTRICAL EQUIPMENT

TECHNICAL FIELD

The present application generally relates to a multi-layered material coating and more particularly, but not exclusively, to a multi-layered material coating for protecting external walls of an apparatus from corrosion or damage from foreign object impact.

BACKGROUND

Fluid filled apparatuses such as power transformers, heat exchangers, and other equipment can be subjected to external degradation due to environmental, animal and/or human interaction. External factors such as weather related events, seismic activity, and physical impact can cause damage to the apparatus. Slowing or preventing leakage of the internal fluid after damage occurs to the apparatus is desirable. Some existing systems have various shortcomings relative to certain applications. Accordingly, there remains a need for further contributions in this area of technology.

SUMMARY

One embodiment of the present disclosure is a unique material coating system. Other embodiments include apparatuses, systems, devices, hardware, methods, and combinations for fluid filled apparatuses with a unique material coating system to slow or prevent fluid leakage due to a damaged housing. Further embodiments, forms, features, aspects, benefits, and advantages of the present application shall become apparent from the description and figures provided herewith.

BRIEF DESCRIPTION OF THE DRAWINGS

In the accompanying drawings and description that follow, like parts are indicated throughout the drawings and written description with the same reference numerals, respectively. The figures are not drawn to scale and the proportions of certain parts have been exaggerated for convenience of illustration.

FIG. 4b is a front view of the tank of FIG. 4a;

FIG. 4c is a side view of the tank of FIG. 4a;

FIG. 5b is a bottom view of the plate assembly for retrofit applications of FIG. 5a;

FIG. 5c is a side view of the plate assembly for retrofit applications of FIG. 5a;

FIG. 6 shows hardened steel plates secured by a bracket for protecting a gas relay of the inductive device;

FIG. 10 is a chart of acoustic measurements taken at various measurement points in relation to an operating inductive device coated with the coating;

FIG. 11 shows the measurements used to calculate the total core noise for the coated transformer;

FIG. 37 shows a possible arrangement of the acoustic sensors as a rectangular tetrahedron;

FIG. 38 provides parameters for shot origin detection when various locations and numbers of acoustic sensors are used;

FIG. 50 is a table showing layers of a coating system according to one embodiment of the present disclosure;

DETAILED DESCRIPTION OF THE ILLUSTRATIVE EMBODIMENTS

Figure 1:
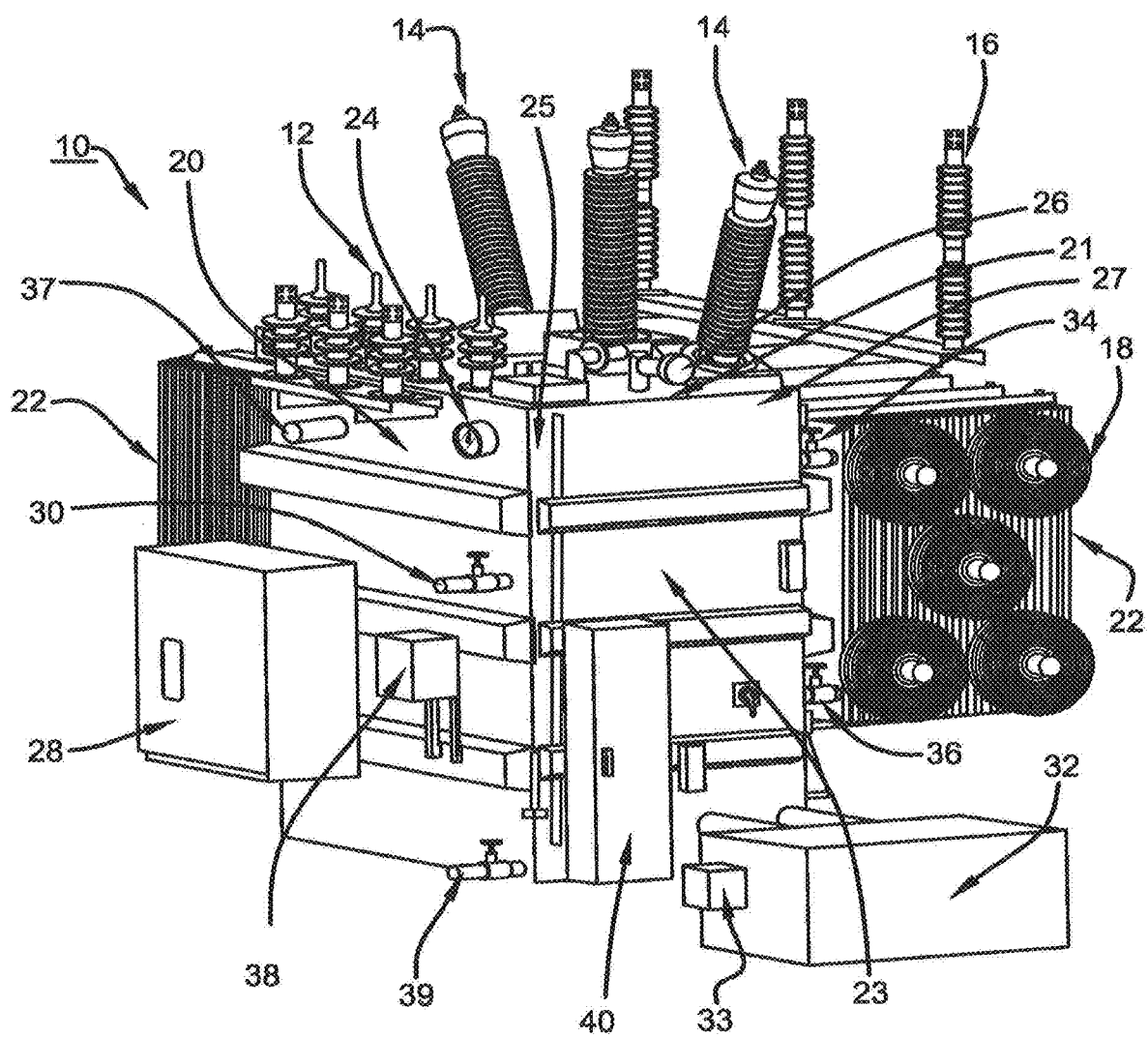
FIG. 1 is a perspective view of an inductive device embodied in accordance with the present disclosure.

For the purposes of promoting an understanding of the principles of the application, reference will now be made to the embodiments illustrated in the drawings and specific language will be used to describe the same. It will nevertheless be understood that no limitation of the scope of the application is thereby intended. Any alterations and further modifications in the described embodiments, and any further applications of the principles of the application as described herein are contemplated as would normally occur to one skilled in the art to which the application relates.

With reference to FIG. 1, an inductive device 10 such as transformer rated at 100 KVA or greater is shown. It should be understood that the inductive device 10 may be embodied as a power transformer, distribution transformer or a shunt reactor and is single-phase or poly-phase, e.g. three-phase, depending upon the application. The inductive device 10 has hardening features described herein that are applicable to newly manufactured transformers as well as may be retrofit to existing in-repair and in-service transformers.

The inductive device 10 is designed to address the areas that are prone to failure as a result of ballistic projectiles and other intrusions. Certain areas of the inductive device 10 are provided with protective material to deflect direct hits, such as by a projectile whereas other areas utilize sensors to detect damage and switch to back-up systems to protect the core and coil windings. The core and coil windings, also known as the active part of the transformer, have the longest lead time in terms of repair and/or replacement. A coating as described in more detail below, when applied to the transformer tank 20, renders the tank walls impervious to bullet penetration when combined with various grades of steel used in forming the tank. The tank 20 and coating materials and thickness are optimized in the present disclosure to protect the inductive device 10 from impact and penetration by an object or other intrusions.

The inductive device 10 has a tank 20, a core with at least one limb disposed vertically between a pair of yokes and at least one coil assembly mounted to the at least one limb. The coil assembly has a high-voltage coil and a low-voltage coil. A first end of the at least one coil assembly is connected to a high-voltage bushing 14 extending from the cover of the tank 20. The core and the at least one coil assembly are disposed in an internal volume of the tank 20 along with an insulating medium such as dielectric fluid or a gas such as sulfur hexafluoride ($SF_6$), nitrogen or air. In particular, the insulating medium may be mineral oil, natural or synthetic ester liquid. Fluids such as natural ester and synthetic liquids may provide fire and flash points that are more than twice the values of mineral oil, reducing the risk of fire in the event that the inductive device experiences impact by an object or another event occurs.

When the inductive device 10 is embodied as a shunt reactor, the shunt reactor is used to compensate reactive power and generally has a core with one or more non-magnetic gaps in the at least one limb. The non-magnetic gaps in the at least one limb of the shunt reactor core may be filled with an insulating material. There may be a non-magnetic gap in each limb of the core with the non-magnetic gaps positioned inside or outside the corresponding winding assembly mounted to the at least one limb.

A first end of the winding is connected to the bushing 12, 14 extending from the top wall 21 of the tank 20. In one embodiment the bushings 12, 14 are dry-type bushings and are not filled with dielectric fluid. In that same embodiment, the bushings are formed of hydrophobic cycloaliphatic epoxy resin, silicone insulator or another suitable material for the application. In this manner, if the bushings 12, 14 receive impact from a projectile, the bushings are not susceptible to shattering and releasing oil, as in typical porcelain bushings.

Additionally, an electrical potential monitoring device may be provided with the bushings 12, 14. Any damage to a porcelain or dry-type bushing is detected by the electrical potential monitoring device due to a detected change in the capacitance of the bushings 12, 14 and/or a change in the leakage current measured value. An alarm is provided to alert personnel to the detection of impact experienced by the bushings 12, 14.

With continued reference to FIG. 1, the tank 20 is formed of sheet metal plates that are connected at seams 25 by welding or are bolted together using fasteners. As will be described in more detail below, a coating of polyurea was applied to outer surfaces of the tank walls 23 as well as the welds and interfaces between the metal plates of the tank 20. Alternatively, the tank 20 is formed from one single piece of sheet metal by bending the metal to form corners and side walls 23 and the bends have the coating applied thereto. The tank 20 is rectangular, having a bottom wall, side walls 23, and a top wall 21. Alternatively, the tank is cylindrical, having a cylindrical side wall, a bottom wall and a cover or top wall.

The inductive device 10 has the coating applied to outer surfaces of side walls 23 to harden the exterior thereof and protect the core and at least one coil assembly from damage due to impact or penetration of the tank 20 walls 23. It should be understood that any electrical equipment in a substation such as rotating machines, switchgear, and circuit breakers may have an exterior or enclosure having outer surfaces protected by the coating in the same manner as the inductive device 10 described herein. Further, the electrical equipment housing may be retrofit with ballistic-hardened plates in the same manner as the inductive device 10 as will be described in more detail below.

It should be understood that when the electrical equipment is embodied as switchgear or a dead tank circuit breaker, the insulating medium may be sulfur hexafluoride ($SF_6$), air or another type of insulating medium suitable for the application.

The inductive device 10 is hardened to address the areas that are prone to failure as a result of the impact of an object such as a ballistic projectile and other intrusions. Certain areas of the inductive device are provided with the coating to prevent penetration of the tank in a direct impact by a projectile or other object. For instance, the tank 20 is hardened because the tank 20 houses the core and coil assemblies, also known as the active part of the inductive device. The core and coil assemblies have the longest lead time in terms of repair and/or replacement.

Also depicted in FIG. 1 are low-voltage bushings 12 and low-voltage surge arresters, high-voltage surge arresters 16, a pressure relief device 26, a control cabinet 28, housings 38, a sudden pressure relief valve 30, oil fill fitting 37, oil drain valve 39, and a regulated nitrogen gas supply 40 for maintaining a positive pressure nitrogen gas blanket in the gas space of the inductive device 10 which is inside the internal volume of the tank between the top oil level and the tank 20 cover.

A radiator cooling system 22 having an upper radiator valve 34, a lower radiator valve 36, and fans 18 cools the inductive device 10 during operation, and oil level and pressure gauges 24 work in conjunction with the back-up water cooling system 33 to cool the inductive device 10. In the case of the inductive device cooling radiators becoming punctured by an object such as a projectile, the oil level and pressure sensor 24 detects the drop in oil pressure and enacts a sequence of valve actuations designed to protect the active part of the inductive device 10 from being damaged. The oil level and pressure sensor 24 may be provided as a combined sensor or separate sensors. By way of non-limiting example, an oil level sensor that may be used with the present disclosure is the oil level indicator eOLI available from Comem of Montebello Vicento, Italy. Further by way of non-limiting example, pressure sensors that may be used with the present disclosure are the QUALITROL 032/042/045 and AKM 44712/34725 large oil level indicators available from Qualitrol of Fairport, NY.

Types of steel used in forming the inductive device tank 20 are mild steels such as CSA G40.21 grade 50 W steel, mild steel that meets the ASTM A36 standard, mild steel meeting the ASTM 504 standard, and mild steel that meets the A572 Grade 50 standard, although it should be understood that other types of steel may be used. The thickness of the mild steel used in the tank 20 is from about 0.375 inches to about 1.25 inches in thickness.

Chemical compositions of the A36 and A572 grade 50 mild steels in weight percent based on total weight are provided by way of non-limiting example in Tables 1 and 2 below:

TABLE 1

Chemical Composition - Steel ASTM A36

| Element | Min | Max |
|---|---|---|
| Carbon | — | 0.29 |
| Manganese | 0.85 | 1.35 |
| Phosphorous | — | 0.04 |
| Sulfur | — | 0.05 |
| Silicon | — | 0.4 |
| Copper | 0.2 | — |

TABLE 2

Chemical Composition - Steel ASTM A572 grade 50

| Element | Min | Max |
|---|---|---|
| Carbon | — | 0.23 |
| Manganese | — | 1.35 |
| Phosphorous | — | 0.04 |
| Sulfur | — | 0.05 |
| Silicon | — | 0.4 |
| Copper | 0.2 | — |
| Nb | 0.005 | 0.05 |

The ASTM 36 and ASTM A572 grade 50 mild steel used to construct the tank 10 has the following composition in weight percent based on total weight:

0%≤carbon≤0.29%;
0.85%≤manganese≤1.35%;
0%≤phosphorous≤0.04%;
0%≤sulfur≤0.05%;
0%≤silicon≤0.4%;
At least 0.2% copper;
and the remainder being constituted by iron. Additionally, other elements may be present in trace amounts. Mild steels meeting the ASTM A36 standard and the ASTM standard A572 Grade 50 have, in addition to the ranges listed for the elements C, Mn, P, S and Si above, at least 0.2% by weight percent of copper. Further, mild steel of ASTM standard A572 Grade 50, in addition to having the elements C, Mn, P, S, Cu and Si, includes in its composition from 0.005 to 0.05 niobium in weight percent based on total weight.

The inventors of the present disclosure conducted tests using the coating in combination with various metal substrates including mild steel previously mentioned and AR500 steel (Abrasion Resistant (AR) steel with a Brinell hardness of 500). The inventors found through testing that the coating prevented projectiles such as the ammunition provided in Tables 6 from penetrating the inductive device tank 20 walls 23. It should be understood that metal substrates include outer surfaces of inductive device tank 20 walls and any shielding 48, 56, 52, 78, 92 provided for transformer components.

An optimized coating thickness used in conjunction with an optimized tank wall thickness of ½ inch of AR500 steel was found to achieve a UL 752 level 8 and a UL 752 level 10 of ballistic protection. An example of AR500 steel that may be used in constructing the tank 20 is Tensalloy® Blue AR500 available from Clifton Steel Company of Maple Heights, OH.

The typical chemical composition of Tensalloy® Blue AR500 (having a thickness of 0.236 inch to 2.5 inches) in weight percent based on total weight is provided in Table 3 below:

TABLE 3

| | |
|---|---|
| Carbon | 0.31 |
| Manganese | 1.50 |
| Phosphorous | 0.025 |
| Sulfur | 0.015 |
| Silicon | 0.50 |
| Chromium | 0.87 |
| Nickel | 0.70 |
| Molybdenum | 0.35 |
| Boron | 0.003 |

Alternatively, a standard composition of AR500 steel that may be used in constructing the inductive device tank in weight percent based on total weight is provided in Table 4 below:

TABLE 4

| | |
|---|---|
| Carbon | 0.30 |
| Manganese | 1.70 |
| Silicon | .70 |
| Chromium | 1.00 |
| Nickel | 0.8 |
| Molybdenum | 0.50 |
| Boron | 0.004 |

In one embodiment a transformer tank 20 formed of AR500 steel having a ⅜ inch thickness and no coating was found to achieve UL 752 ballistic level 8 protection, as will be described in further detail below. Additionally, the AR500 steel is used to harden the control cabinet 28, water cooling back-up system 33, barriers, and shields. The coating reduces the amount of metal fragment "spall" as a result of the impact of a projectile. The coating may be used on all outer surfaces of the tank 20 such as side walls and cover, control cabinet 38, radiators 22, conservator 46, valves, housings, and bushings 12, 14.

Examples of the coating include but are not limited to: a pure polyurea coating, a two-component polyurea and polyurethane spray system, and an aromatic polyurea spray elastomer system having low or no volatile organic compounds. The coating provides durable skin composition for resistance of corrosive chemicals and environmental factors.

It should be understood that other types of coatings are contemplated by the inventors and that the coating types are provided by way of non-limiting example.

When the coating is embodied as a two-component polyurea spray elastomer system with zero volatile organic compounds, a first component, the "A" side, comprises an aromatic or aliphatic isocyanate (or diisocyanate) and a second component, the "B" side, comprises an amine mixture or a polyamine. The aromatic isocyanate mixture contains from about 0.1 percent to about 50 percent by weight of isocyanates based on total weight. In particular, the isocyanate mixture contains from about 0.1 percent to about 45 percent by weight diphenylmethane-4,4'-diisocyanate and from about 0.1 percent to about 5 percent by weight methylene diphenyl diisocyanate based on total weight. The amine mixture contains from about 70 percent to about 99 percent by weight amines, for example diethylmethylbenzenediamine and alpha-(2-Aminomethylethyl)-omega-(2-aminomethylethoxy)-poly(oxy(methyl-1,2-ethanediyl)). More particularly, the amine mixture contains from about 50 percent to about 75 percent by weight of alpha-(2-Aminomethylethyl)-omega-(2-aminomethylethoxy)-poly(oxy (methyl-1,2-ethanediyl)) and from about 20 percent to about 25 percent by weight of diethylmethylbenzenediamine.

A pigment may be added to the amine mixture at from about 0.1% to about 20% by weight to provide the desired color of the coating. In one embodiment, the coating has p-aramid fibers based on poly(p-phenylene terephthalamide) dispersed with the polyurea coating during the spraying process onto the substrate to provide added strength to the coating. The use of 'about' herein means plus or minus one percent.

The first and second components are preheated and applied at high pressure using dual component spray equipment in a 1:1 ratio. The preheated isocyanate and amine combine and react out of the spray gun at high pressure to form a polyurea coating on the applied substrate material. The polyurea coating that is a reaction product of the first and second components, cures within a few minutes upon application and bonds to the substrate material, in the present case, mild steel or AR500 steel.

Alternatively, the coating is embodied as a two-component polyurea spray elastomer system having a first component comprising an aromatic isocyanate mixture containing from about 30% to about 60% by weight percent of isocyanates and from about 5% to about 15% by weight percent of propylene carbonate based on total weight. The isocyanates are a reaction product of polyol with methylenediphenyl diisocyanate. A second component is an amine mixture containing from about 61 percent to about 89 percent by weight polyoxypropylenediamine based on total weight.

The first and second components are preheated and applied at high pressure using dual component spray equipment in a 1:1 ratio. The preheated isocyanate and amine components combine and react out of the spray gun at high pressure to form a polyurea coating on the applied substrate material. The polyurea coating that is a reaction product of the first and second components, cures within a few minutes upon application and bonds to the substrate material, in the present case, mild steel or AR500 steel.

An example of a coating for use in carrying out the present disclosure is XS-350 available from Line-X Protective Coatings of Huntsville, AL Other examples of coatings that may be used to carry out the teachings of the present disclosure are Dragonshield-BC available from Specialty Products, Inc. of Lakewood, Washington and RhinoArmor PPFR 1150 available from Rhino Linings of San Diego, California. It should be understood that various coatings are contemplated by the inventors and that the coating types are provided by way of non-limiting example.

The coating has an ASTM D2240 shore D durometer hardness of from about 45 to about 70. More particularly, the shore D durometer hardness is from about 50 to about 61.

The inventors of the present disclosure applied the coating to a 69 kV, 12/16/20 MVA (ONAN/ONAF/ONAF) transformer that had previously been in service. The inductive device 10 was de-energized, the dielectric fluid in the tank 20 was drained, and the radiators and all external accessories such as conduits and wiring were removed prior to the application of the coating.

The coating was applied using a spray gun to achieve a wet film thickness of from about 20 mils to about 40 mils (0.5 mm to 1 mm) for each coat to achieve at least a one-half inch thickness on each of the tank walls.

The first series of ballistic tests conducted by the inventors investigated the performances of various thicknesses of mild steel plates (1/8", 5/16", 3/8" and 1/2") with different thicknesses of coating (1/8", 1/4" and 1/2") applied and bonded to one side of the steel plate substrate. The tests were performed according to ASTM-F1233 using two types of ammunition—7.62 mm (.308 caliber) NATO M80 Ball, full metal jacket (FMJ) and 30-06, jacketed soft point (JSP) bullets. The descriptions of the ASTM tests on the plate samples are shown in Table 5.

TABLE 5

Sample Description for Test Series #1

| Plate Thicknesses | NA (blank) | Coating Thicknesses | | |
|---|---|---|---|---|
| | | 1/8 in (3.175 mm) | 1/4 in (6.35 mm) | 1/2 in (12.7 mm) |
| 1/8 inch (3.175 mm) | 1A | 1B | 1C | 1D |
| 5/16 inch (7.9 mm) | 2A | 2B | 2C | 2D |
| 1/4 inch (9.5 mm) | 3A | 3B | 3C | 3D |
| 1/2 inch (12.7 mm) | 4A | 4B | 4C | 4D |

TABLE 6

Ballistic Test Comparison, ASTM F1233 and UL Level 8

| Rating | Ammunition | Weight (grains) | Min Velocity (ft/s) | Max Velocity (ft/s) | # Shots | Range to target (ft) |
|---|---|---|---|---|---|---|
| ASTM-F1233 R3 .30 cal. 7.62 NATO M80 | 7.62 mm (.308 caliber) M80, Ball | 149 | 2700 | 2800 | 3 | 25 |
| ASTM F-1233 R2 .30 cal. 30-06 JSP | 30-06, Springfield, JSP | 180 | 2850 | 3000 | 3 | 25 |
| UL Level 8 | 7.62 mm Rifle Lead Core Full Metal Copper Jacket Military Ball (.308 Caliber) | 150 | 2750 | 3025 | 5 | 15 |

All samples with steel thicknesses of 3/8 inch and thinner failed every test regardless of the thickness of applied coating. A sample fails a particular ballistic rating if there is one or more instance of penetration of the surface impacted by the prescribed ammunition. The samples having a 1/2 inch thick coating, a 1/4 inch thick coating and less than those values each passed the ASTM-F1233 R3 test, but failed the ASTM-F1233 R2 test. The 1/2 inch thick steel sample with a 1/2 inch coating thickness passed both of the ASTM-F1233 R2 and ASTM-F1233 R3 ballistic tests.

A comparison of characteristics of the ASTM-F1233 tests and UL 752 Level 8 test is shown in Table 6. ASTM-F1233 R2 uses a heavier ammunition with a soft tip for better penetration of the target material and the ammunition travels at a higher average velocity at impact than the UL Level 8 ammunition. UL 752 Level 8 requires a closer range to target than the ASTM tests.

The ability to penetrate a material depends on several factors: the hardness and thickness of the material, the construction and weight of the bullet, and the impact velocity of the bullet on the material. The strength of impact and its ability to breach the material is dependent on the kinetic energy of the bullet, which is proportional to the product of its mass and square of velocity. For example, the average kinetic energies upon impact for the UL 752 Level 8 ballistic and the ASTM F1233 R2 ballistic are 2805 ft-lbs and 3436 ft-lbs, respectively.

The results of the ASTM F1233 tests are provided below for test series 1:

TABLE 7

Summary of Results - Test Series 1

| Steel Type (AS-Armor Ms-Mild) | Steel Thickness (inches) | Coating Thickness (inches) | Medium behind wall | ASTM F1233 Spec. | Penetration |
|---|---|---|---|---|---|
| MS | 3/8 | 0 | Air | R2 | Yes |
| MS | 3/8 | 1/8 | Air | R2 | Yes |
| MS | 3/8 | 1/4 | Air | R2 | Yes |
| MS | 3/8 | 0 | Air | R2 | Yes |
| MS | 3/8 | 1/8 | Air | R2 | Yes |
| MS | 3/8 | 1/4 | Air | R2 | Yes |
| MS | 3/8 | 1/2 | Air | R2 | Yes |
| MS | 3/8 | 0 | Air | R3 | Yes |
| MS | 3/8 | 1/8 | Air | R3 | Yes |
| MS | 3/8 | 1/4 | Air | R3 | Yes |
| MS | 3/8 | 1/2 | Air | R3 | Yes |
| MS | 1/2 | 0 | Air | R2 | Yes |
| MS | 1/2 | 1/8 | Air | R2 | Yes |
| MS | 1/2 | 1/4 | Air | R2 | Yes |
| MS | 1/2 | 1/2 | Air | R2 | No |
| MS | 1/2 | 0 | Air | R3 | No |
| MS | 1/2 | 1/8 | Air | R3 | No |
| MS | 1/2 | 1/4 | Air | R3 | No |
| MS | 1/2 | 1/2 | Air | R3 | No |

Figure 4A:
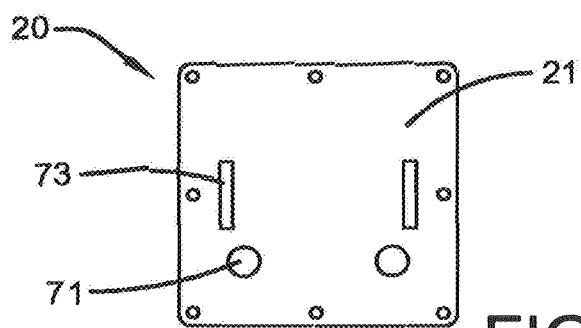
FIG. 4a is a top view of an exemplary tank used in testing the impact resistance of the inductive device after application of a coating to the tank walls and hardening.
Figure 4B:
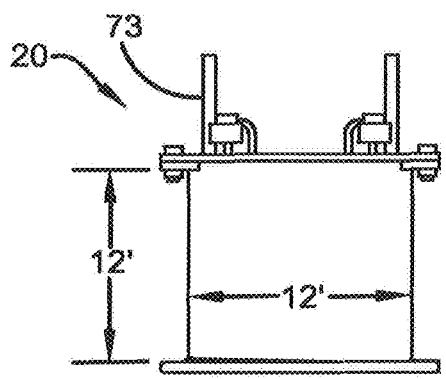
Figure 4C:
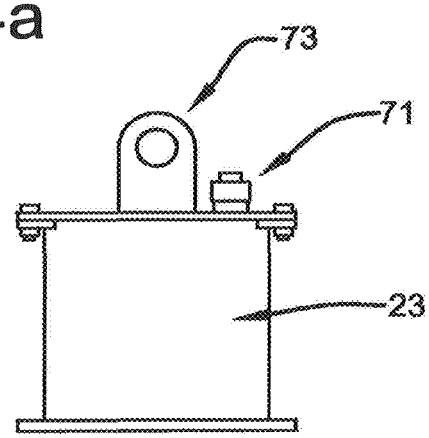

With reference now to FIGS. 4a, 4b, and 4c, test samples for test series 2 were formed in the shape of cubes to mimic the general shape of a transformer tank. The samples were constructed from mild or AR500 steels having thicknesses of 3/8 inch and 1/2 inch as indicated in Table 8. Two lifting hooks 73 were provided on the top of each cube to allow carrying by two people with a pole through the hooks. Two ports 71 were provided in the top of the cube for filling with water and for venting displaced air out of the cube. All but two of the cubes were filled with water to emulate dielectric fluid inside a transformer.

It should be noted that while water was used to fill the cubes and mimic an incompressible fluid such as dielectric fluid, that dielectric fluid has a greater viscosity than water. Therefore, the dielectric fluid would be less likely to leak than water. However, due to safety and environmental concerns water was used in the testing rather than dielectric fluid. A comparison of the viscosities of dielectric fluids with the viscosity of water is provided in the table below:

| Fluid | Kinematic Viscosity at 40° C. (mm²/s) |
|---|---|
| Mineral Oil | 9 |
| Natural Ester | 28 |
| Synthetic Ester | 36 |
| Water | 0.658 |

One side of each cube was formed of bare metal, while the other three sides were each coated with the polyurea coating to achieve different thicknesses as shown in the tables that follow. The top cover of the cube was secured with bolts onto a gasketed flange around the top of the cube. The cubes were rotated so that all coating thickness and metal thickness combinations faced the shooter for each test.

Samples for UL 752 ballistics tests were prepared as indicated in the table below:

Sample #1 - ⅜" regular steel cube filled with water

| Side | Test Sequence | Coating Thickness (mils) | Ballistics Level |
|---|---|---|---|
| D | 1 | 1000 | UL-8 |
| C | 2 | 750 | UL-8 |
| B | 3 | 500 | UL-8 |
| A | 4 | Blank | UL-8 |

Sample #2 - ⅜" Armor steel cube filled with water

| Side | Test Sequence | Coating Thickness (mils) | Ballistics Level |
|---|---|---|---|
| A | 1 | Blank | UL-8 |
| D | 2 | 750 | UL-9 |
| C | 3 | 500 | UL-9 |
| B | 4 | 250 | UL-9 |

Sample #3 - ½" Armor steel cube filled with water

| Side | Test Sequence | Coating Thickness (mils) | Ballistics Level |
|---|---|---|---|
| D | 1 | 1000 | UL-10 |
| C | 2 | 750 | UL-10 |
| B | 3 | 500 | UL-10 |
| A | 4 | Blank | UL-9 |

Figure 5A:
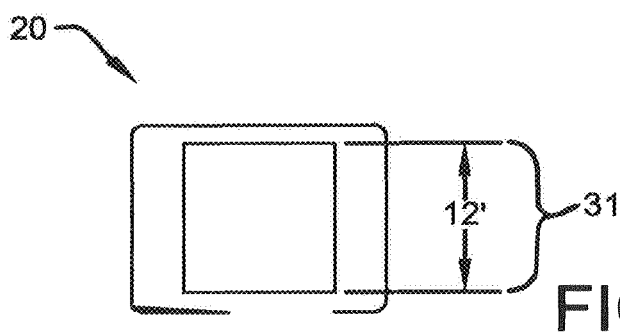
FIG. 5a is a top view of a plate assembly for retrofit applications used in ballistic testing.
Figure 5B:
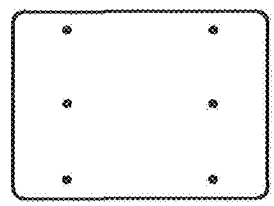
Figure 5C:
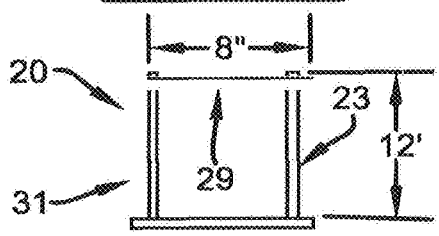

With reference now to FIGS. 5a, 5b, and 5c, test samples numbered 4 and 5 in table 8 were prepared having parallel plates for retrofit applications. In testing the retrofit applications, a ⅜ thick mild steel plate was used to emulate a transformer tank 20 and was offset by 8 inches from a ⅜ inch AR500 armor steel plate 31 using an 8 inch wide brace 29. The test sequence was performed at UL 752 level 8 and UL 752 level 9. The offset of 8 inches was used to mimic offset of the ballistic protection plates from the tank wall by stiffeners 54 that are 8 inches in width. The wall stiffeners 54 are rectangular prisms with an open face that are welded onto the tank wall at equal spacing from one another. The wall stiffeners may be disposed vertically or horizontally with respect to the plane of the bottom wall of the tank 20. The stiffeners 54 may form gap with respect to the tank 20 wall and be filled with a ballistic-resistant material 74 such as Kevlar or sand.

As previously mentioned, different standards associations have developed ratings for materials and structures that prevent penetration by certain ammunitions fired from specified distances from the target. The second series of tests performed by the inventors of the present disclosure evaluate combinations of mild steel and AR500 steel tank thicknesses coated with the coating at varying thicknesses. The combinations of tank material, tank thickness, and coating thickness were tested according to the three highest levels of the UL752 standard, UL752 levels 8, 9 and 10.

The specifications for the UL 752 standard levels 8, 9, and 10 are described as follows:

UL Level 8 is tested using a 30 caliber, M80 Ball Full Metal Jacket (FMJ) with 166 grains travelling at a velocity of 2,750-3,025 feet per second. Five shots are fired into the sample placed 15 feet from the muzzle of the gun.

UL Level 9 is tested using a 30 caliber, Armor Piecing (AP), M2 bullet with 166 grains travelling at velocity of 2715-2986 feet per second. One shot is fired into the sample placed 15 feet from the muzzle of the gun.

UL Level 10 is tested using a 50 caliber, ball with 708 grains travelling at velocity of 2810-3091 feet per second. One shot is fired into the sample placed 15 feet from the muzzle of the gun.

All samples were tested using the required number of shots fired along a horizontal plane orthogonal to the transformer tank 20 walls located in a vertical plane.

The optimal coating and tank wall thickness combination for UL Level 10 was found to be ½ inch thick coating applied to tank walls formed of AR500 steel having a ½ inch thickness as shown in Table 8 when the XS-350 two-component polyurea spray was used as the coating. When the coating of at least % inches was applied to the AR500 steel tank having at least a ½ inch thickness, shrapnel from the ballistic impact was mostly trapped inside the coating and did not penetrate the AR500 steel tank 20. The coating appeared to have absorbed a significant amount of the shrapnel thus reducing the amount of spall from the tank surface. In addition, the AR500 steel wall protected the bullet from penetrating the tank walls and reaching the inside of the tank.

The results of ballistics testing carried out by the inventors in accordance with the UL 752 standard are presented in table 8.

TABLE 8

Ballistic testing in accordance with the UL 752 Standard

| Sample ID | Steel Type (AS-Armor MS-Mild | Steel Thickness (inches) | Coating Thickness (inches) | Medium behind wall | UL Rating Tested | Penetration |
|---|---|---|---|---|---|---|
| 5 | AS | ⅜ | 0 | Air | 8 | No |
| 1A | MS | ⅜ | 0 | Water | 8 | Yes |
| 1B | MS | ⅜ | ½ | Water | 8 | Yes |

TABLE 8-continued

Ballistic testing in accordance with the UL 752 Standard

| Sample ID | Steel Type (AS-Armor MS-Mild) | Steel Thickness (inches) | Coating Thickness (inches) | Medium behind wall | UL Rating Tested | Penetration |
|---|---|---|---|---|---|---|
| 1C | MS | 3/8 | 3/4 | Water | 8 | Yes |
| 1D | MS | 3/8 | 1 | Water | 8 | Yes |
| 1E | MS | 1/2 | 1/2 | Water | 8 | Yes |
| 2A | AS | 3/8 | 0 | Water | 8 | No |
| 2B | AS | 3/8 | 1/4 | Water | 9 | Yes |
| 2C | AS | 3/8 | 1/2 | Water | 9 | Yes |
| 2D | AS | 3/8 | 3/4 | Water | 9 | Yes |
| 3A | AS | 1/2 | 0 | Water | 9 | No |
| 4 | AS | 3/8 | 3/4 | Air | 9 | No |
| 3B | AS | 1/2 | 1/2 | Water | 10 | No |
| 3C | AS | 1/2 | 3/4 | Water | 10 | No |
| 3D | AS | 1/2 | 1 | Water | 10 | No |

In summary, Table 8 provides the following results. AR500 steel having a 3/8 inch thickness meets UL level 8 ballistic requirements without any coating and resulted in a little damage at the impact site on the tank 20. AR500 steel having 1/2 inch thickness with no coating meets UL level 9 ballistic requirements, but experienced significant damage to the impact site. AR500 steel having 1/2 inch thickness and % inch applied polyurea coating meets UL level 10 ballistic requirements.

Further, in the samples formed of mild steel having a 3/8 inch thickness and the coating applied to an at least a 1/2 inch thickness, the tank walls were penetrated by the UL 752 level 8 ammunition and experienced at least 1/2 inch diameter holes in the tank. However, there was only a mere trickle of water through the coating. Therefore, a tank 20 with the coating applied is less likely to leak dielectric fluid through any tiny holes.

For example, an opening having a diameter of from about 0.5 mm to about 12.7 mm in the tank wall is prevented from leaking dielectric fluid from the tank. The defects in welds at joints connecting side walls 23 of the inductive device may be the size of a pinhole and closer to from about 0.5 mm to about 1 mm in diameter whereas the size of a bullet hole is from about 5 mm to about 12.7 mm. In the case of the pinholes, the pinholes are filled or covered by the polyurea coating layer and leaking of dielectric fluid is prevented. In the case of bullet holes, the dielectric fluid leaks at mere drops at a time, preventing some impact to the environment by the leaking of dielectric fluid.

Further, the polyurea coating may provide a controlled rupture in the event of an internal arc wherein pressure from the arc would be absorbed by the coating along the tank walls vertically and expose the weakest joints at the tank cover 21 interface 27 where there is no coating applied. The controlled rupture properties can be tested by simulating high energy arcs in tanks having coating and without coating applied to the walls. A controlled rupture at the tank cover 21 interface 27 is more desirable than a rupture at the side wall 23 welds 25, because this controls oil leakage and supply of fuel to a fire in case of ignition.

A short circuit in a tank can be simulated by connecting a thin wire between two electrodes about one inch apart and fixed inside the tank. A high energy arc can be simulated by passing high current through the two electrodes and the wire. The high current through the shorted circuit will produce an arc with accompanying high pressure in the tank. If the arc energy is high enough the pressure can rupture the tank. In the case of tank rupture, the rupture would be a controlled rupture at the tank cover 21 interface 27 due to the polyurea coating absorbing the pressure along the tank walls vertically.

In summary, and as shown in tables 9, 10, and 11 below, the inventors discovered through ballistic testing of mild and AR500 steel plates and tanks 20 that an optimized coating thickness of at least 1/2 inch applied to an optimized tank thickness of % inch thick AR500 steel achieved up to UL 752 level 10 protection and limit spalling of metal fragments. However, some protective benefit was determined using at least a 0.25 inch (6.35 mm) coating thickness and up to about a one inch (25.4 mm) coating thickness in combination with all of the various metals and thicknesses mentioned herein. As most inductive device tanks today are formed of mild steel, only newly manufactured inductive devices can be formed of AR500 steel tanks. Existing inductive devices can be retrofit with AR500 steel plates having a polyurea coating of at least % inch in thickness.

Further, in an inductive device having a mild steel tank that is retrofit for withstanding a ballistic impact, the inductive device has studs welded to the tank 20 side walls to which AR500 steel plates having up to a 0.5 inch thickness are further bolted or welded to provide a wall of protection. Alternatively, the AR500 steel plates having up to a thickness of 0.5 inch are welded or bolted to stiffeners 54 attached longitudinally to the side walls of the tank. The coating is further applied to the AR500 steel plates until a thickness of at least 0.5 inch is achieved. In order to provide UL level 8 ballistic protection, the AR500 steel plates are provided in a 3/8 inch thickness and at least 0.5 inch thick polyurea coating is applied thereto to limit spalling of metal fragments.

A summary of the solution for hardening new and retrofit inductive devices is provided below.

TABLE 9

New Inductive device Application

| UL Ballistic Level | Construction |
|---|---|
| 8 | 3/8" Armor Steel Tank + application of 1/2" Coating |
| 9-10 | 1/2" Armor Steel Tank + application of 1/2" |

TABLE 10

Retrofit Applications for 3/8" Mild Steel Tank Walls

| UL Ballistic Level | Construction |
|---|---|
| 8 | 3/8" Armor Steel Panels attached to Tank |
| 9 | 3/8" Armor Steel Panels, with applied 1/2" Coating and attached to Tank Walls |
| 10 | 1/2" Armor Steel, with applied 1/2" Coating and attached to Tank Walls |

TABLE 11

Retrofit Applications for 1/2" Mild Steel Tank Walls

| UL Ballistic Level | Construction |
|---|---|
| 8 | Field Application of 1/2" Coating to Tank Walls OR 3/8" Armor Steel Panels attached to |
| 9 | 3/8" Armor Steel Panels, with applied 1/2" Coating and attached to Tank Walls |

TABLE 11-continued

Retrofit Applications for ½" Mild Steel Tank Walls

| UL Ballistic Level | Construction |
|---|---|
| 10 | ½" Armor Steel, with applied ½" Coating and attached to Tank Walls |

In one embodiment, a first layer of the coating is bonded to the tank walls and a steel plate is provided as a second layer. A third layer is provided of the coating. The tank 20, first layer of coating, second layer of steel plate, and third layer of coating are bonded together. The first and third layers of coating are provided at thicknesses of from about 0.25 inches (6.35 mm) to about 0.75 inches (19.05 mm). The steel plate formed of AR500 or mild steel of the types mentioned herein is from about 0.25 inches (6.35 mm) to about 0.75 inches (19.05 mm).

Figure 2:
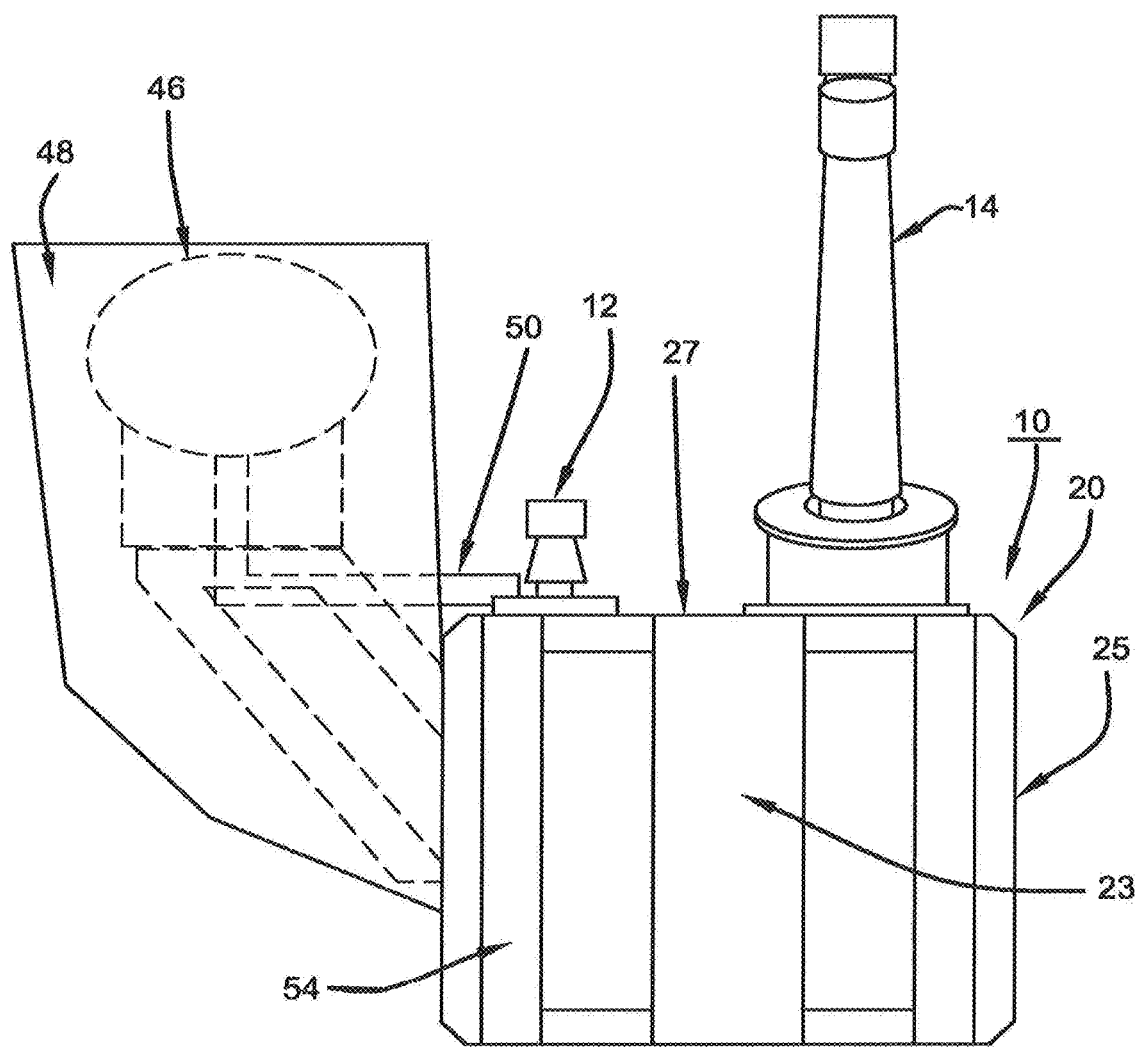
FIG. 2 is a side view of the inductive device having a shield around the conservator.

Referring now to FIG. 2, an oil conservator 46 is shown having a ballistic-resistant shield 48 attached thereto. The conservator shield 48 is formed of AR500 steel or mild steel of the types mentioned above in new and retrofit installations. When AR500 steel is utilized to form a conservator shield, the thickness of the steel is at least ⅜ inches thick if AR500 is used alone to satisfy UL 752 ballistic level 8. Otherwise, 0.5 inch (12.7 mm) thick AR500 steel is used in conjunction with a coating thickness of 0.5 inches (12.7 mm) to satisfy UL 752 ballistic levels 9 and 10. The ASTM F1233 standard can be met with 0.5 inch (12.7 mm) thick mild steel and 0.5 inch (12.7 mm) thick coating.

The ballistic-resistant shield 48 is removable or fixed to the conservator 46 supports and/or tank 20. The ballistic-resistant shield 46 also serves as camouflage for the conservator 46 as a potential target is not visible and may be formed in a shape to deflect projectiles. In one embodiment, the conservator 48 oil level gauge is protected and hidden from view by a steel plate and can be read from ground level only or at a power network control center remote from or nearby the substation where the inductive device 10 is installed. In another embodiment, the conservator 48 is formed of mild steel having a thickness of ½ inch and coated with the coating having a ½ inch thickness to meet ASTM F1233 R2 or R3 ballistic levels.

It should be understood that the tank 20 and conservator 46 may be formed of AR500 steel or heavy gauge steel in a new application, and the valves, gauges and cooling systems may be placed in central locations/banks to be protected by various shielding formed of heavy gauge or submarine steel. All surfaces may then be coated with the coating and shields and barriers may be utilized instead of or in addition to tank 20 and conservator 46 reinforced steel enclosures. Further, it should be understood that any combination made from the materials and arrangements described herein may be utilized to harden the inductive device tank, provide a layered heterogeneous approach to shielding inductive devices 10 from projectiles, and that specific arrangements are provided by way of non-limiting example.

Figure 3:
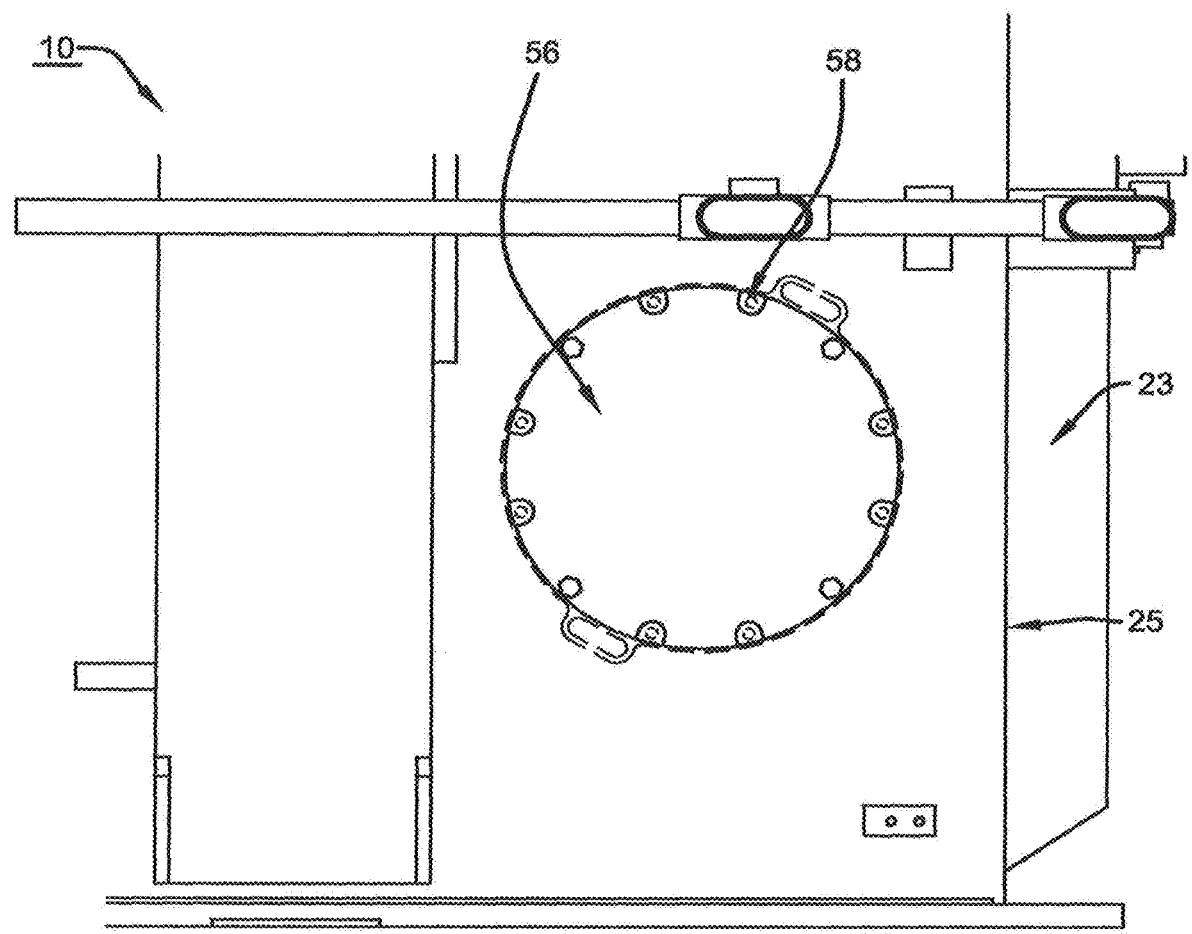
FIG. 3 is a side view of the inductive device showing a reinforced manhole cover.

With reference now to FIG. 3, a manhole cover 58 is shown having a ⅜" AR500 steel manhole shield 56 in the same shape as the manhole cover bolted on top of the manhole cover 58 to the tank 20. The manhole shield 56 bolsters the manhole cover 58 in the case of contact with a projectile or other outside intrusion. The manhole shield 56 has less fastener openings than the manhole cover 58 and is cut in a shape to accommodate the existing fasteners that secure the manhole cover 58.

Referring now to FIG. 6, a frame 52 enclosing a gas relay 50, such as a Buchholz relay, is shown. The frame 52 is hardened and encloses the gas relay 50 in both new and retrofit inductive device 10 installations and is secured to the gas relay by clamps 82 and a mounting bracket 84. The clamps 82 have arcuate sides 86 to compensate for the flexing of the pipe 51. In one embodiment, the mild steel or AR500 steel frame 52 is coated with the coating in the same thickness as previously described for the conservator shield 48. Further, it should be understood that the mild steel and AR500 in the various combinations tested may be applied and secured to any portion of the tank 20 requiring protection from ballistic impact.

In one embodiment, the steel frame 52 is provided as a valve shield that is removeably engaged with an output thread of the respective valve 30, 39 or bolted on using the same bolt as the valve itself. The frame 52 has ballistic-hardened plates secured to each side of the frame 52. At least one side of the frame 52 has threads to engage with the threaded portion of the respective valve 30, 39. In addition to protecting the respective valve from projectiles, the frame 52 may also hide the valve from view. In one embodiment, the inductive device 10 is designed with all the valves brought to a single location on the tank 20 with a common frame 52 surrounding the valves that is welded or bolted to the tank 20.

Figure 7A:
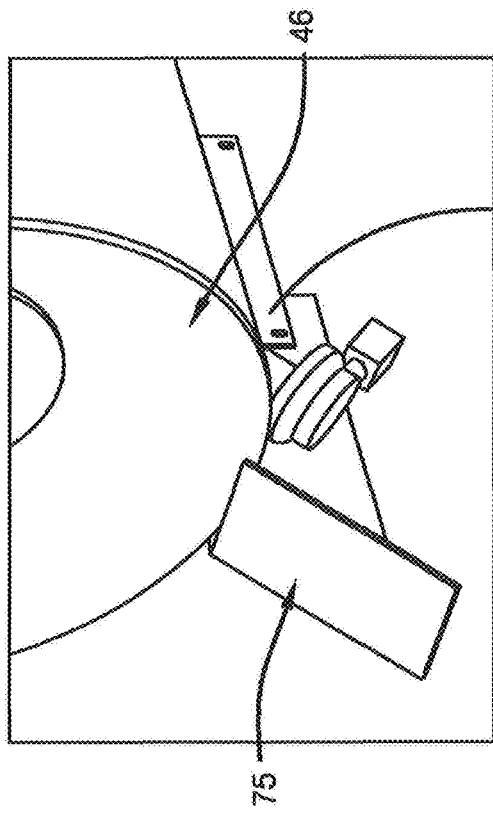
FIG. 7a shows the oil and pressure level sensor having a ballistic shield installed to protect the oil and pressure level sensor from ballistic impact.

With reference now to FIG. 7a, a removable shield 78 may be placed over the oil and pressure level gauge 24 as well as any other gauge, thermometer, or analyzer provided with the inductive device 10. The removable shield is formed of the same material and has the coating applied as previously mentioned for the conservator shield 48.

All of the instruments, gauges, radiator 22 banks and various valves, may be placed in a single location on the inductive device 10 for protection by a removable shield 78 in a central location. The instruments, thermometers and gauges are embodied as devices that provide remote-reading capability (meaning remote from the inductive device or substation location), such as at the network control center, service personnel mobile devices, and/or the control cabinet 28. The oil level 24 indicator is also positioned at an angle near ground level so that the gauge 24 may be read from the ground level as opposed to typical positioning on a side wall of the tank 20 near the cover and not at an angle. A reading panel 80 may also be provided so that the reading of the gauge 24 is visible on the panel 80.

Figure 7C:
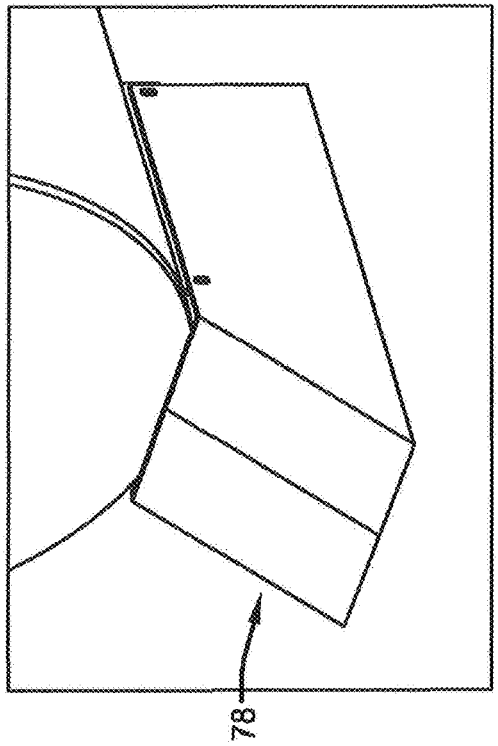
FIG. 7c shows a partially assembled ballistic shield.
Figure 7B:
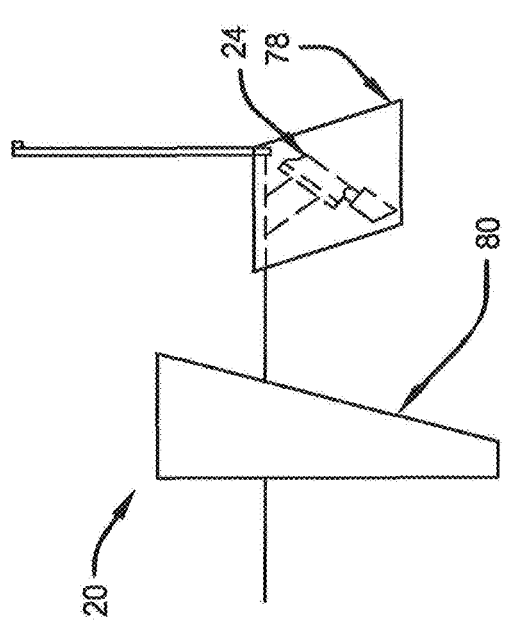
FIG. 7b shows mounting brackets for the ballistic shield.
Figure 7D:
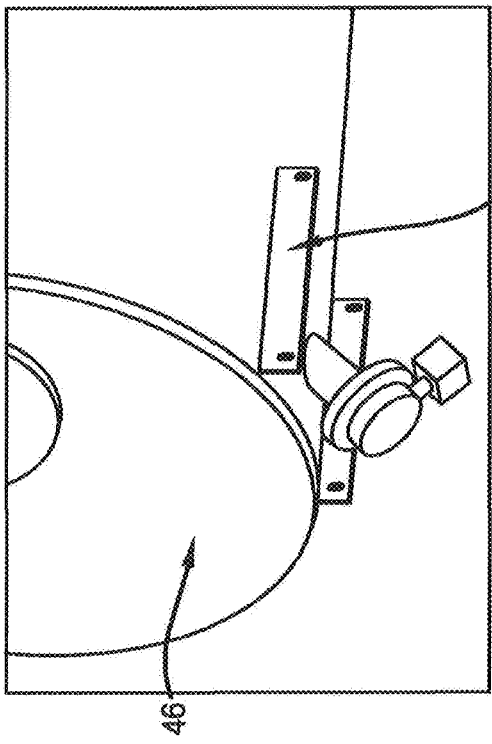
FIG. 7d shows the ballistic shield assembled around the oil and pressure level sensor.

FIGS. 7b, 7c, and 7d show the assembly of the components of the shield 78. FIG. 7b shows the mounting brackets 77 welded to the bottom of the conservator 46 on opposing sides of the oil level gauge 24. FIG. 7c depicts one of the two metal panels 75 that are secured by fasteners to the brackets 77. The metal panels 75 are formed of AR500 steel welded at 45 degree angle. The final assembly of the shield 78 is shown in FIG. 7d, showing that the oil level gauge 24 is protected from view as well as ballistic impact.

Figure 12B:
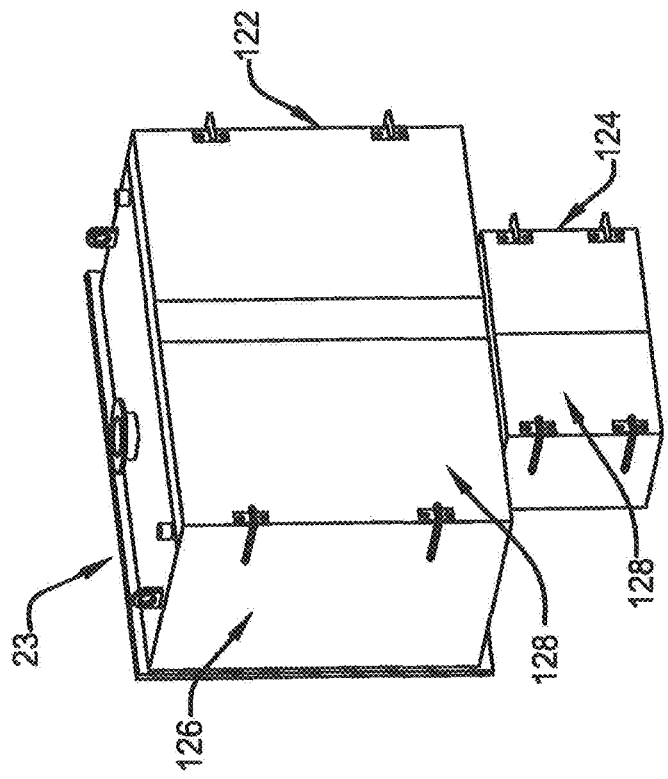
FIG. 12b shows a ballistic barrier surrounding a tap changer.
Figure 12A:
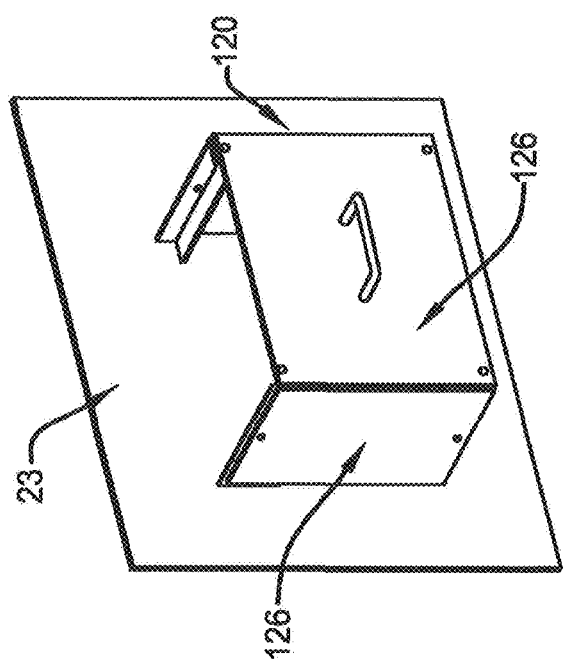
FIG. 12a shows a ballistic barrier surrounding a valve of the inductive device.

Other hardening features such as localized barriers 120, 122, 124 as shown in FIGS. 12a and 12b may be constructed around accessories such as valves and tap change motor drives, respectively, or any other projections from the surface of the inductive device tank walls. The barriers 120, 122, 124 are formed of hardened steel plates 126 which surround the accessory. Depending on the level of protection required, the steel plates are hardened in accordance with materials and thicknesses listed in Tables 9, 10, or 11 depending on the inductive device application. Examples of other accessories that may be protected in this manner include but are not limited to: the conservator, Buchholz relay, fill valve, CT terminal blocks, dehydrating breather, load tap changer, control cabinet with gauges, nitrogen bottle cabinet, drain valve, raw vibration sensors, RMS sensors and manhole covers.

The localized barriers 120, 122, 124 are disassembled by unbolting the protective plates, or unbolting one side and opening a barrier door 128 if present to provide the user access to the accessory for maintenance and instrument reading. When designing the hardened plates to be removed by the user, the manual handling weight of each removable plate is under 23 kilograms.

Exterior accessories can be protected using a common barrier design having hardened plates applied to frames that can be welded directly to the tank wall, cover, or any suitable surface. The hardened plates are bolted to the frame to provide protection. For access to smaller devices, the front barrier can be removed. For small and large accessories, the front barrier can be designed with hinges to create a door as shown in FIG. 12*b*.

The shape of the barrier will be determined by the location of the accessory. For example, FIGS. 10*a* and 10*b* depict barriers that are mounted on the tank wall 23 and have three sides exposed, however, an accessory mounted on the top wall of the inductive device 10 would require protection from all four sides.

Figure 44:
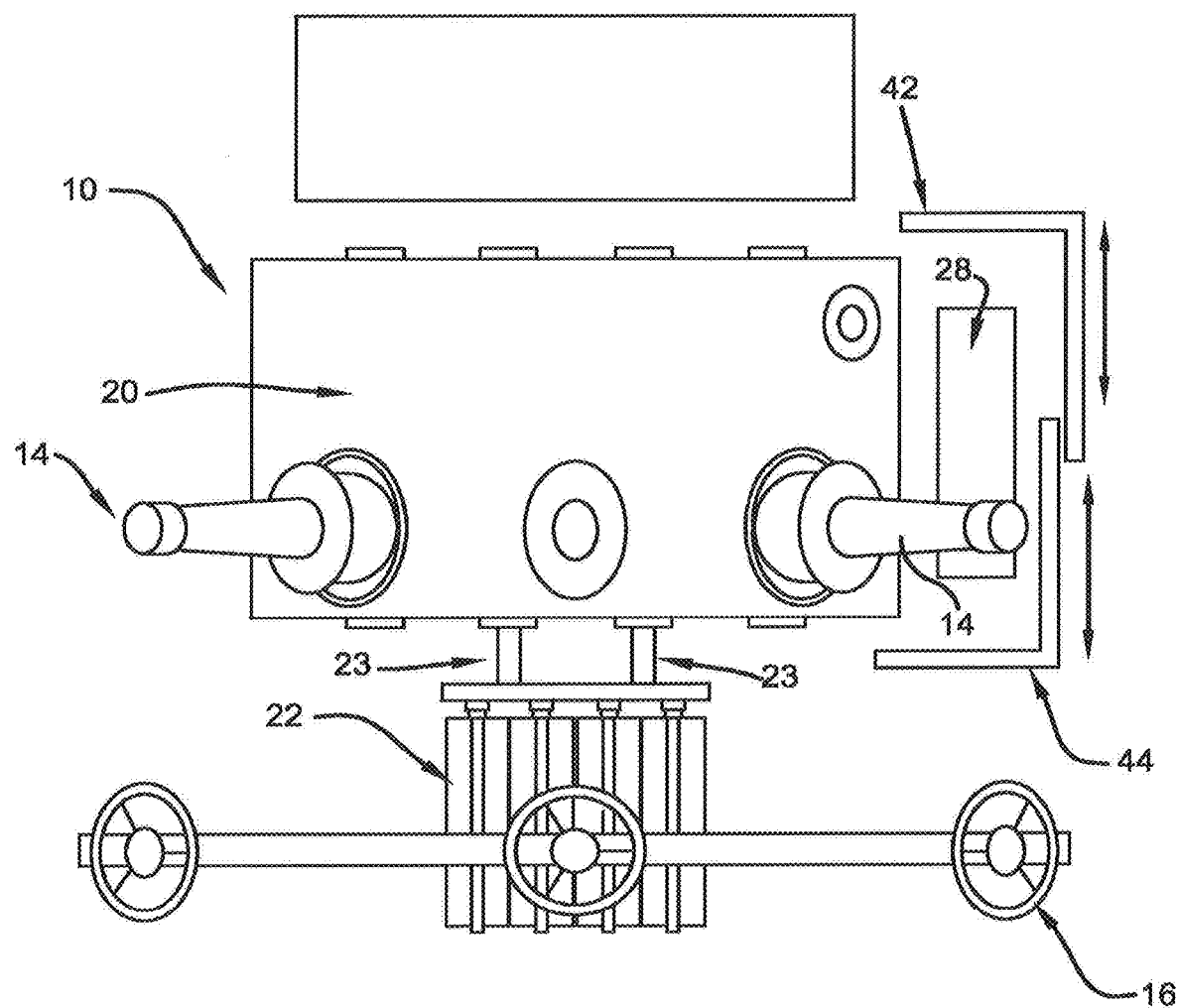
FIG. 44 is a top view of the inductive device having removable ballistic panels.

With reference now to FIG. 44, an inductive device 10 having removable and sliding ballistic-resistant panels 42, 44 for protecting the control cabinet 28 is shown. It should be understood that a tap changer may be provided within the control cabinet 28 or in a separate cabinet and utilizes the removable and sliding ballistic-resistant panels 42, 44 for protection. Typical control cabinets 28 are provided with glass windows for viewing the electronic equipment inside the control cabinets 28. Therefore, the removable and sliding ballistic-resistant panels 42, 44 provide protection to otherwise exposed parts of the control cabinet 28.

The inductive device tank 20 in FIG. 44 is formed of armor or mild steel and the coating in the thicknesses mentioned above, if provided as a new transformer. New inductive devices 10 having mild or armor steel tanks 20 may be provided with meters and indicators installed outside the tank 20 for simplified reading access, however, the electronics of the control cabinet 28 are protected by the AR500 steel and/or coating applied to the outer surface of the control cabinet 28.

For new and retrofit inductive devices, the tank 20 is formed of a armor or mild steel and has the coating applied to the outer surfaces of the tank 20. Alternatively, the tank 20 is formed of mild steel and enveloped with a blanket or coating of a triaxial aromatic aramide formed of fibers such as polyester, polyamide, or aromatic aramide, as is sold under the trademark KEVLAR®, a registered trademark of E. I. Du Pont De Nemours and Company. In particular, the triaxial aromatic aramide fabric is formed of p-aramid fibers based on poly(p-phenylene terephthalamide). In one embodiment, the conservator 48 may also be wrapped a fabric or provided with an outer coating of a triaxial aromatic aramide.

New and retrofit inductive devices 10, are provided with fixed, removable, and/or sliding door ballistic panels 42, 44 that are formed of AR 500 steel. In one embodiment, the fixed, removable, and/or sliding door ballistic panels 42, 44 are provided with a steel plate having a special shape or composition that is engineered to deflect or ricochet the ballistic projectiles from the contact surface.

Figure 45:
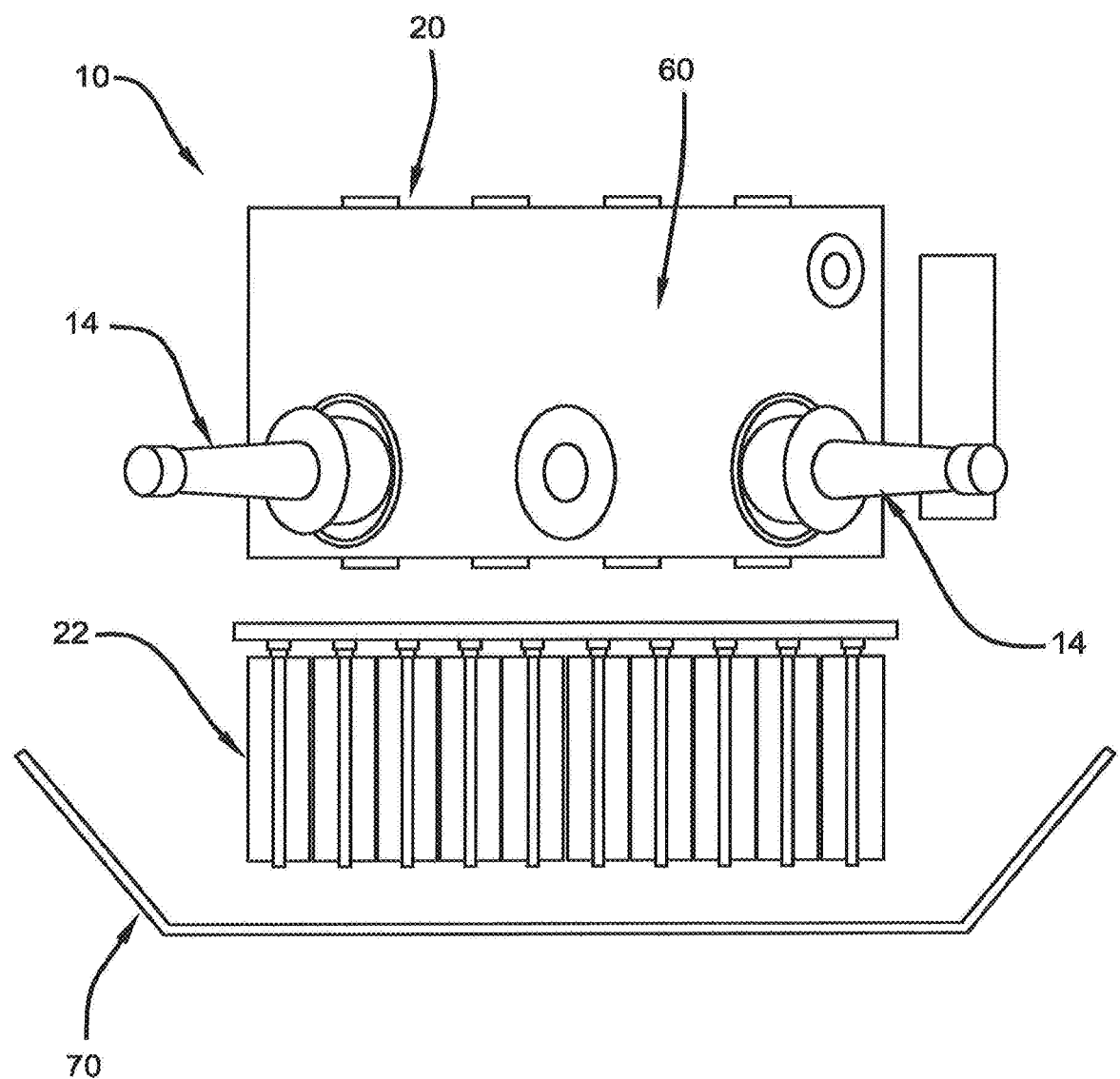
FIG. 45 is a top view of the inductive device having a ballistic barrier.

With reference now to FIG. 45, a radiator shield 70 is provided. The radiator shield 70 is removable and spaced apart from the front of the bank of radiators 22 for a dual purpose of protecting the radiators from projectiles as well as preventing the cooling air from escaping by forcing air circulation. The shield may be formed of a single sheet of metal such as armor steel or plates of armor steel that are welded together to form a multi-wall structure.

In one embodiment, the metal sheet or plates of the radiator shield 70 are formed of corrugated 14-gauge or 16-gauge steel. In that same embodiment, the radiator shield 70 protects the inductive device 10 from low angle high velocity fragments, shrapnel, and improvised explosive devices while offering protection as an anti-ram vehicle barrier. The radiator shield 70 may be designed as a bin to be filled with sand to further bolster the radiator shield 70 against incoming intrusions.

In one embodiment, a blanket of or triaxial aromatic aramide fabric is placed over the radiator shield 70 as a curtain to provide an extra layer of protection. Locating the radiators 22 and the back-up water cooling system in the same bank and protecting the entire bank by a radiator shield 70, centralizes the bank and allows for a single radiator shield 70 for ballistic protection.

Figure 46:
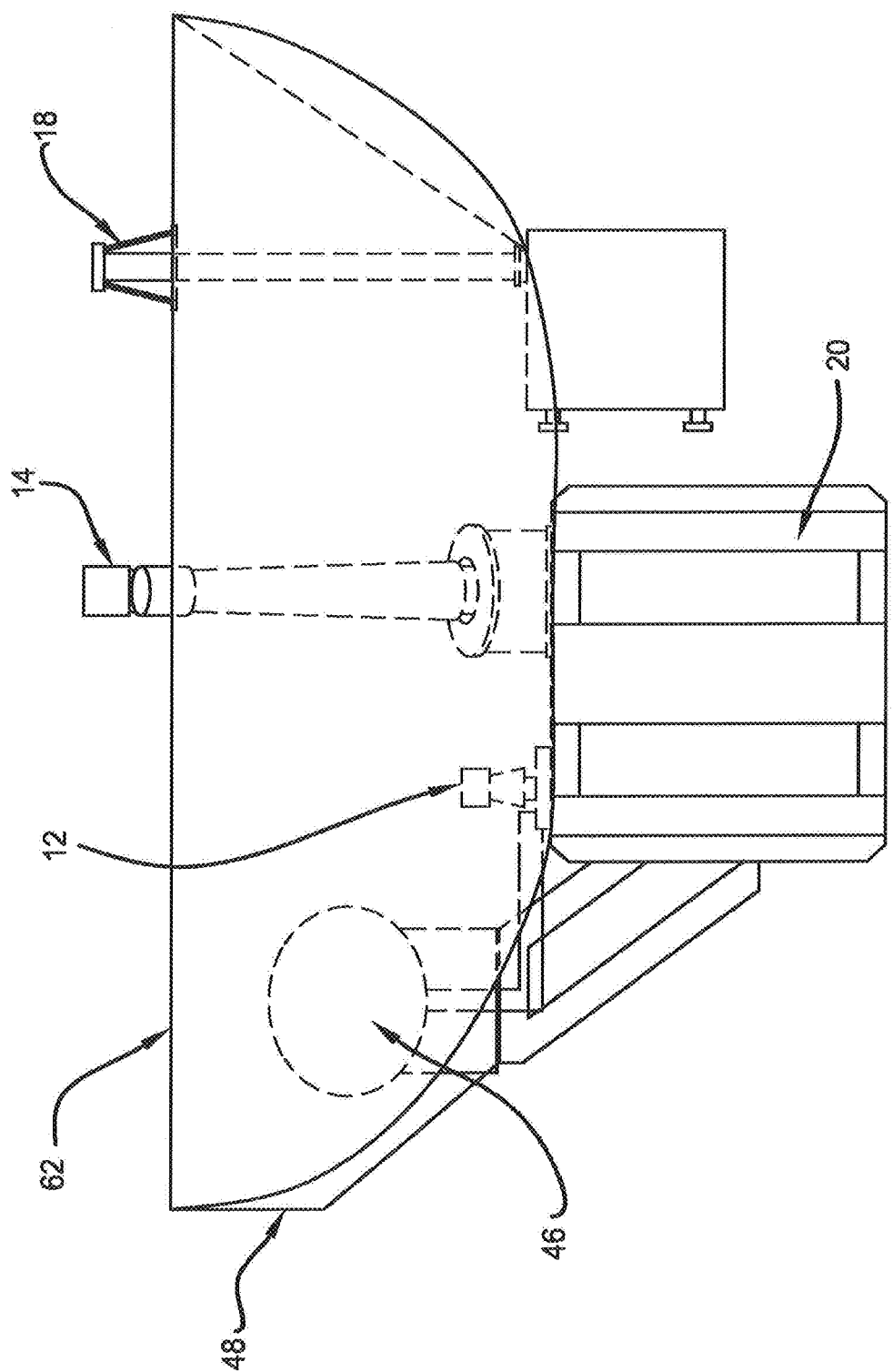
FIG. 46 is a side view of the inductive device having a ballistic-resistant blanket protecting the conservator, bushings and surge arresters.

With reference now to FIG. 46, the inductive device 10 is covered by a blanket 62 formed of a triaxial aromatic aramide fabric formed of fibers such as polyester, polyamide, or aromatic aramide. The blanket 62 is located on the low-voltage side of the inductive device 10 so as to protect the bushings 12, 14 and the conservator 46. In one embodiment, supports 48 may be provided on each end of the transformer tank with a rod connecting between the two supports so that the blanket 62 can be placed over the rod like a tarp. Alternatively, the ballistic-resistant blanket 62, is wrapped around the tank 20 and/or conservator 46 and secured using tie-wrapping or fasteners. The ballistic-resistant blanket 62 protects the transformer and also serves to hide potential targets on the inductive device 10.

The blanket 62 along with the coating applied to outer surfaces of the bushings 12, 14 and conservator 46, provides a double layer of protection in case the projectile punctures the blanket 62 and contacts the surface of the bushings 12, 14 and/or conservator 46. Additionally, the ballistic-resistant blanket 62 protects other devices provided on the cover of the inductive device 10.

A rapid pressure rise relay is also provided and detects sudden changes to the pressure experienced by the tank 20. The rapid pressure rise relay works in conjunction with a pressure relief device to release the pressure until an acceptable level is achieved. The pressure relief device automatically reseals upon the rapid pressure rise relay detecting an acceptable operating pressure level. The pressure relief device is integrated with the oil drain pipe 39 to direct oil to the ground.

Figure 47:
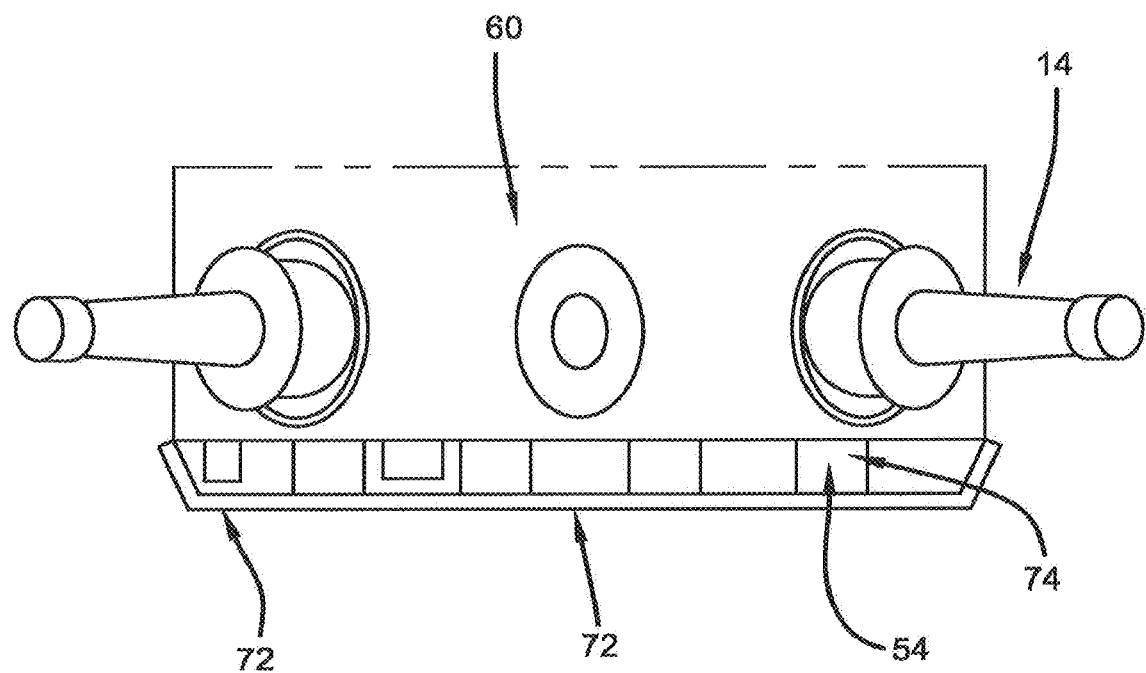
FIG. 47 is a top view of the inductive device having stiffeners to which ballistic-hardened plates are connected.

With reference now to FIG. 47, the inductive device 10 is shown having wall shields 72 to brace weaker portions of the wall and/or stiffeners 54. A ballistic resistant material such as sand may be placed inside the stiffeners 54 in order to protect the tank 20 and active part. The wall shields 72 are used to protect the side walls and any accessories, gauges and valves mounted thereon. Sand bags may also be attached to the tank 20 or cover so that the bags cover the surface of the tank 20 corresponding to the active part or other components of the inductive device 10, that when compromised may cause damage to the active part.

Figure 48:
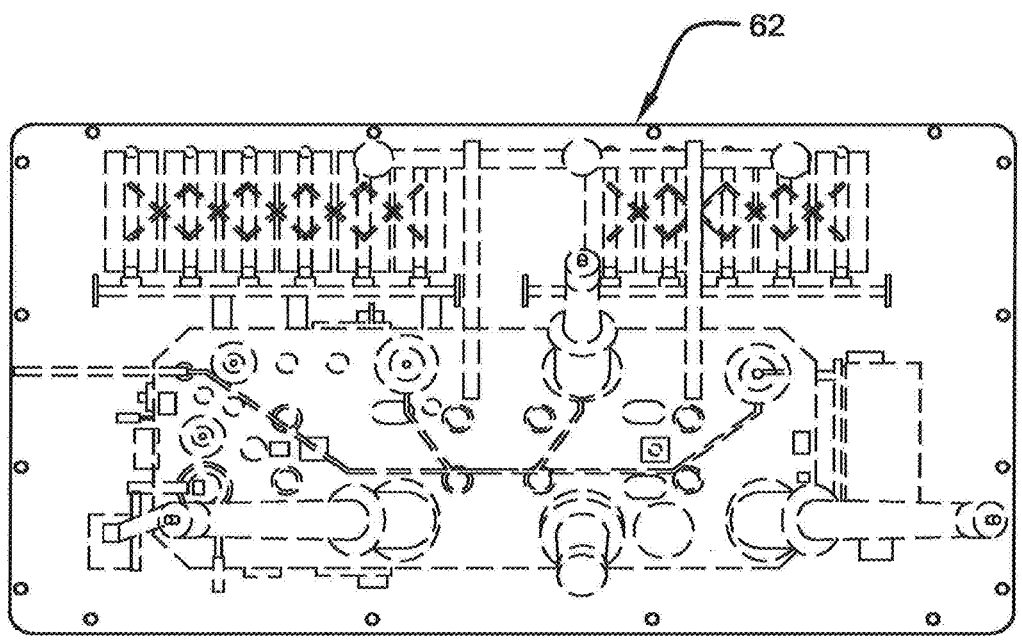
FIG. 48 is a top view of the inductive device having a ballistic resistant blanket covering the conservator, bushings, surge arresters and instrumentation of the inductive device.
Figure 49:
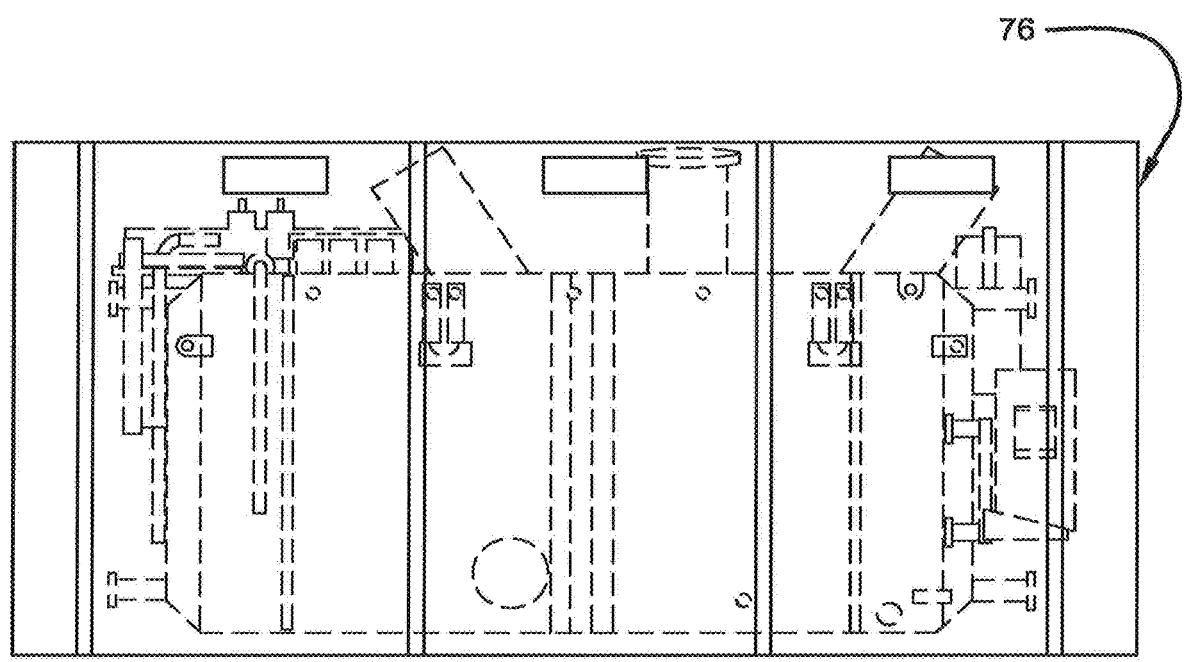
FIG. 49 is a side view of the inductive device having a ballistic barrier surrounding the inductive device.

In one embodiment, the entire transformer 10 and all peripherals are completely surrounded by a concrete wall 76 or ballistic-resistant blanket 62 as depicted in FIGS. 48 and 49.

Figure 8B:
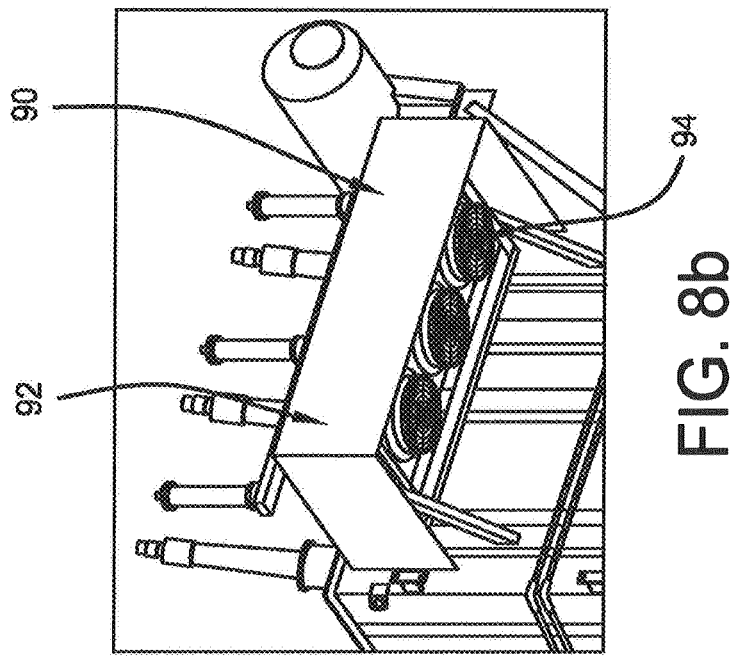
FIG. 8b depicts the OFAF cooler vertically directed fans.
Figure 8A:
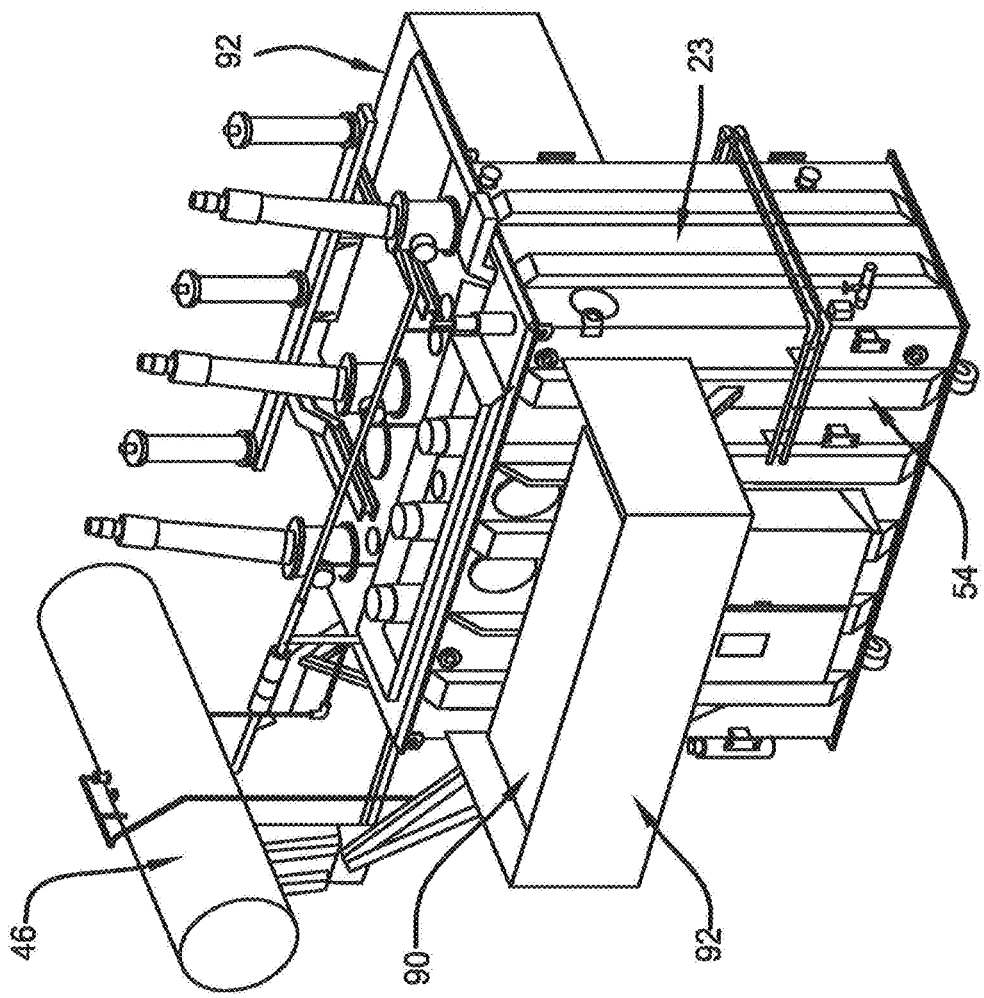
FIG. 8a depicts OFAF (forced oil/forced air heat exchanger) coolers mounted to the tank of the inductive device and having ballistic plates.

With reference now to FIGS. 8a and 8b, resilient cooling protection for the inductive device in the form of OFAF (forced oil/forced air heat exchanger coolers) tank mounted coolers 92 is shown. Ballistic plates 92 are secured around the vertical sides of OFAF coolers except over the fans 94, so that all vertical edges and surfaces are protected by the ballistic plates. The OFAF coolers are designed to direct air vertically using the fans 94. The placement of the ballistic plates 92 does not obstruct the air flow of the fans 94 of the OFAF coolers 92 as shown in FIG. 8b.

The plates 92 for protecting the coolers 90 are attached to frames further mounted to the tank via studs or welds. The sides of the coolers 90 with the air inlet or outlet must not be covered or cooling inefficiency results. In addition to protecting the coolers 90 from the impact of a projectile, the ballistic plates are used to protect the edge of the coolers 90 that is in the bullet line of sight as well as camouflage the coolers 90.

The plates 92 are formed of the metal and/or coating as previously described for the conservator shield 48 and other inductive device components protected by ballistic plates 92. The advantage of using OFAF heat exchangers is that the size and weight is only 25% of equivalent radiator/fan cooling.

Ballistic-hardened plates 92 may be retrofit to the side of the radiator 22 or ONAF cooler 90 edges to prevent bullet penetration of ONAF cooling equipment (radiators with fans). In one embodiment, the cooling system has a radiator 22 or ONAF cooler 90 proximate to each of two opposing side walls 23 of the inductive device tank as shown in FIG. 8a and only the opposing side walls of the radiators 22 or ONAF coolers 90 are fitted with plates 92 so that the fans 94 are not obstructed.

Each radiator 22 or ONAF cooler 90 has a top wall, a bottom wall and side walls and at least one fan 94. A plate 92 is attached to each of opposing side walls of the cooling system and the coating is bonded to outer substrate surfaces of the plates. ONAF cooling equipment may be retrofit with ballistic plates 92 in the same manner as the OFAF coolers. Additional or larger fans may be needed to compensate for any reduction in cooling capacity due to the installation of the ballistic protection plates 92.

The ballistic plates 92 are hung off of tank-mounted frames and are either AR500 steel or lighter weight mild steel with a ballistic coating with thicknesses and coatings as described above in the test results and for other ballistic plates installed with the inductive device 10.

Cooling is vital to an inductive device and an inductive device can only operate for a short time with damaged or reduced cooling. The desired outcome for cooling resiliency during a ballistic event would be total prevention with no loss of service (ballistic does not penetrate the inductive device and there is secondary cooling that comes online). Alternatively, the inductive device failure prevention by forced shut down with optional pre-planned cooling replacement is utilized to minimize the outage time.

Bullet penetration of an inductive device is detected by a rapid drop in oil level that is not consistent with load or ambient temperature change. The detection is achieved with an electronic oil level sensor. A data acquisition unit 106 having a processor 108 and non-transitory computer readable storage medium 110 having thereon a plurality of machine-readable instructions 112 that when executed by at least one computer processor 108 cause the at least one computer processor 108 to compare at least one of temperature, oil pressure and oil level measurements against predetermined thresholds for at least one of the measured values to determine whether the measurement is actionable.

A comparison of the inductive device load and ambient temperature to expected values for load and ambient temperature is used to determine whether the measurement is actionable due to a ballistic event or other event. If it is determined that the measurement is actionable, the inductive device is immediately tripped offline to prevent metal contamination from the ballistic event causing dielectric failure of the inductive device. Thus, the integrity of the inductive device core/coils is saved, however, there could be significant loss of oil (environmental event) and significant repair costs.

Inductive devices with conservators 46 normally have a minimum oil level detection in the conservator piping that eventually alarms and/or trips the inductive device. A combined oil level and pressure sensor can rapidly detect rapid pressure drop and notify the control center of oil level and/or pressure below a pre-determined threshold.

Figure 9:
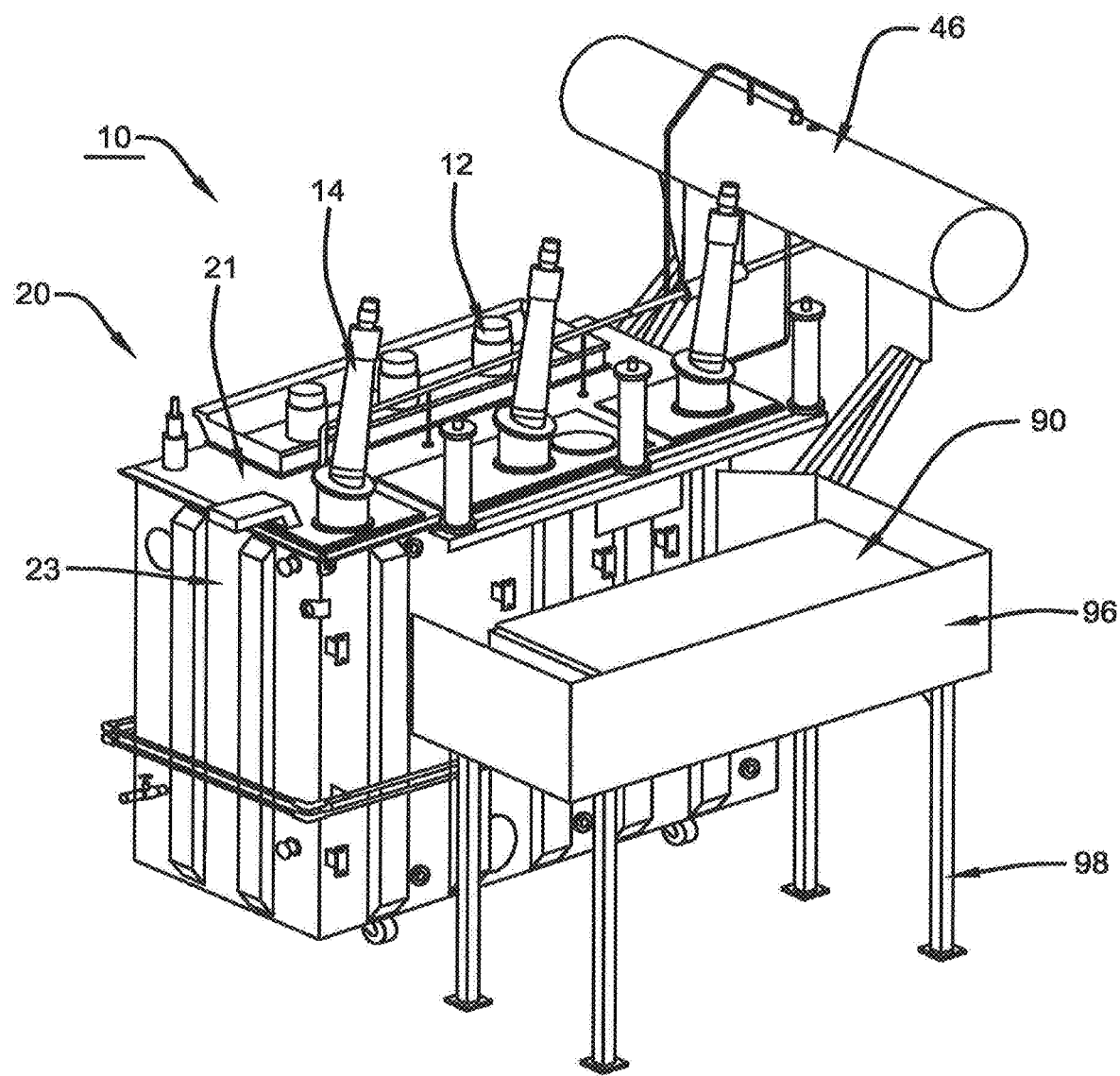
FIG. 9 is a perspective view of the inductive device having mobile coolers protected by ballistic plates.

In the event of a pressure or oil level drop below the threshold, the repair work may include tank repair, cooling replacement in the event that coolers 90, 96 were bullet penetrated, internal inspection of the tank for contamination by spall or other impact-generated fragments, providing new oil and vacuum filling. Mobile coolers 96 could also be used to keep the unit in operation at a reduced oil and pressure level if new cooling must be supplied as depicted in FIG. 9. The mobile coolers 96 have supports 98 that allow for placement of the coolers 90 next to the inductive device 10.

The cooling valves are triggered by the data acquisition unit 106 to immediately close in order to further prevent metal contamination from entering the windings and to limit the loss of oil. Therefore, if a bullet penetrated the coolers 90, the loss of oil would be limited to the cooling oil volume only.

To apply a resilient cooling solution to existing inductive devices, electrically actuated cooling valves are provided. The electrically actuated cooling valves are installed by closing the present valves (at each cooler or in the cooler piping for remote cooling), draining the cooling oil to the conservator, removing all cooling equipment, installing new electrically actuated cooling valves next to the existing valves, reinstalling the cooling equipment and refilling with cooling oil (optionally, pulling vacuum while refilling with cooling oil could be performed). The outage time may be 1-3 days or just a matter of hours if a vacuum is used. Further, in the event of detection of a ballistic event, the data acquisition unit 106 causes the primary cooling to be closed and removed from the inductive device oil flow. Concurrently, the data acquisition unit 106 triggers the secondary cooling to enter operation.

Examples of electrically actuated cooling valves that may be used with the present disclosure are ABZ high performance butterfly valves available from Forum Energy Technologies of Houston, TX.

With reference now to table 12 the aforementioned cooling options are summarized.

TABLE 12

| Option | Loss of Service Time (if ballistic event) | Comment |
| --- | --- | --- |
| Ballistic Event Sensor and Transformer Shut Down | Weeks | Only prevents transformer Failure |
| Automated Valve Shut Off | Weeks | Only prevents transformer Failure |
| Replacement Radiators | 1-2 days | Only prevents transformer Failure |

TABLE 12-continued

| Option | Loss of Service Time (if ballistic event) | Comment |
| --- | --- | --- |
| Retrofit ONAF cooling with ballistic protection plate | Zero | Total Protection - no loss of service |
| Retrofit OFAF cooling with ballistic protection plates | Zero | Total Protection - no loss of service |
| Replace existing cooling with new ABB designed ballistic secure OFAF coolers | Zero | Total Protection - no loss of service |
| Install secondary cooling | Zero | Total Protection - no loss of service |

Figure 43:
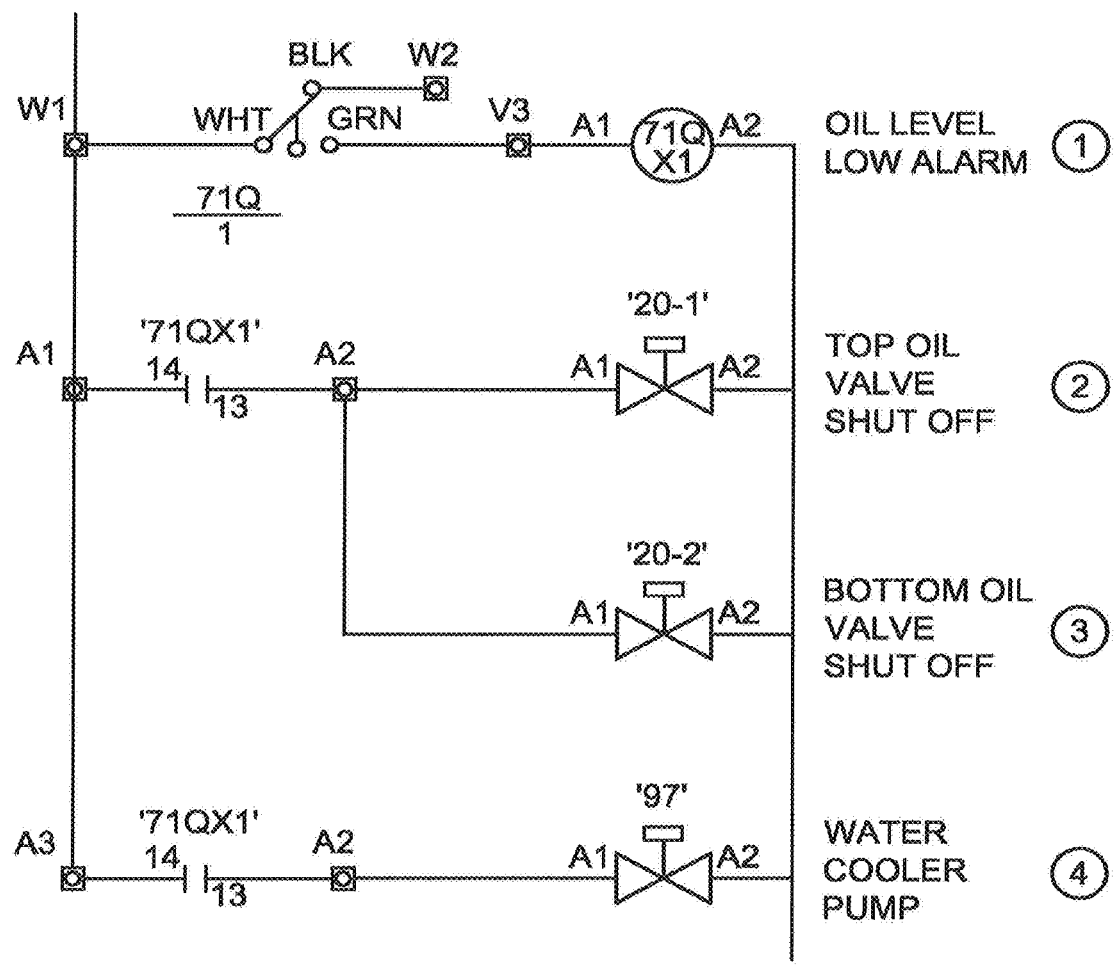
FIG. 43 is a schematic of a response sequence upon detection of low oil level and/or low oil pressure in the inductive device during an actionable event.

With reference now to FIG. 43, a shut-down sequence for protecting the active part of the inductive device 10 is depicted. The shut-down sequence is activated when a drop in oil pressure and/or oil level is detected at or above a predetermined threshold, such as may occur when the inductive device 10 is struck by an object such as a projectile that causes loss of dielectric fluid. In normal operation, a radiator cooling system 22 having an upper radiator valve 34, a lower radiator valve 36, and fans 18 cools the inductive device 10 during operation, and oil level and pressure gauges 24 work in conjunction with the back-up water cooling system 33 to cool the inductive device 10. In the case of the cooling radiators becoming punctured by projectile, such as a bullet, the oil level and pressure gauge 24 detects the drop in oil pressure and enacts a sequence of valve actuations as described in FIG. 43. In particular, the sequence is designed to protect the active part of the transformer 10 from being damaged.

The valve sequences are designed to isolate the damaged radiator 22 cooling sections and transfer cooling operations to the back-up water cooling system 33. First, the combined oil level and pressure gauge 24, at step 1, detects and provides a quick response to changes in insulating fluid pressure and level caused by radiator panels being punctured and leaking insulating fluid. Next, at steps 2 and 3, the upper radiator valve 34 and lower radiator valve 36, both valves 34, 36 having an actuator, simultaneously close when a signal is sent from the oil level and pressure gauge 24 upon critical low oil level detection, such as below a lower limit value for oil level.

After the upper and lower radiator values 34, 36 are closed, at step 4 as indicated in FIG. 2, the water cooling back-up system 33 that includes a pump, is actuated when a signal is sent from the oil level and pressure gauge 24 upon critical low oil level detection by the oil level gauge. The back-up water cooling system is connected to a standard water supply and continually draws water into the cooling system of the transformer 10. Alternatively, the back-up water cooling system is a reservoir or tank containing water that is pumped into the transformer 10 to cool the insulating fluid. The water cooling back-up system 33 and pump are housed in a container for protection against ballistic projectiles and other intrusions.

The inductive device 10 is equipped with vibration sensors for sensing impact and an alarm for notifying personnel when the transformer 10 receives a shock or vibration, such as from a ballistic projectile. If the shock, vibration or noise level is above the threshold for shocks or vibrations experienced during normal operation of the inductive device 10, a safety mode is activated. The safety mode that is enacted when the transformer receives an impact such as a shock as a ballistic projectile or an acoustic signal above the predetermined threshold is measured halts the tap changer mechanism and starts all of the fans in case of radiator 22 shut down. The sequential safe shutdown of the transformer may occur, for example, upon opening of the pressure relief valve 30. In this case, the power interruption device such as circuit breakers protecting the inductive device 10 have contacts opened by a relay in communication with the valve 30 and/or the oil level and pressure gauge 24. Alternatively, the back-up water cooler system 33 is activated in the case of radiator 22 shut down.

With reference now to FIGS. 10-11 and table 13 below, a series of tests were performed by the inventors to determine the effect of the applied coating on the noise level of the inductive device. The tests were conducted in accordance with the IEEE C57.12.90 2010 "Standard test code for liquid-immersed distribution, power and regulating transformers" using the 69 kV, 12/16/20 MVA transformer that was coated with XS-350 in the manner previously described. It was found that the noise level of the transformer during the test was reduced by at least 4 decibels in comparison to a non-coated transformer of identical construction.

The noise measurement performed on the coated and un-coated transformers was a total core noise measurement test. The comparison of the total core noise tests is provided below in table 13:

TABLE 13

Audible Noise Measurement (Coated vs. Uncoated Transformer Tank)

| Frequency | Core noise, dB (reference) | Core noise, dB (w/coating) | Effect of coating, dB |
| --- | --- | --- | --- |
| Total | 65 | 60.7 | −4.3 |

The analysis of the noise data shows a maximum of a 4.3 dB reduction of the total core noise level for the inductive device with the coating in comparison to an inductive device without the coating. Therefore, the inductive device having the coating applied thereto has from about a 0.1 dB to about a 4.3 dB reduction in core noise level as compared to an uncoated inductive device. The inductive device used in the noise level test series had a tank formed of ASTM A36 mild steel having a ⅜ inch thickness. Additionally, the XS-350 was applied to the tank side walls 23 at a ½ inch thickness.

With reference now to FIG. 10, measurements were taken at 26 measurement points using 26 acoustic sensors surrounding the inductive device coated with XS-350. Each acoustic sensor was mounted on a stand at a height of ⅓ or ⅔ of the inductive device tank total height (Ht in FIG. 10) from the base of the tank or ground level. Sound pressure level measurements, $L_j$, at the indicated frequencies of 12.5 to 2,000 Hertz were recorded in FIG. 10.

The energy average inductive device sound pressure level is calculated by averaging the ambient-corrected sound pressure levels measured at each microphone (acoustic sensor) location and for each frequency band (A-weighted, one-third octave band, or discrete frequency) using Equation (34): $L_p = 10 \times$ $$\log_{10}\left\{\frac{1}{N}\sum_{i=1}^{N}10\left(\frac{Li}{10}\right)\right\}$$

Wherein:

$L_i$ is the sound pressure level measured at the ith location for the A-weighted sound level, for a one-third octave frequency band, or for a discrete frequency (dB); and N is the total number of sound measurements.

The arithmetic mean of the measured sound pressure levels may be used to determine the average inductive device sound pressure level when the variation of the measured levels is 3 dB or less or when an approximate value of the average inductive device sound level is desired.

The first column of FIG. 11 entitled "AVG" is the average of $$10\wedge\left(\frac{Li}{10}\right)$$

of all measurements for the frequency in the column entitled "Freq." The "$L_p$" column provides the values for 10*log (AVG). $L_p$ is equal to 60.67 for the test of the coated inductive device described above. As compared to the test results for the uncoated inductive device measuring 65 dB core noise, the coated inductive device experienced a reduction in the total core noise level of 4.3 dB.

It should be understood that various factors impact core noise level measurements including but not limited to: design and construction of the core, coil, and tank and measurement accuracy of the noise level measuring system. Due to these factors, it is expected that a total core noise level reduction above 4.3 dB may be achieved.

The XS-350 polyurea coating was tested for environmental integrity as outdoor applications expose the inductive device housing to factors such as pollution, rain, snow, wind, dust, and ultraviolet rays that may degrade the coating over time. In particular, humidity, ultraviolet accelerated weathering (QUV), and simulated corrosive atmospheric breakdown (SCAB) tests were performed. The humidity test performed in accordance with ASTM standard D3363-11 was conducted using 2 test panels having the coating applied thereto. The test panels were evaluated for blistering and softening and were found to meet the ASTM standard D3363-11 specification.

The ultraviolet accelerated weathering test (QUV) was performed in accordance with the ASTM standard D523-14 and the gloss of the coating was evaluated prior to and after the test. The test panels met the ASTM standard D523-14 specification. A visual test evaluation of cracking and crazing of the QUV samples met the specification as well.

The simulated corrosive atmospheric breaks (SCAB) testing was performed in accordance IEEE standard C57.12.28-2014 for 504 hours of UV exposure, scribe, and fifteen exposure cycles over three weeks for sections a through d. All of the tests met the specification in accordance with IEEE standard C57.12.28-2014.

Ballistic Impact Sensing

Inductive devices such as large power transformers are crucial power system components for reliable transmission and distribution of bulk power to end-users. A transformer failure due to a deliberate damage or tampering is a significant event that can lead to a major outage or cause a blackout. The design and manufacture cycle for large power transformers can take at least a year or longer. Often times, the consequential damages resulting from loss of a substation transformer can exceed the transformer replacement cost and therefore securing transformers in transmission and distribution substations is a NERC CIP (Critical Infrastructure Protection) requirement.

A transformer having its physical integrity compromised needs to be dealt with immediately to contain the magnitude of the damage and avoid substantial consequential losses as a result of inductive device failure including a potential blackout. A sensor-based solution developed by the inventors and disclosed herein continuously assesses the physical security of a an inductive device such as a substation transformer and alarms the operators in time to take corrective and/or preventive measures in the event of an attack that would compromise the integrity of the operation of the inductive device. Corrective measures are initiated when the determination is made that the inductive device suffered sustained damage. Preventive measures may be initiated in cases where no immediate damage is suspected but the goal is to prevent future incidents and reduce the likelihood of an incipient failure.

The sensor-based solution detects and responds to possible attacks on substation inductive devices and other electrical equipment as well as provides automated damage assessment and awareness to utility control center 130 personnel and other operators.

Tests were carried out using data to represent potential events, dangerous or not, including gunshots, thrown rocks, and hammer strikes. A system and a method to detect impact to a stationary inductive device such as a transformer (or other electrical equipment) and discern between impact of a bullet to the inductive device tank 20, characterized as an attack on a inductive device, and a non-bullet strike is provided.

Figure 13:
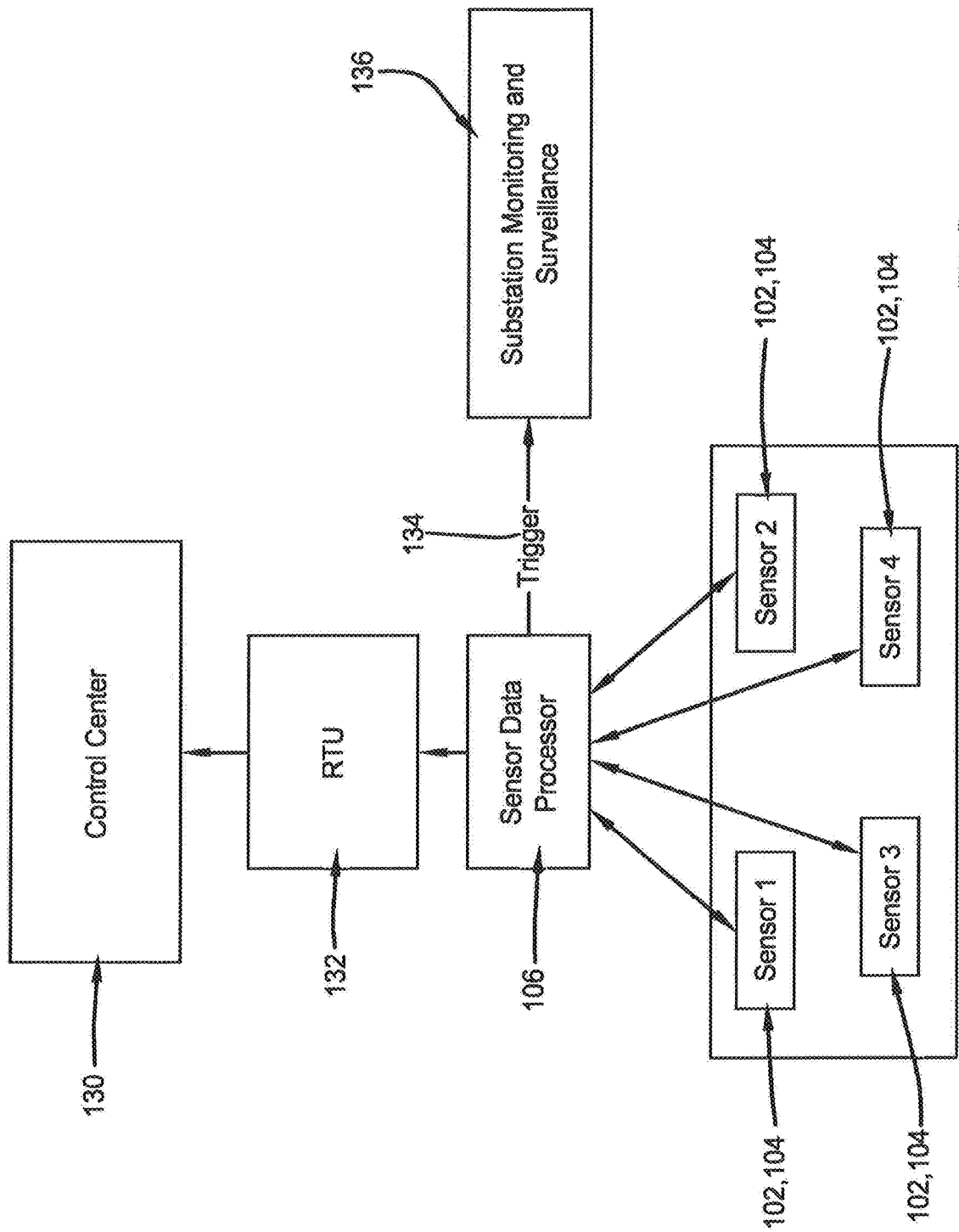
FIG. 13 is a schematic of one embodiment of a sensor-based ballistic impact detection system for electrical equipment in accordance with the present disclosure.

A high level embodiment of the sensor-based electrical equipment physical security system is shown in FIG. 13. The major components of the system include various sensors 102, 104, a sensor data processing unit 106, a remote terminal unit (RTU) 132 for remote communications, and an interface to a control center 130. The sensors may be wired, wireless, or autonomous sensors with power harvesting features requiring no power source for operation. The sensors measure various physical quantities related to motion, sound, light intensity, and other environmental factors. For example, the sensors may measure acceleration along three axes and sound waves.

The sensors may be installed stand-alone around the inductive device, attached to the inductive device tank 20, or installed inside the tank. The data from these sensors are gathered by the sensor data processing unit 106. The processor receives the sensor data and time-stamps the records. The sensor data processing unit 106 further performs preliminary data processing tasks such as filtering and averaging on the raw data. In one embodiment, the sensor data processing unit 106 also runs detection algorithms for local alarming and annunciation. The output from the sensor data processing unit 106 is received by the RTU 132 and communicated over a preferred communications medium to the utility control center 130 interface system.

In one embodiment, the interface system may receive the data from the RTUs and run algorithms on the data set for damage assessment and a detailed integrity check. The final outcome is displayed on the operator dashboard in real-time to allow actions to be taken. In another embodiment, the output from the sensors is used to control the closing of cooling system valves in the event of loss of oil detected by other means. In that same embodiment, the output from the sensors is also used to open valves to enable the application of a redundant cooling system for the inductive device.

The sensor system is used as a trigger system primarily for activating other security systems, such as substation monitoring and surveillance systems 136. For example, it can be used to guide the cameras to take specific shots of the inductive device or substation perimeters. Such evidence gathered just-in-time may be used for forensic analysis.

In this case, the data processing unit runs a set of algorithms to determine the onset of an impact and sends a trigger signal to the appropriate monitoring and surveillance systems for detailed measurement and recording of the impact event. The surveillance system is flexible enough to detect an impact just before and as the impact is occurring as opposed to prior art systems that utilize surveillance equipment (i.e., cameras) fixed at particular angles and assets or moving with slow speed and likely to miss the onset of the attack.

Figure 14:
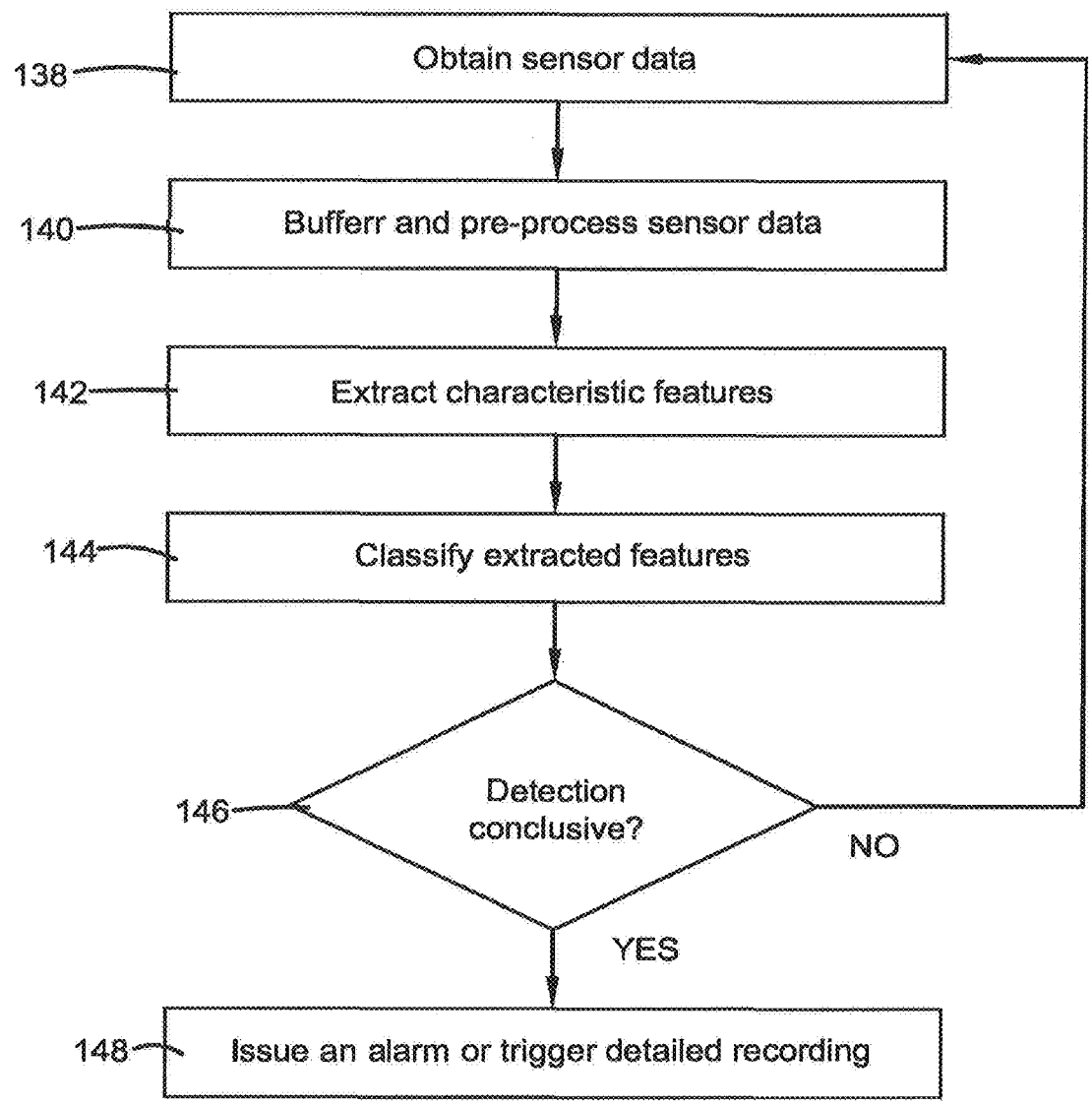
FIG. 14 is flow chart of a method for obtaining, processing, and classifying sensor data for determining whether to issue an alarm or trigger detailed recording of sensor data.

With reference now to FIG. 14, the steps for detecting an impact and taking action on the detected impact are provided. The steps may be implemented in the data processing unit 106 or in control center 130 computers with varying levels of complexity.

At step 138, the sensor data is received. The sensor data is then buffered and pre-processed at step 140. Pre-processing prepares and cleanses the data for analysis in the subsequent steps. The typical functions covered by pre-processing may include removing noise from the measurements, filtering/re-sampling, segmentation, and/or aggregation. Filtering removes the unwanted components from the measurements. Segmentation returns the period of interest in a data set and aggregation is a technique that combines data from multiple sources or provides uniformity to the disparate data that arrive at different time intervals.

At step 142, informative characteristics are extracted which may be in the time, frequency, or time-frequency domain. The characteristics are fed to a classifier at step 144 that assigns a label for the data set which in turn is used for a logic check at step 146. Depending on the result of the detection logic, the flow either returns to the next interval of data processing at step 138 or is transferred to the alarm block at step 148, triggering further actions by the operator or by a substation surveillance system.

The data generated by a series of trials conducted by the inventors suggest the ability to differentiate between the gunshot and non-gunshot using signal waveform characteristics such as the presence of the shockwave signal from the supersonic bullets as well as the signal from the muzzle blast. However, it is important to note that not all gunshots will have these characteristics, as some gunshots are subsonic, the muzzle blast signal may be limited with a suppressor and there may be physical interference between the blast and the sensor. Although not identical, the acceleration response of the strongest hammer strike is similar to that of some of the gunshots. Different waveform characteristics could be used to identify gunshot and non-gunshot impacts.

Figure 21:
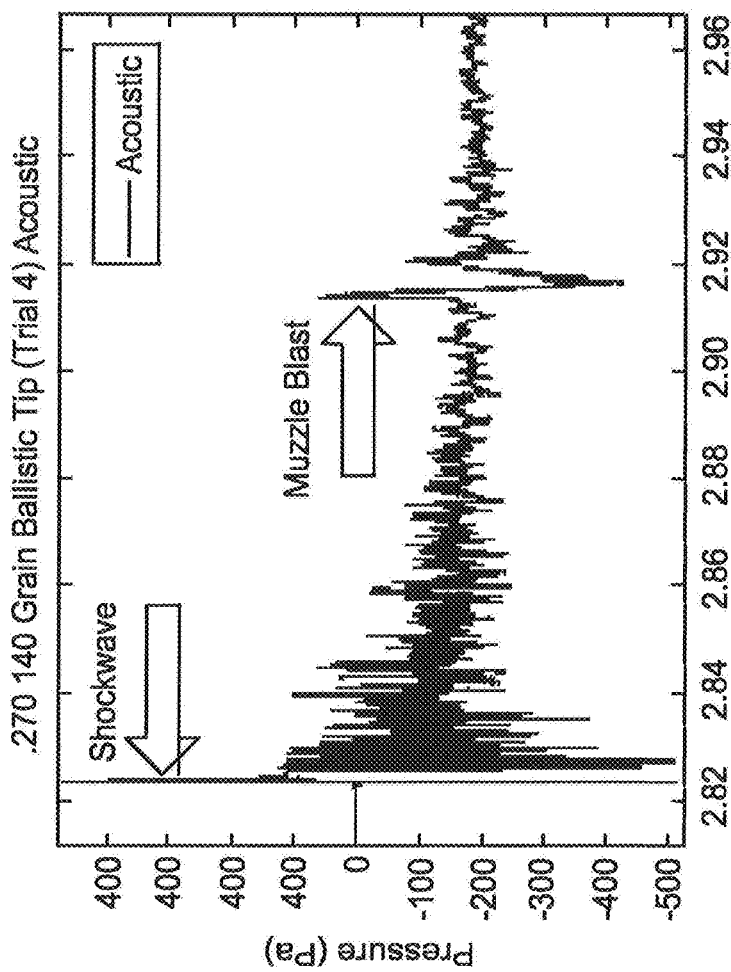
FIG. 21 is a plot of the acoustic signature of trial 4 including the shockwave and the muzzle blast.

For instance, a supersonic projectile has two forms of acoustic energy, shockwave and muzzle blast. The shockwave occurs before the muzzle blast in time as is shown in FIG. 21. The shockwave and muzzle blast are unique to firearms, therefore, it is clear that a bullet has been discharged from a firearm.

Figure 15:
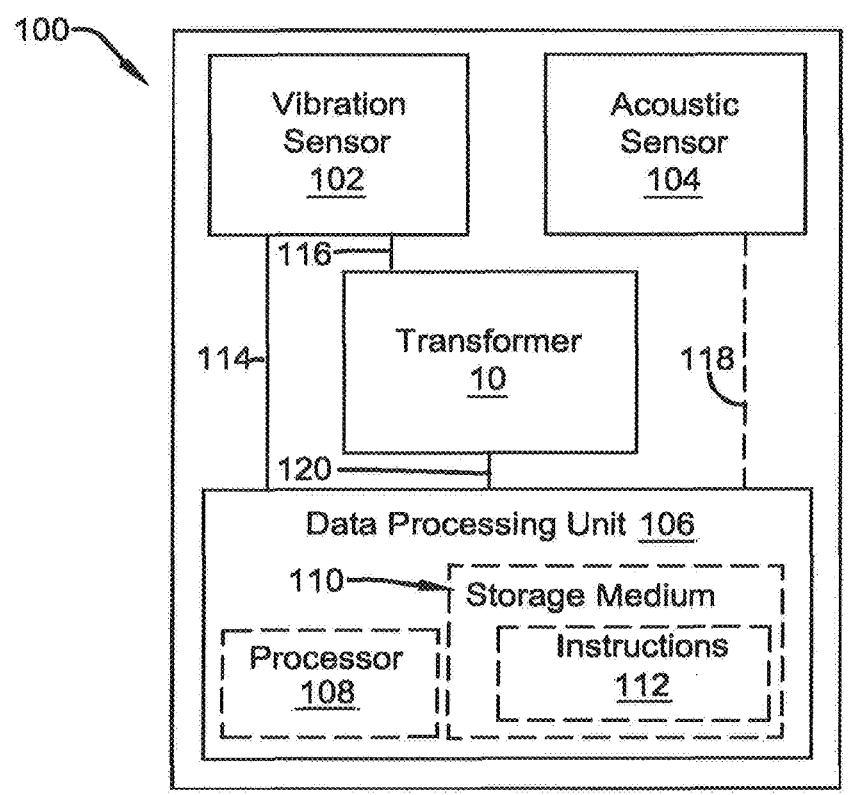
FIG. 15 depicts a system for sensing impact and/or approach of an object to electrical equipment and determining whether the impact to the electrical equipment is actionable.

A schematic of a system 100 for detecting impacts to inductive devices and other equipment at a substation is shown in FIG. 15. The system 100 has at least one acoustic sensor 104, at least one vibration sensor/accelerometer 102, and the data acquisition unit 106 having a processor 108 and non-transitory computer readable storage medium 110 having thereon a plurality of machine-readable instructions 112 that when executed by at least one computer processor 108 cause the at least one computer processor 108 to compare signals received from the acoustic 104 and vibration sensors 102 against thresholds for sound pressure and acceleration to determine whether the impact is from an object such as a gunshot projectile or a non-gunshot projectile. As a minimum, one accelerometer may be required to detect impact whether gunshot related or not. Further, if either of the measured sound pressure and acceleration values exceed the predetermined thresholds, an alarm is sent to the operator or utility control center. Additionally, if either of the measured sound pressure and acceleration values exceed or meet predetermined thresholds in conjunction with an increase in oil temperature or drop in oil pressure or oil level. The sound pressure and acceleration data is recorded in the database of the data acquisition unit and/or computer at the network control center.

If it is determined that the impact is due to a gunshot projectile, various actions can be taken such as directing a surveillance camera at the substation to the inductive device that has been struck or is in the path of the projectile and the vicinity around the inductive device. When the location of the shooter can be determined based on sensor data described below, the surveillance camera may be directed toward the shooter's location and a facial recognition sequence may be initiated. Further, backup cooling sequences may be initiated for the inductive device when it is determined that the inductive device is under attack and valves may be closed to prevent the leakage of dielectric fluid from the inductive device.

The at least one vibration sensor and at least one acoustic sensor are each wired to the data acquisition unit. The at least one vibration sensor is in contact with the inductive device tank 20 and the at least one acoustic sensor is positioned in or out of contact with the inductive device tank 20. It should be understood that more than one sensor of each type may be used in various combinations depending upon the desired results as indicated in Table 15 which will be described in more detail later.

During the series of sensor-based ballistic tests, the shooter lined up approximately 60 meters away from and orthogonal to the tank 20. Tests were performed on an inductive device tank 20 that was filled to about two-thirds of its height with water and was coated with ½ inch of the XS-350 coating prior to the testing.

Figure 16:
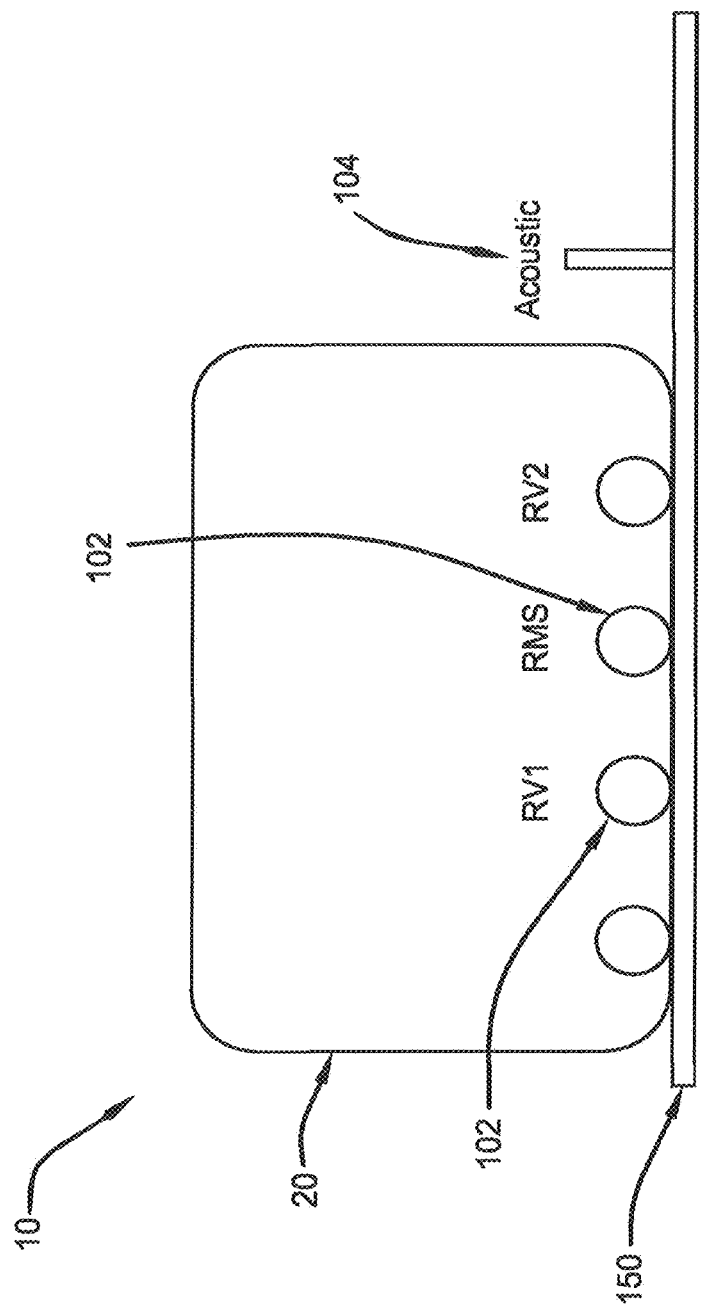
FIG. 16 depicts the setup of ballistic test trials using a transformer tank having raw vibration, root mean square (RMS) vibration, and acoustic sensors installed nearby or in contact with the tank.

With reference now to FIG. 16, the vibration sensors were attached proximate to the bottom of the tank wall. The acoustic sensor was approximately 1 meter closer to the shooter than the rest of the sensors, as it was attached to the edge of the platform 150.

During the test trials described in Table 14, data was collected from four sensors including two raw vibration sensors, one RMS accelerometer and one acoustic sensor. The RMS accelerometer is a wired accelerometer and has a measurement range of from 0.0 to 10 g rms, an output of 4-20 mA, and a frequency range (+−3 dB) from 180 cycles per minute to 600000 cycles per minute (cpm). The sensor mounting positions are shown in FIG. 8 from left to right, and the far right sensor, RV2, is closest to the shooter.

Figure 17:
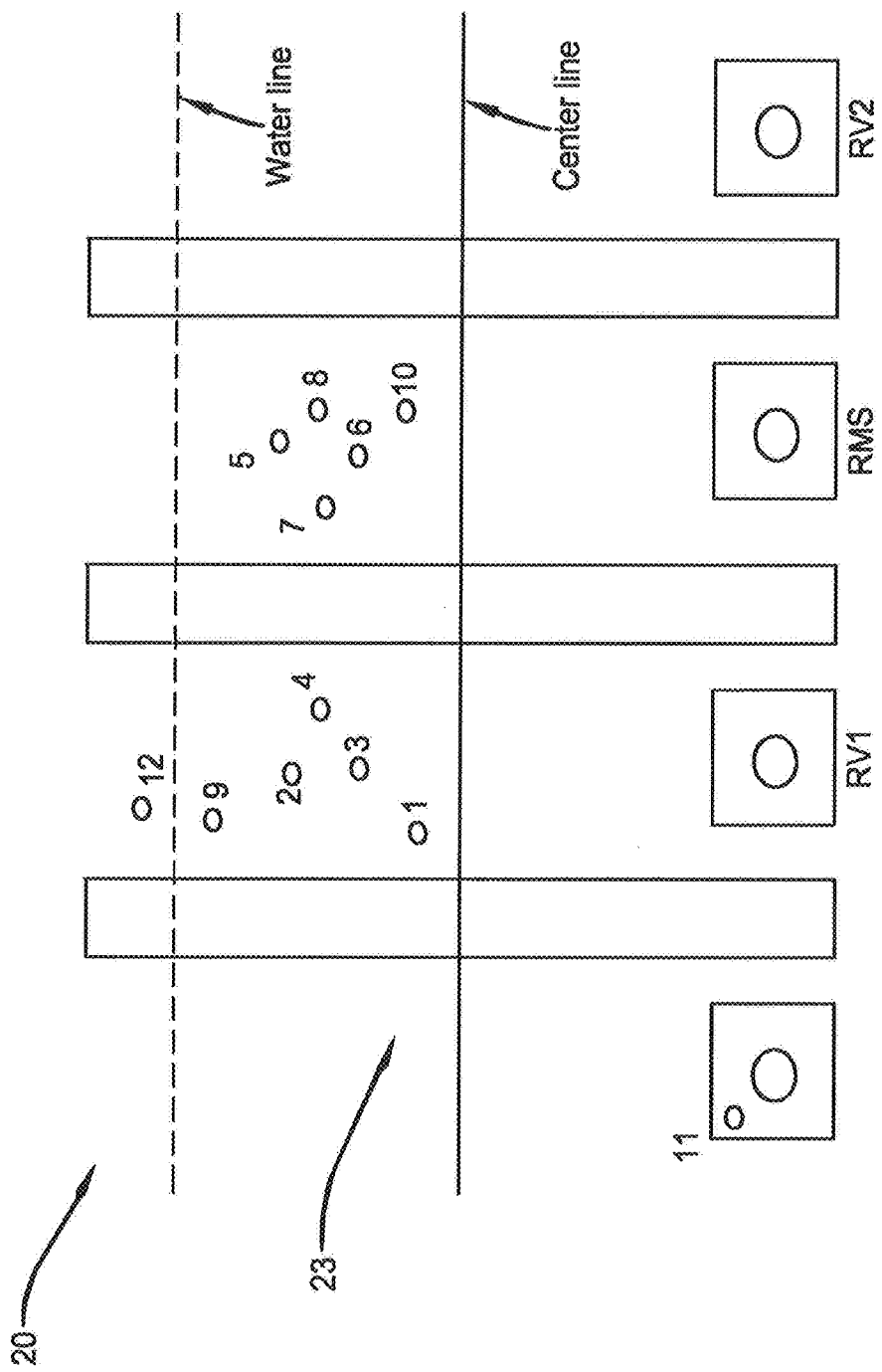
FIG. 17 depicts the location of projectile strikes in test trials upon the impact of the projectiles to the tank.

Twelve shots were fired using the various guns and ammunition at the points indicated in relation to the water line shown in FIG. 17. The water line is meant to represent the fluid level of dielectric fluid even though water was used in the testing.

TABLE 14

Test parameters for each test run

| Case # | Bullet Information |
|---|---|
| 1 | 223; 55 grain; FMJ |
| 2 | 223; 55 grain; FMJ |
| 3 | 223A; 55 grain; FMJ |
| 4 | 270; 140 grain; ballistic tip |
| 5 | 308, 167 grain; FMJ |
| 6 | 30-06; 150 grain; core lock tip |
| 7 | 300 WBY MAG; 150 grain; InterBond ballistic tip |
| 8 | 300 WBY MAG; 180 grain; SpirePoint soft lead tip |
| 9 | 300 WBY MAG; 180 grain; SpirePoint soft lead tip |
| 10 | 325 WSM; 200 grain; red AccuBond tip |
| 11 | 270; 140 grain; ballistic tip |
| 12 | 270; 140 grain; ballistic tip |

With reference now to FIG. 17, the bullet contact points on the inductive device façade are shown and the bullets are numbered in accordance with the Table 14 test trials. All trials except for test trial 11 were above the center line of the tank 20.

Four impact tests were conducted in addition to the twelve test trials previously mentioned and were administered to the right-facing wall of the tank 20. Of the additional four tests, two recorded the impact of a rock, and two recorded the impact of a hammer.

Figure 18:
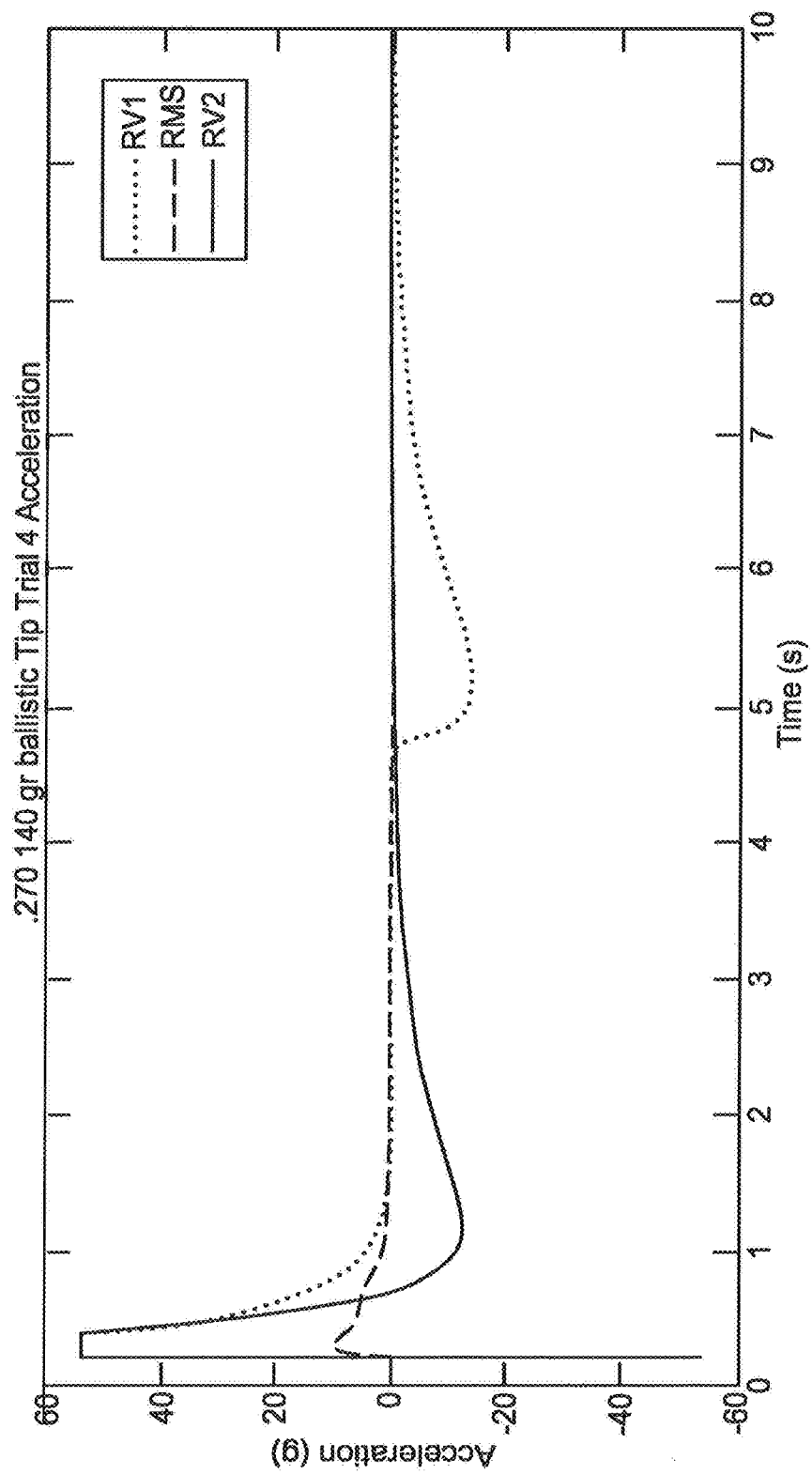
FIG. 18 is a plot of the acceleration vs. time results of the raw vibration and RM sensors of bullet trial 4.

With reference now to FIG. 18, the gunshot vibration response in acceleration vs. time as measured by the first and second raw vibration sensors as well as the RMS sensor is shown for the .270 caliber (140 grain) ammunition having a ballistic tip as was tested in trial 4. Trial 4 is used as an example for different impact scenarios in relation to FIGS. 18, 19, 21, and 22.

The bullet from trial 4 was closer to the location of RV1 than RV2. Thus, RV1 processed the impact and vibration first. The negative acceleration recoil is delayed for RV1 in FIG. 18 whereas the negative acceleration recoil is continuous for RV2.

Figure 19:
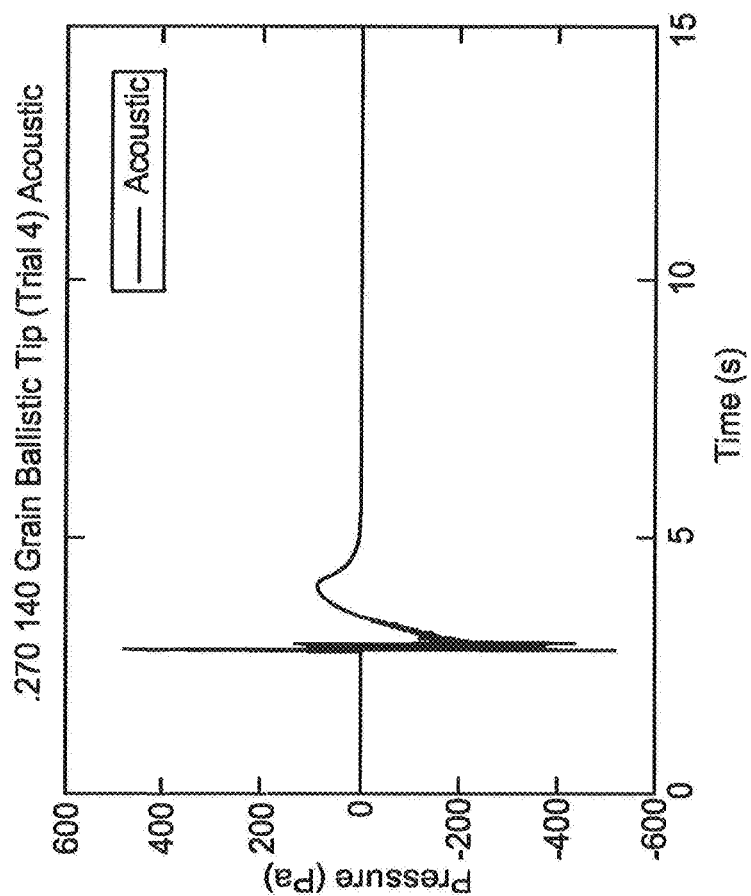
FIG. 19 is a plot of the acoustic sensor sound pressure test results of bullet trial 4.

With reference now to FIG. 19, the acoustic response of the gunshot of trial 4 is depicted. The acoustic sensor measures in Pascals and the conversion to decibels is based on a reference pressure that represents the lowest audible noise. In air, the reference pressure corresponding to the lowest audible noise is about 20 µPa. The equation to convert between decibels and Pascals is:

$$[dB] = 10\log_{10}\left(\left[\frac{[Pa]}{P_{ref}}\right]^2\right).$$

Figure 20:
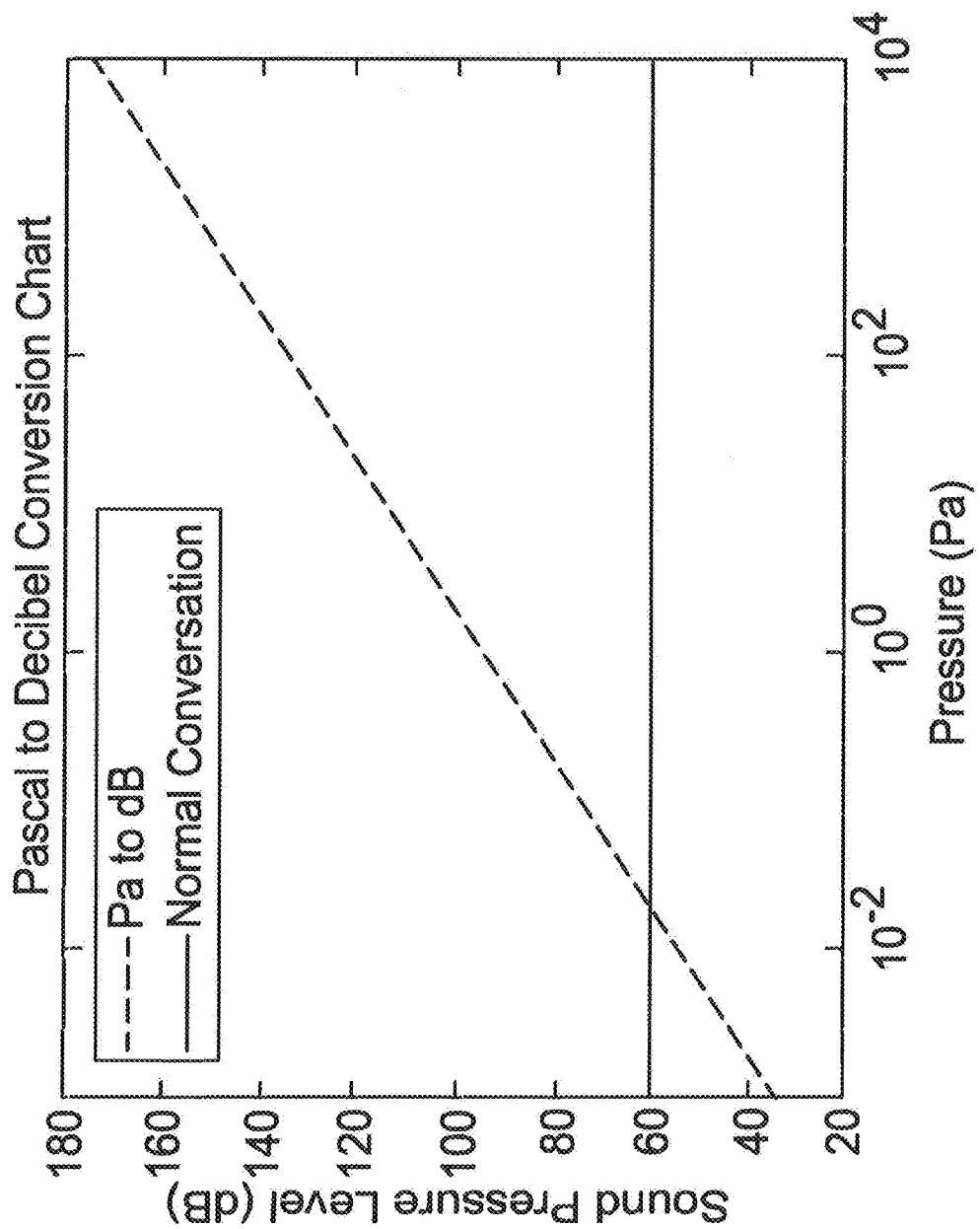
FIG. 20 is a chart for converting sound pressure measurements obtained in Pascals to Decibels.

The conversion chart for Pascals to decibels is shown in FIG. 20.

With reference now to FIG. 21, the shockwave and muzzle blast for trial 4 is depicted. The shockwave from the bullet occurs just after 2.82 seconds. The muzzle blast occurs just before 2.92 seconds. The shockwave and muzzle blast both travel at the speed of sound. The part of the shockwave that is recorded by the acoustic sensor is not created until the bullet is approaching the tank 20. The muzzle blast has a head start in terms of the moment of launch and the supersonic bullet makes up for the time delay by the short distance the shockwave has to travel. Approximate calculations also predicted a time difference between the muzzle blast and shockwave of almost exactly 0.1 seconds.

With continued reference to FIG. 21, the amplitude of the peaks is important to consider. While the shockwave appears to create a larger peak-to-peak pressure, this is not actually the case. Sound pressure is inversely proportional to distance traveled, and the muzzle blast occurred about 60 m away, while the shockwave was much closer. Adjusting for distance, the amplitude of the muzzle blast (defined by half the span of the peak-to-peak) would be 178 dB at 1 meter away from the shooter, as opposed to the unadjusted 143 dB. Likewise, the adjusted shockwave level is 161 dB instead of 150 dB. For scale, a normal voice conversation occurs around 60 dB. Based on a logarithmic scale, this corresponds to 0.02 Pa. Conservative estimates were made for the saturated portion of the shockwave signal.

The durations of the signals were analyzed using an approximate formula provided below to calculate the theoretical time interval of the shockwave based on bullet size and speed:

$$T \approx 1.82\left(\frac{d}{c}\right)\left(\frac{Mx}{l}\right)^{\frac{1}{4}}$$

Here, d is the bullet diameter, l is the bullet length, c is the speed of sound, M is the Mach number (bullet velocity/c), and x is the distance between the bullet's trajectory and the microphone at the point of closest approach. This yielded a time of approximately 0.16 milliseconds, while the graphical peak-to-peak time is approximately 0.098 milliseconds. No other signal is on this time order of magnitude as is the muzzle blast duration of approximately 2 milliseconds.

Figure 22:
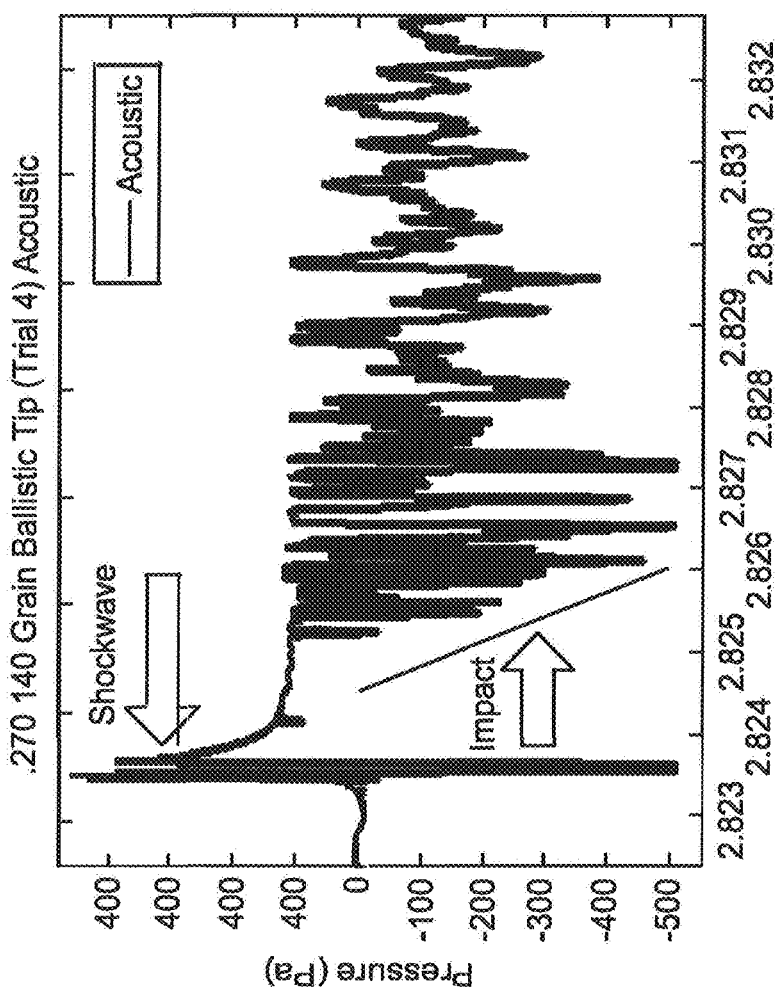
FIG. 22 is a plot of the acoustic signature of trial 4 including the shockwave and the impact.
Figure 23:
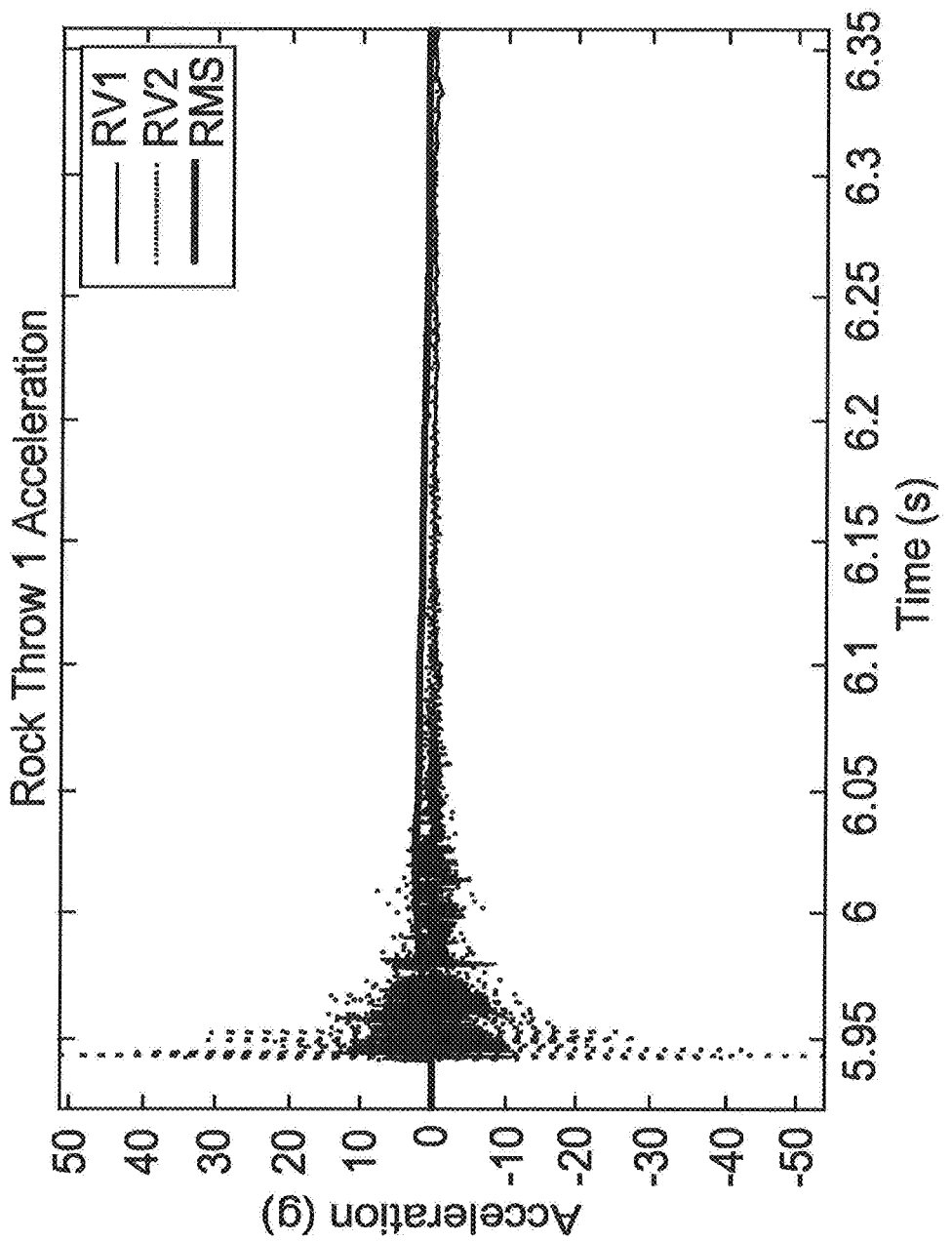
FIG. 23 is a plot of the rock trial acceleration versus time as measured by the raw vibration and acoustic sensors.

With reference now to FIG. 22, and zooming in on the white space immediately after the first event occurring at 2.823 seconds, a clean signal representing the shockwave is present. However, at 2.825 seconds, the signal's calm decay turns rampant with multiple oscillations. This is explained by the sound from the impact, which was also calculated to occur two milliseconds after the shockwave signal arrived. The many oscillations of the shockwave signal likely come from different paths the sound from impact could have taken to the sensor, specifically reflections off the platform 150.

Referring now to FIGS. 23-26, rock and hammer trials were performed and data was collected from these trials. The rock trials had far fewer components than the gunshot trials. The first component is the acceleration from Rock Trial 1 in FIG. 23. It is important to note that the rock was thrown at the right face of the tank, so the signal from RV2 greatly dominates the signal from RV1. RV2 reaches saturation despite the much lower force. However, there are clear differences in the RMS sensor, which has a much slower rise and lower maximum value. The RV signals are also much more oscillatory and stay centered on the x-axis than those of the gunshots, although this may in part be due to the location of contact. These observations support the usage of waveform characteristics to differentiate between gunshot events from non-gunshot events.

Figure 24:
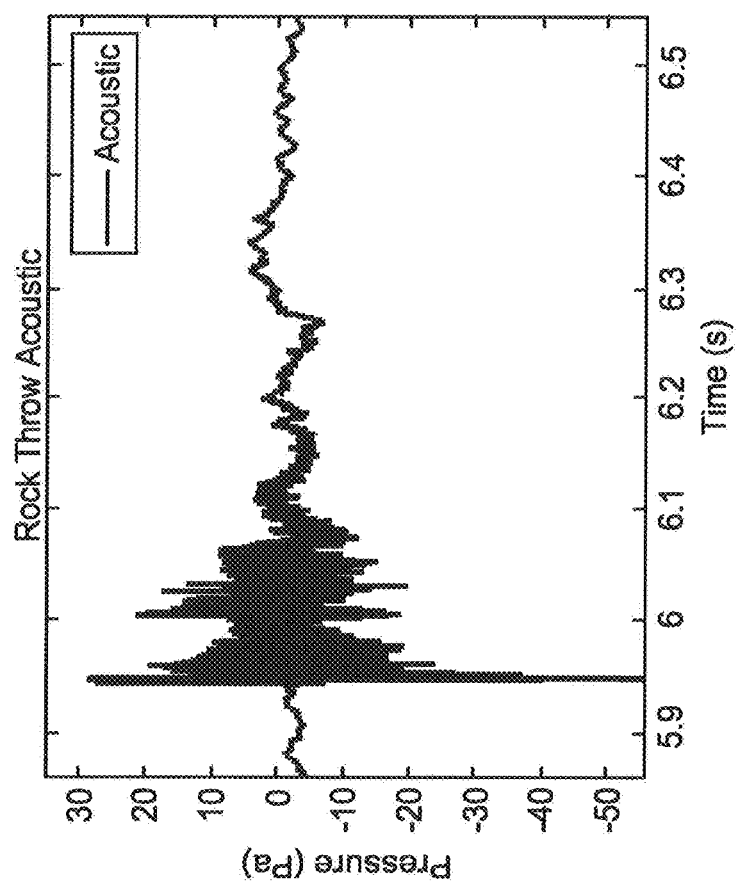
FIG. 24 is a plot of the rock trial acoustic signature as measured by the acoustic sensor for rock trial 1.

With reference now to FIG. 24, the acoustic signal of the rock throw offers more difference as the magnitude is significantly lower than that of a gunshot and there is no signature waveform of any kind. The acoustic rock throw signal tends to the negative pressure side, although not as much as the gunshot data.

Figure 25:
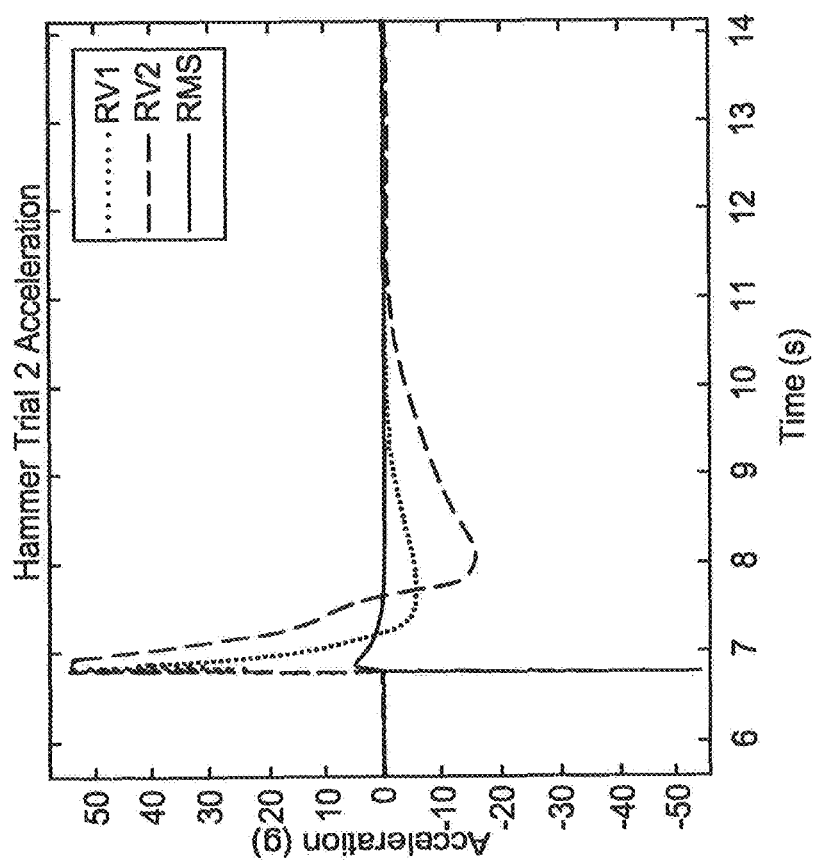
FIG. 25 is a plot of the hammer trial 2 acceleration versus time as measured by the raw vibration and RMS sensors.
Figure 26:
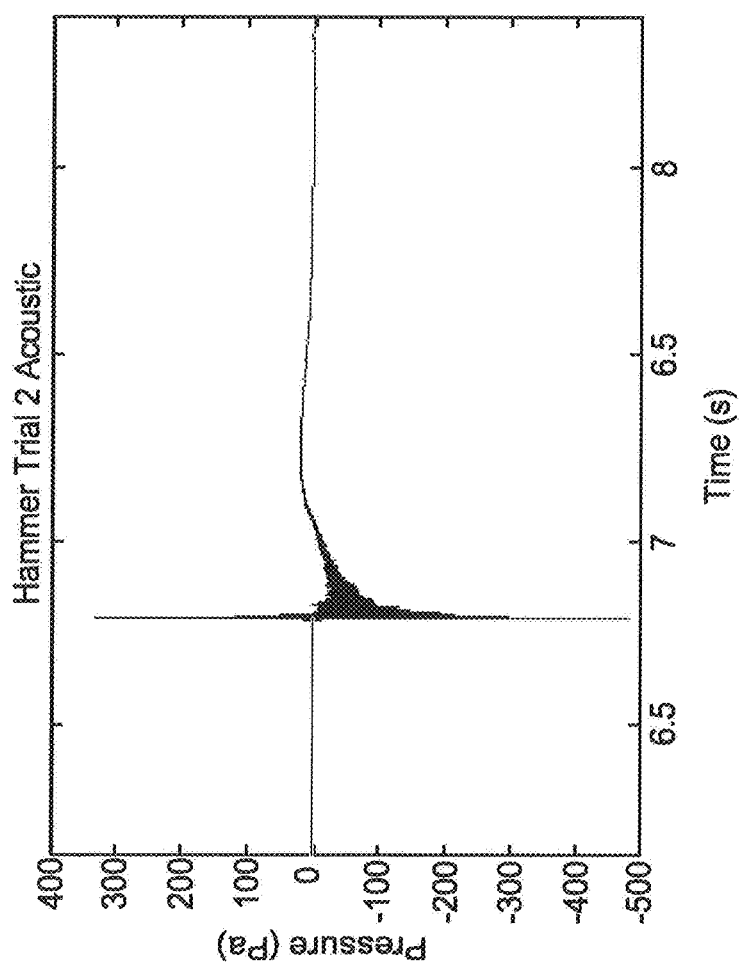
FIG. 26 is a plot of the hammer trial 2 acoustic signature.

A first hammer trial was conducted and proved as unimpressive as the rock throws. However, the second hammer trial was more forceful and is depicted in FIG. 25. The raw vibration sensors had very similar hammer strike temporal profiles to that of the gunshots, and the RMS takes a similar shape for the hammer strikes as the gunshot. While the maximum RMS value here is less than the lowest for the gunshots, this data set suggests it would be possible to reach the same RMS value as the lower end gunshots with just a household hammer. This observation supports the idea that amplitude of the RMS values alone may not be sufficient to differentiate gunshot events from non-gunshot events. Other waveform characteristics in time domain, frequency domain and time-frequency domain may be used to reduce false alarms such as when a non-gunshot event is tagged as a gunshot event.

Figure 31:
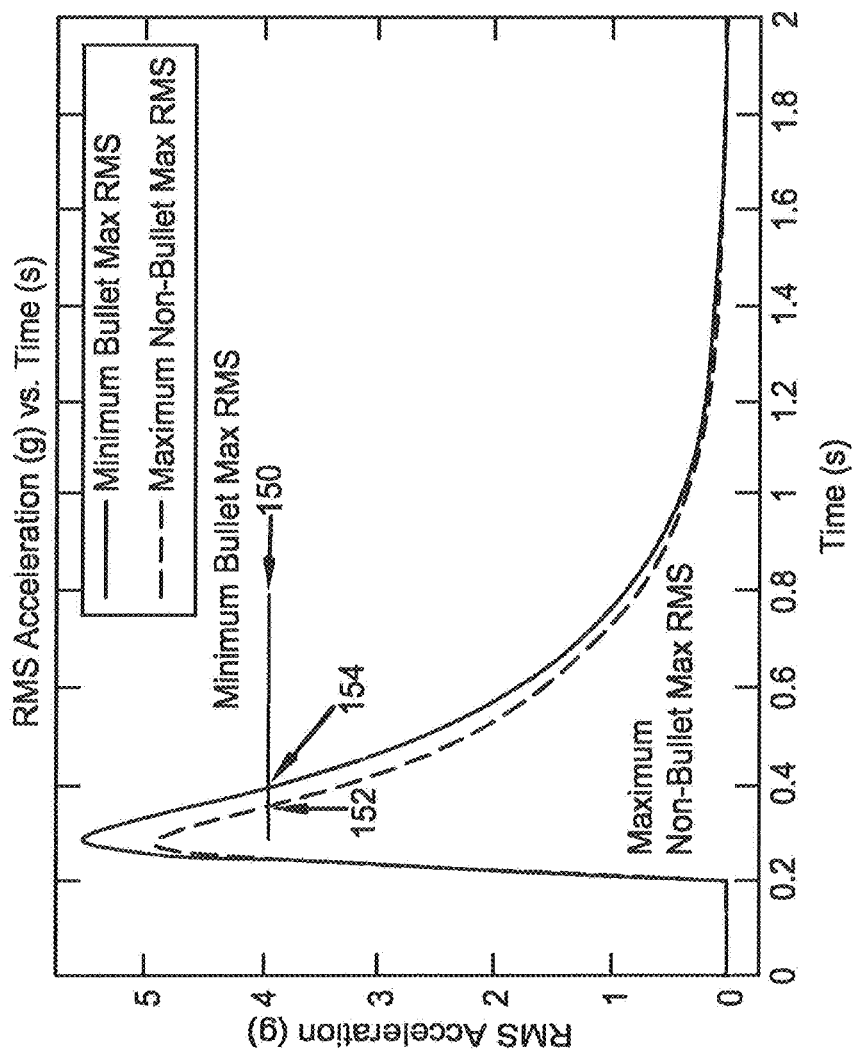
FIG. 31 is a plot of the RMS acceleration versus time for bullet versus non-bullet impacts to the transformer tank also showing the time decay of the signals.

An example of a time domain characteristic is the decay time constant as shown in FIG. 31. FIG. 31 takes the lowest maximum RMS from the bullet trials (~5.5 g) and compares it to the highest maximum RMS from the non-bullet trials (~4.9 g) wherein g is the acceleration due to gravity and is expressed in meters/(second)$^2$. It should be considered that a non-firearm attack, while much less likely to penetrate the inductive device, could still cause damage if at a large enough magnitude. This would also signify other issues regarding the physical security of the substation and should be flagged.

With continued reference to FIG. 31, a line 150 is drawn at 4 g acceleration to depict the difference in the time decay constant of the bullet versus the non-bullet. The non-bullet signal decays faster than the bullet signal. For example, point 152 of the non-bullet vibration signal occurs at 4 g acceleration and 0.35 seconds after the initial vibration detection. In contrast, point 154 of the bullet vibration signal occurs at 4 g acceleration and 0.41 seconds. This means that the vibration data can be used to cross-check the acoustic data for certainty of a bullet impact to the tank Referring now to FIG. 26, the acoustic data of hammer trial 2 also has some similarities to the gunshots. However, the acoustic data of hammer trial 2 has a lower maximum amplitude and a complete lack of identifiable events. The signal still trends negative while oscillating before making a positive run, but a closer look shows no single event that can be isolated.

Figure 28:
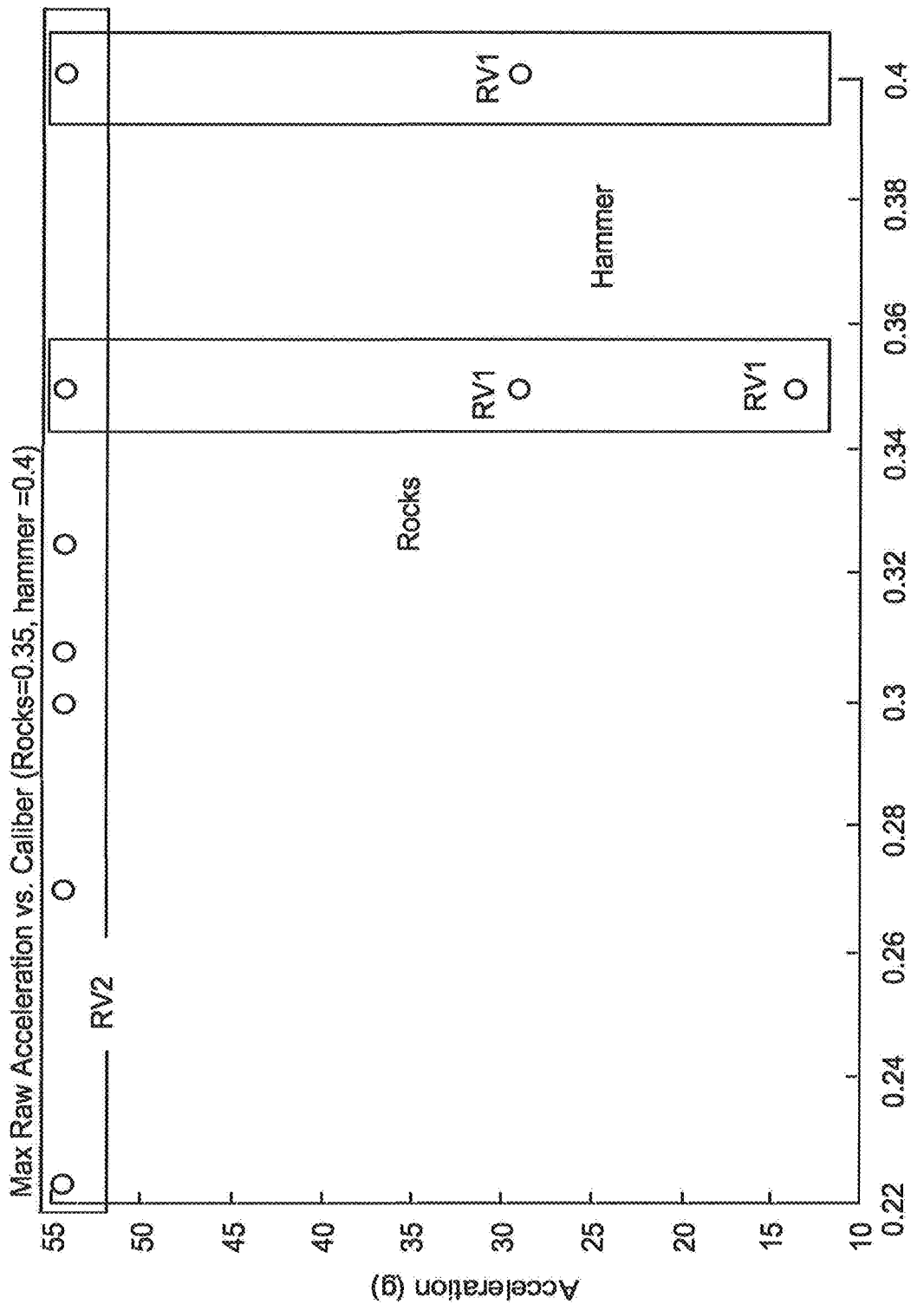
FIG. 28 is a plot of the max raw acceleration versus caliber of rocks versus hammers as measured by raw vibration sensors.

The raw vibration sensors RV1 and RV2 saturated quickly, rendering it impossible to differentiate among bullet calibers based on the maximum value of this measurement. FIG. 28 is a graph comparing maximum acceleration to caliber size and in which the rock is treated as a caliber size of .35 inches and the hammer is treated as a caliber size of .40 inches to allow inclusion on the graph. While all gunshots look the same in FIG. 28, the rock trials signals only drop lower on the sensor farther from impact. Likewise, the hammer trials see one occurrence of the far sensor not saturating, while the other three measurements (trial 1 RV2, trial 2 RV2, trial 2 RV1) end up in the same location on the graph. For the most part, the data from RV2 plotted over the data from RV1, as they were in the same location on the graph.

Figure 29:
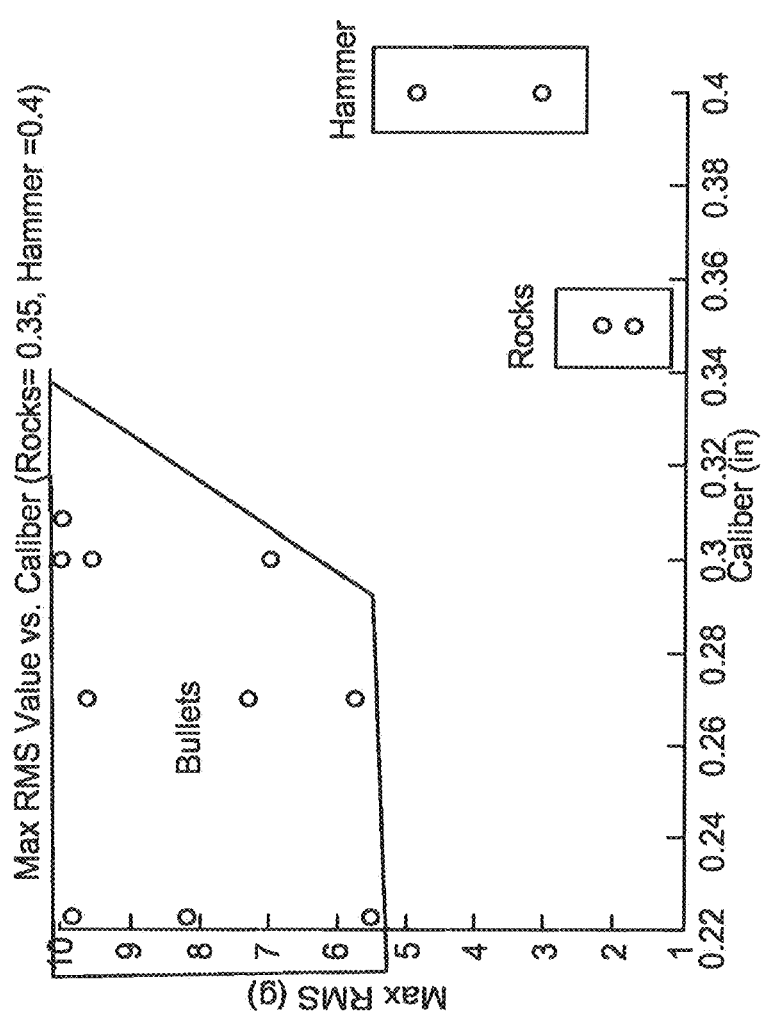
FIG. 29 is a plot of the max raw acceleration versus caliber of rocks versus hammers versus bullets as measured by raw vibration sensors.

With reference now to FIG. 29, the RMS measurements avoided constant saturation. However, there does not seem to be a strong correlation between caliber size and maximum RMS value.

Figure 30:
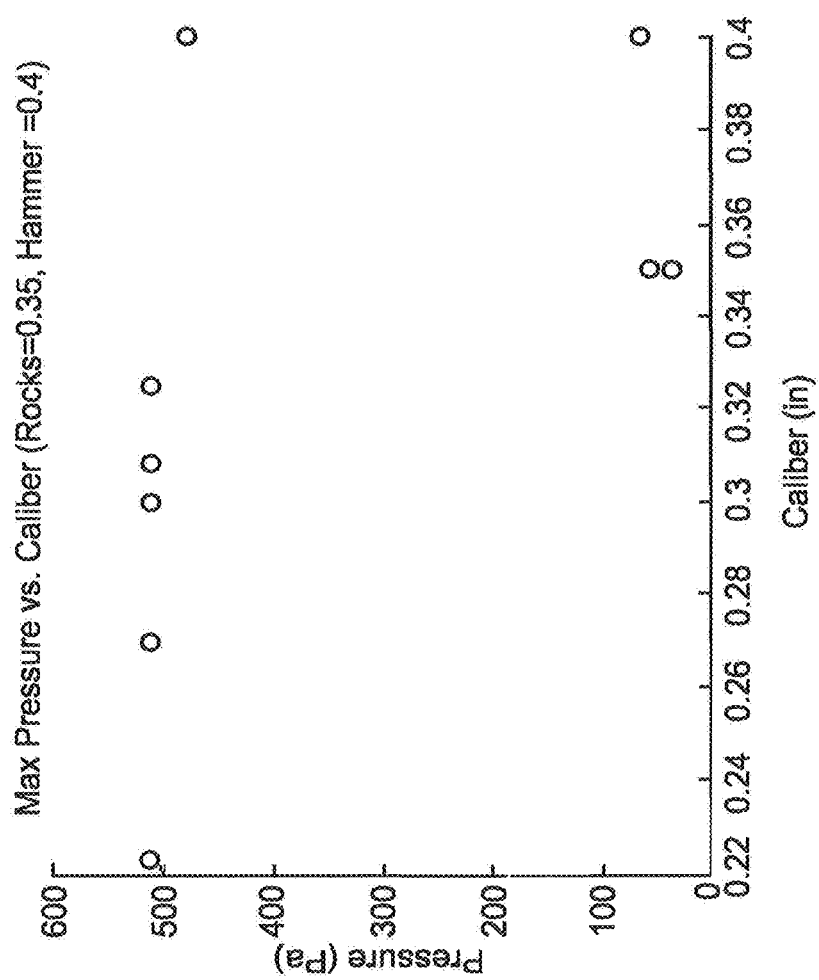
FIG. 30 is a plot of the max pressure versus caliber of rocks versus hammers as measured by the acoustic sensor.

Referring now to FIG. 30, the acoustic trials showed the pressure wave associated with a majority of the most impactful strikes at or above 500 Pa, while the rock impacts showed pressure levels below 100 Pa.

The defining features separating the gunshots versus the rock and hammer strikes were the presence of the shockwave and the muzzle blast of the gunshots. While all of the ammunition used in trials 1-12 was not subsonic, it is not unreasonable that one would actively choose a larger, slower bullet to avoid creating a shockwave. Different signal attributes in time and/or frequency domain may be used to account for these differences as previously mentioned.

With respect to the muzzle blast, the use of a suppressor needs to be considered. While this will make the signal quieter, commercial suppressors do not make a gunshot quiet, as may be assumed. Rather, commercial suppressors reduce the noise of a gunshot by an average of 20-35 dB, which is roughly the same as earplugs or earmuffs.

The bigger concern with the muzzle blast, however, is the "line of sight" and angle between the blast and the sensor. If there are physical obstructions between the blast and the sensor, the signal will be greatly decreased. This is also true if the shot is travelling at a large angle relative to the sensor, although sensor placement near the electrical equipment of interest should take care of that issue. Additionally, atmospheric conditions have an effect on the speed of sound and thus, the acoustic signal.

Two categories of possible solutions and systems for sensing a ballistic impact and determining whether immediate action should be taken to protect the transformer were developed by the inventors. The first category solution is a system that utilizes one RMS accelerometer and one acoustic sensor and detects large impacts on the transformer via the accelerometer, while also being able to differentiate between a gunshot and a blunt force attack via the acoustic sensor. The second category solution is a more complex system and will be addressed later.

The first category solution will now be described in detail. The RMS sensor was chosen over the raw vibration sensor because the accelerometer is only contributing to threshold detection so the actual waveform does not matter. Furthermore, the RMS sensor is an average of the vibration signal over a certain predetermined window, whereas the raw vibration sensor yields instantaneous measured values. A current-based output is preferred, as it is typically more robust against noise in the substation environment.

By way of non-limiting example, a PLC that may be used with the solutions outlined in the present disclosure is the AC500 PLC available from the assignee of the present disclosure. The first category solution also has a non-transitory computer readable storage medium having thereon a plurality of machine-readable instructions that when executed by at least one computer processor cause the at least one computer processor to perform a method for detecting if there has been a significant impact to the inductive device tank.

The first category solution for detecting impact to the inductive device has: a raw vibration accelerometer, an RMS accelerometer, an acoustic sensor, and a programmable logic controller. The programmable logic controller has a base module, an analog input (AI) module and a detection and assertion module. The raw vibration accelerometer may have an output of +/−5 volts corresponding to a measurement range from +/−50 g. The raw vibration sensor may be a 2-pin MIL-C 5015 electrical connector. By way of non-limiting example, a raw vibration accelerometer that may be used is a PCB 662601, available from PCB Piezotronics of Depew, NY.

Figure 27:
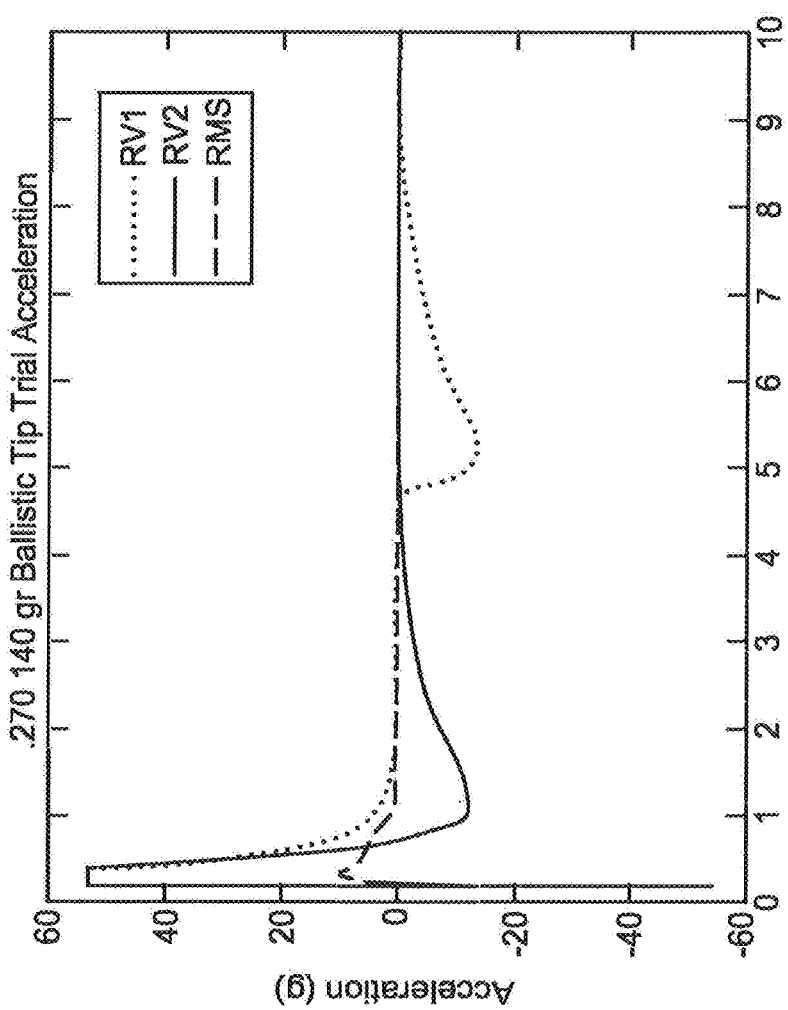
FIG. 27 is a plot of the bullet trial 4 acceleration versus time as measured by the raw vibration and RMS sensors.

The RMS wired accelerometer may have an output of 4-20 mA corresponding to a measurement range from 0 to 10 g. The RMS accelerometer may be a 2-pin MIL-C 5015 electrical connector. By way of non-limiting example, an RMS sensor that may be used is PCB 646602, available from PCB Piezotronics of Depew, NY FIG. 27 depicts an example of the outputs of the RMS accelerometer (RMS) and raw vibration accelerometers (RV1 and RV2) as previously described.

The wired acoustic sensor may be a 40PP CPP Free-field QC Microphone available from G.R.A.S. Sound and Vibration A/S of Holte, Denmark, by way of non-limiting example. The wired acoustic sensor may have a dynamic range upper limit of at least 135 dB. The wired acoustic sensor is a BNC electrical connector.

The benefit of the accelerometer is that it will detect any contact with the transformer and create a signal. However, using just the amplitude signal of the accelerometer may not be adequate to discern between a firearm-based impact and any other impact. This is supported by the trials, where one hammer strike was able to cause a raw vibration sensor to saturate for a similar amount of time as a typical bullet strike.

The acoustic sensor is much better at distinguishing between a firearm and other types of impacts. It is assumed that different thresholds are set for: 1) any notable event and for 2) an event caused by a gunshot. Confirming a gunshot is usually done by detecting the presence of two unique acoustic signatures of the expulsion of a supersonic bullet, shockwave and muzzle blast, as previously mentioned.

In any case, the acoustic signal from a gunshot consistently had more sound power than the other trials. Thus, an algorithm may be based on a moving average of a small number of consecutive data points thus achieving an RMS system.

The trial data shows that the acoustic signals from a hammer and a gunshot are similar with respect to maximum magnitude. Detailed algorithms can differentiate between a shockwave (0.196 s) and the initial spike in the hammer signal (0.197 s). However, simple threshold detection, using just one inequality may be used to determine the difference between a bullet and non-bullet.

The absolute maximum values for the weakest gunshot and the strongest non-gunshot are within 9%. However, with the high-magnitude nature of the bullet's impact sound (starting at 0.198 s), the firearm-based attack generates more sound power than the hammer trial. The hammer strike, meanwhile, experiences the highest magnitudes upon impact and immediately begins to attenuate.

With much consideration given to the sampling rate, an average-based threshold can be proposed as the gunshot is expected to have larger relative acoustic values, especially over time. FIG. 33 is an example of the method using the acoustic signatures of the maximum hammer impact and the minimum gunshot impact plotted in FIG. 32a. FIG. 33 was generated based the moving average of four data points collected by the PLC.

Instantly, the effect of the PLC moving average is visible, with considerably higher values for the gunshot for up to three seconds after the initial disturbance. Here, by storing and averaging just four values, a clear average-based threshold can be set to differentiate between a firearm and blunt attack. Although the graphs are not shown here, the results were similar when shifting $t_0$ from 0 to 0.05, 0.1, and 0.15 seconds, with a minimum bullet average of 69.85 Pa and a maximum hammer average of 24.94 Pa.

This differentiation could also be achieved by using an acoustic sensor that delivers an RMS voltage. Once again, an average-based threshold (including RMS) is better than a single point threshold because the algorithm receives information encompassing a longer period of time. An RMS sensor preprocesses the information, making single point detection possible.

One clear drawback of this method is the possibility that a bullet does not hit anything, so no impact sound is generated. Neither the vibration nor acoustic sensor would flag this event (unless perhaps the PLC caught the shockwave or muzzle blast perfectly) despite the importance of knowing that a shot was fired. This is a situation where an RMS acoustic sensor would have the edge as the shockwave or muzzle blast would still have an effect on what the PLC reads, as opposed to the PLC completely skipping over these events when taking isolated snapshots.

An option that can address some of the shortcomings of using only the accelerometer sensors or only the acoustic sensors would be to include one of each. While an accelerometer may not always differentiate between a firearm and a different type of impact, the combination of an accelerometer and an acoustic sensor may be used to pick up also the pressure levels and identify a bullet impact. While an acoustic sensor might capture events that are not associated with the inductive device but are nearby, cross-referencing with the accelerometer can reveal a simultaneous vibration signal received from the inductive device.

In one embodiment, additional accelerometers are utilized in order to provide each face of the inductive device with a sensor. In that same embodiment, it can be determined which side was hit, yielding an initial guess as to the inductive device components that may be damaged. The sensor to which the bullet was closest may be determined by comparing the relative magnitudes of the RMS accelerometers.

Depending on the specific magnitudes (e.g. if the largest and second-largest are close), the location could be narrowed down even more, to being somewhere near the corner between these two sensors. This method uses relative signal attenuation to determine the location of impact. It is also theoretically possible to use relative time of arrival or absolute magnitude to determine exact differences in signal propagation distances.

Sensor placement is important for the accelerometer given the effects of attenuation as a signal propagates through its host medium. An impact of a given impulse on one side of the inductive device should register the same way with the primary sensor as the signal would on any other side of the inductive device. Thus, if using a single sensor, the sensor should be placed in the center of the top face of the prism. While this is a geometric simplification, it provides the closest arrangement to symmetry for the four side walls that are perpendicular to the ground.

More overall symmetry could be obtained in the four accelerometer solution, by putting a sensor at the center of all faces. This would allow for impact side determination and signal attenuation would be minimized as the average travel distance for the vibration to the closest sensor will be reduced. It is unlikely that symmetry can be achieved between the top face and any of the other faces, but it is also expected that an impact on the top face is least likely. Alternatively, one sensor may be placed on a side face for ease of installation. This placement is possible with the accelerometer since the waves will travel around the inductive device.

The acoustic sensor may be similarly placed in a symmetry-inducing location such as the center of the top wall or cover of the tank 20. Since the axial vibration can cause unwanted noise in the acoustic sensor, it may be advantageous to physically isolate the acoustic sensor from the inductive device.

The second category solution uses multiple sensors and more complex algorithms to provide actionable information, such as the shooter direction and location, as well as bullet trajectory, speed, caliber, and number of shots. When an impact is detected in real-time, an alarm signal may be transmitted to the control station and a substation's camera may be then directed to the location of interest.

The sensors need to respond to attacks on all side walls of the inductive device, so the sensors are placed on the top wall, lid or cover of the inductive device to receive signals equally from the faces perpendicular to the ground and their corresponding directions. This arrangement may amplify strikes on the top of the inductive device, however, the arrangement provides the most symmetry, allowing for even threshold detection from the other walls of the inductive device. In this scenario, the acoustic sensor would ideally be physically isolated from the inductive device vibrations, as the vibrations can manifest as unwanted signals in the acoustic data.

Additional accelerometers may also have some benefit. The most obvious is the ability to cover every face of an inductive device with a sensor in order to symmetrize threshold-based flags. While this will allow for shot direction estimation, the use of even more accelerometers may also enable exact contact point triangulation. Contact point triangulation uses relative magnitudes and arrival times after the signal has propagated through the system. In all cases, the raw vibration sensors and/or acoustic sensors are placed on predetermined location(s) on the tank 20 or electrical equipment enclosure/housing depending on the installation as will be described further.

The acoustic- and vibration-based systems are independent, so various versions can be interchanged depending upon the installation and as is presented in table 15 below wherein V=Vibration sensor
RV=Vibration sensor
A=Acoustic sensor
PLC=Programmable Logic Controller
AI0=Analog I/O Adapter, 8 channels
DAQ=Data Acquisition Device and Logic
AI1=Analog Input Module
AI2=Analog Input Module

TABLE 15

| Sensors | Logic | Pros | Cons |
|---|---|---|---|
| | | FIRST CATEGORY SOLUTION COMPONENTS | |
| V | PLC + AI0 | Surest method of detecting impact | Hard to differentiate between firearms and other impacts; signal attenuation makes non-symmetrical comparisons difficult; installation on top of inductive device |
| A | PLC + AI0 | Likely able to distinguish between | Likelihood of false positives; |

TABLE 15-continued

| Sensors | Logic | Pros | Cons |
|---|---|---|---|
| | | firearms and other impacts; almost certain to detect impact | installation above inductive device |
| V + A | PLC + AI0 | In addition to above: eliminates false positives from A by cross-referencing with V | Installation on top of/ above inductive device |
| 4V + A | PLC + AI0 | In addition to above: likely allows for determination of which inductive device face was hit, yielding a rough shooting direction; ease of installation for vibration sensors | Acoustic sensor installation above top of inductive device |
| | | SECOND CATEGORY SOLUTION COMPONENTS | |
| V + A | DAQ + AI1 | Improved firearm detection using acoustic signatures; surest method of detecting impact; eliminates false positives from A by cross referencing with V | Installation on top of/ above inductive device |
| 4A | DAQ + AI2 | Likely prediction of azimuth and elevation; almost certain to distinguish between firearms and other impacts; almost certain to detect impact | Still potential for false positives; installation possibly above inductive device |
| V + 4A | DAQ + AI1 + AI2 | In addition to above: eliminates false positives from A by cross-referencing with V | Installation on top of/ above inductive device |
| V + 8A | DAQ + AI1 + 2AI2 | In addition to above: likely prediction of range, yielding full shooter location; higher precision azimuth and elevation; possible prediction of bullet trajectory, velocity, caliber | Installation on top of/ above inductive device |
| 12RV-16RV | DAQ + (34)Al2 | High likelihood of determining impact location, also yielding rough shooting direction; ease of installation | System likely to differentiate between firearms and other impacts |
| 16A | DAQ + 4Al2 | Very high precision estimates for azimuth, elevation, range, bullet trajectory, velocity, caliber; ease of installation for acoustic arrays; likely able to develop protection against false positives | |

It should be understood that the components of the first and second category solutions are provided by way of non-limiting example and that the inventors contemplate other combinations and components that may be used in the systems for detecting impact to inductive devices and other electrical equipment. Further, each row in Table 15 indicates a separate solution for the first and second categories and benefits and drawbacks of each solution. By way of non-limiting example, the DAQ may be a cDAQ-9132 (Compact DAQ) data acquisition chassis and logic, available from National Instruments Corporation of Austin, TX.

The DAQ chassis and controllers control the timing, synchronization, and data transfer between multiple I/O modules and an external or integrated computer. A single DAQ chassis or controller can manage multiple timing engines to run several separate hardware-timed I/O tasks at different sample rates in the same system. The software required for any PC-based DAQ system consists of a hardware driver and a development environment. Hardware drivers provide communication between the PC and the DAQ device, allowing software control of the hardware. The driver contains a built-in set of rules called an application programming interface (API) that provides the ability to control the hardware from within a programming environment. From the programming environment, the data can be presented and logged, in addition to the generation of tests, alarms and output waveforms using the data.

An increased sampling rate may be used to gather more granular acoustic data. A tetrahedral array of sensors using three sensors may be provided and then multiplied for improved accuracy (two arrays having a total of six sensors or three arrays having a total of nine sensors). Still other distributed wireless sensor networks may have nodes wherein each sensor is a node or a sensor array.

As previously described, there is an acoustic signal from the shockwave, the impact sound, the muzzle blast, and any reflections. The shockwave and muzzle blast are unique to firearm usage, so the presence of either guarantees a gun has been used. However, both of these signals can be obstructed by physical objects in between the detach point and the sensor. Possible obstruction is dependent on both individual substation layouts as well as placement of the sensor.

It is almost certain that the sensor will capture impact noise. However, unlike the shockwave, muzzle blast and impact shown in FIGS. 21 and 22, this noise is not guaranteed to have a specific waveform. For example, there may not be an obvious difference between a gunshot where only the impact sound is captured and fireworks or a backfiring car. Furthermore, the same issue arises when comparing the former to a gunshot that ricochets off a structural support near the inductive device but causes no actual damage. However, this may still be important to report.

Figure 32B:
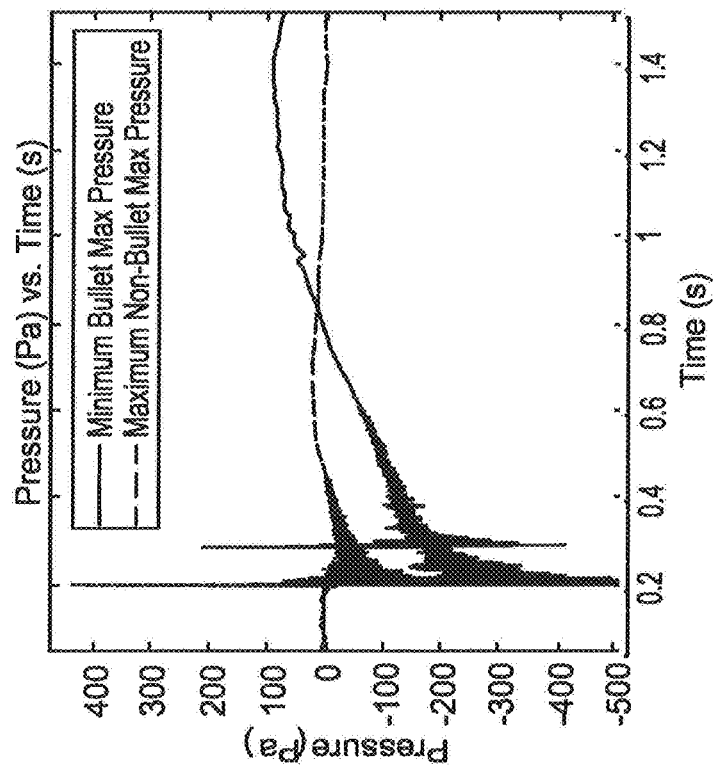
FIG. 32b is a plot of sound pressure versus time for bullet versus non-bullet impacts to the transformer tank.
Figure 32A:
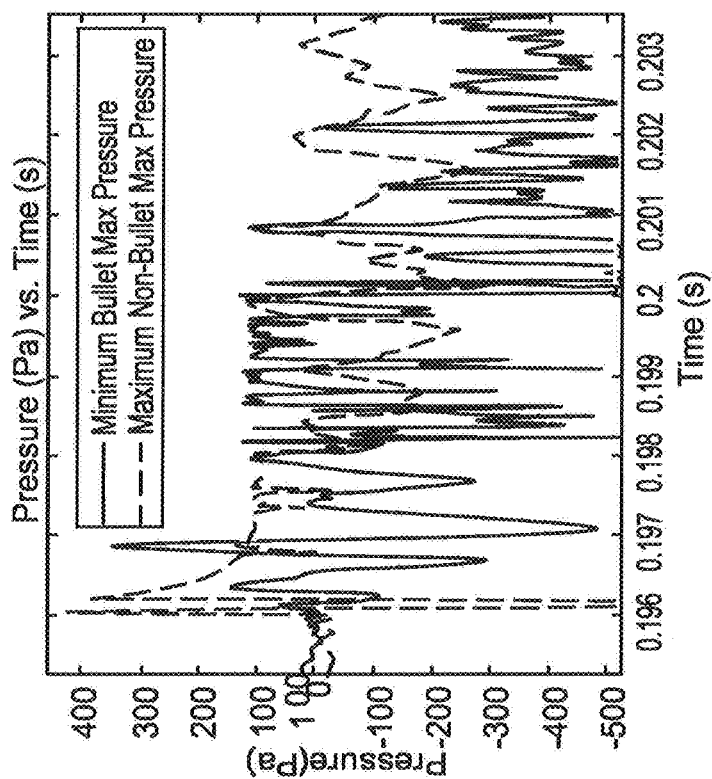
FIG. 32a is a zoomed in plot of the FIG. 32b sound pressure versus time for bullet versus non-bullet impacts to the transformer tank.
Figure 33:
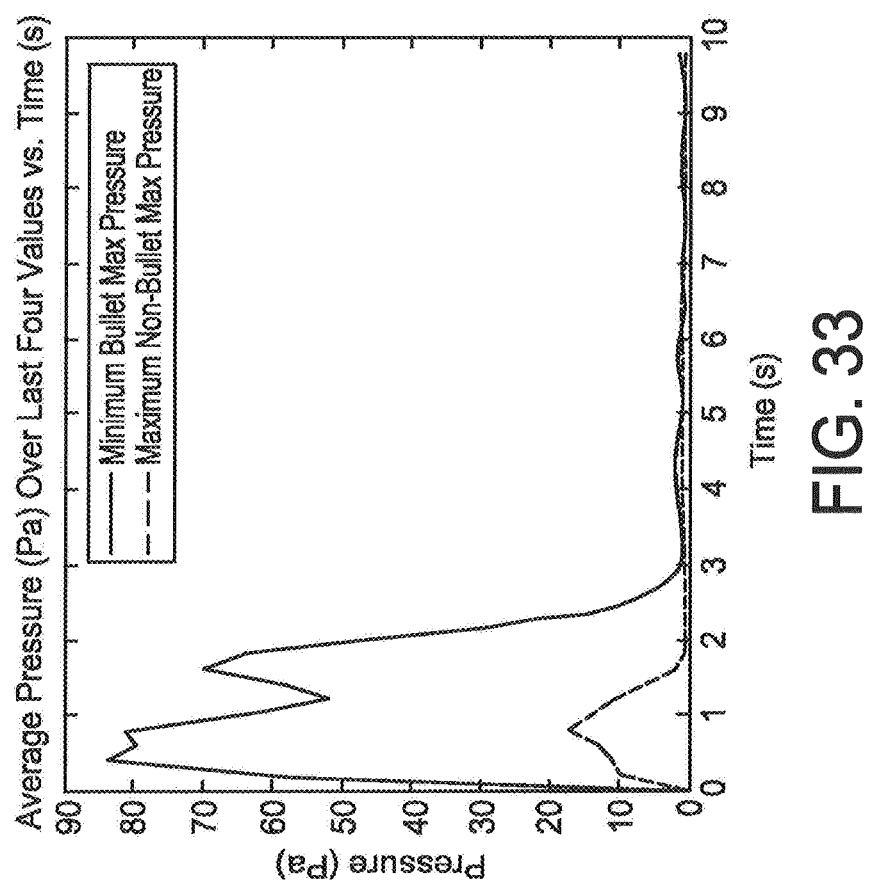
FIG. 33 is a plot of average pressure over the last four measured values versus time for an average ballistic trial (such as trial 4)

With reference now to FIG. 32a, a simple absolute value threshold check of values above 400 Pa would be triggered by both the shockwave and the muzzle blast. The threshold may be raised to exclude non-bullet signals. Alternatively, the largest difference between two adjacent data points can distinguish the bullet signal from the non-bullet signal. For example, the largest change in pressure for adjacent data points for the bullet is 900 Pa (from the last saturated point at the bottom of the shockwave to the top of the second peak), while the largest single-point jump for the hammer is only 120 Pa, on the downslope of the path from the maximum to minimum values for the signal.

The bullet signal trends have large spikes in the chart of resulting impact sound such as is shown in FIG. 32a. The spikes in the charts are on the order of 500 Pa in the trial of FIG. 32a. However, in other trials the bullet signal trends progress from saturated on one end to saturated on the other end. This is a 1 kPa spike and is typically larger than the jumps seen in the shockwaves for those specific trials. Thus, whether it comes from the shockwave or an intense impact sound, any jump near 1 kPa should lead to a conclusion of "firearm impact." The hammer signal, conversely, noticeably attenuates after the initial strike, so the largest deltas of the hammer signal are contained in the initial strike at 0.197 seconds.

Figure 34:
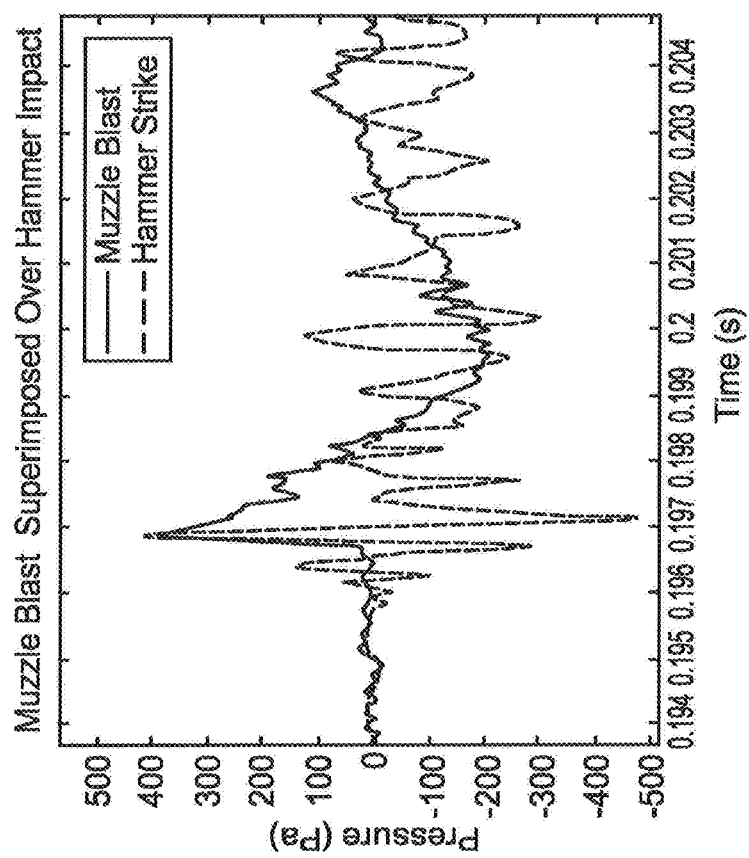
FIG. 34 shows the muzzle blast superimposed over the hammer impact for an average ballistic trial versus the second hammer trial.

With reference now to FIG. 34, the acoustic data may be used to identify a muzzle blast because of the typical duration of this signal, which is approximately 2-3 milliseconds (ms). The muzzle blast signal, however, is often peppered with noise from the impact sound, so it is much less smooth and much more difficult to isolate. One method to overcome this is to look at the 200 data points (4 ms) after a threshold pressure is reached, and find the maximum and minimum locations in that vector.

If the data points are more than 2 milliseconds apart, it is likely that a muzzle blast occurred. This method is robust for discerning the gunshot from the hammer trial signal due to attenuation, but could also be triggered by the impact noise. The system may have a slope limit to protect against an inaccuracy in detection and distinguish between the muzzle blast and impact sound which disqualifies the signal from being a muzzle blast if any two points have a difference of more than a certain pressure.

Further, the relative arrival times of a gunshot signal from a single sensor may be utilized unless more information is known about the event. However, using multiple sensors and cross-correlation can determine gunshot signal times of arrival (TOAs).

Figure 35:
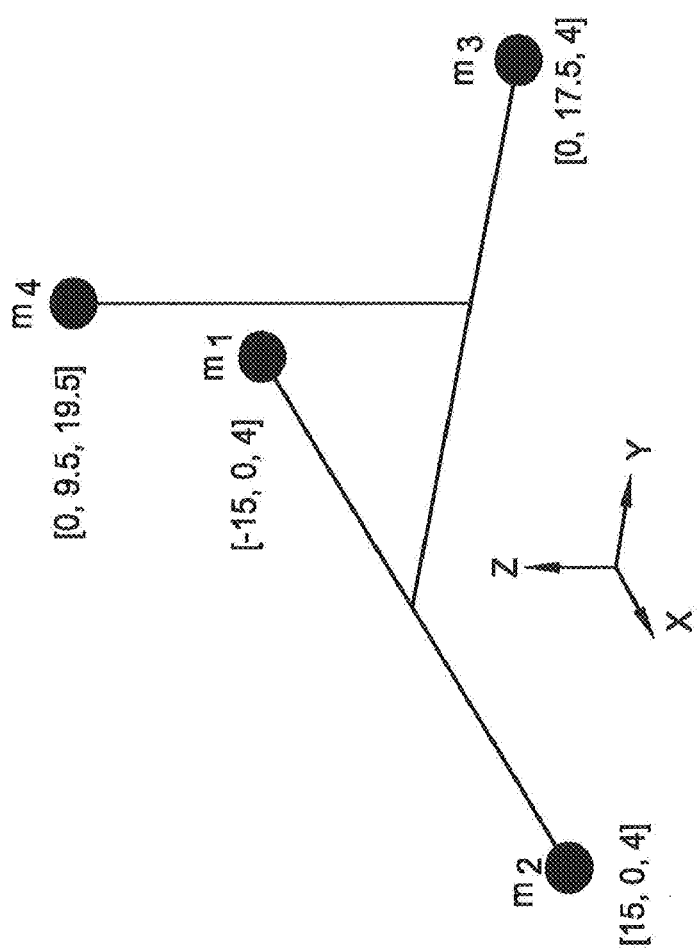
FIG. 35 shows a tetrahedral array that may be used to generate multiple gunshot time of arrival measurements.

With reference now to FIG. 35, a tetrahedral array may be used to generate multiple TOA measurements. Depending on what information reaches each individual sensor, the relative measurements allow for the calculation of the shooter azimuth and elevation angles. The magnitudes (cm) in FIG. 35 are provided to indicate scale.

Typically cross-correlation methods are used to generate TOA measurements from data. In the simulated scenario that follows, the TOA measurements are the differences in TOA among the four sensors from the muzzle blast, which travels directly from the shooter location to the sensors at the speed of sound.

The muzzle blast TOAs may be converted into differences in travel distance to each sensor. Then, a three-dimensional grid may be created with a direction taken as a parameter to narrow the search. If the user or computer does not have any indication of the direction, [0 0 0] can be taken. This generates a 10×10×10 m box encompassing the origin, wherein each point is compared to the calculated relative distances. These comparisons yield scores for each point based on the differences. Lower scores indicate a better result.

Figure 36:
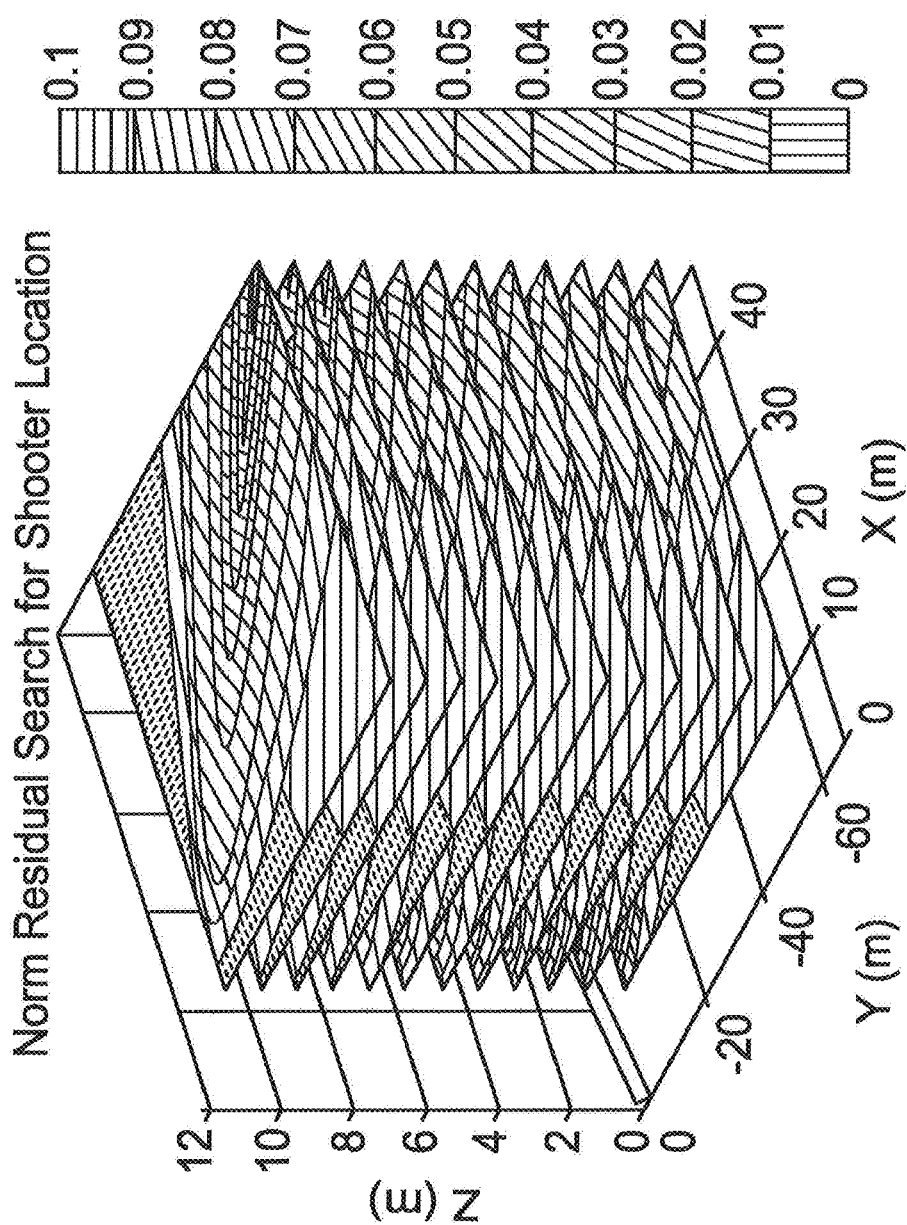
FIG. 36 shows the results of a method for residual search for the origin of a projectile.

After iterating through the existing box, the code checks the scores against a tolerance level. If any score is below the tolerance, the successful point is returned as the shooter location. If not, the lowest score is then used to generate the next search direction, and the function is called again. This time a new search box will be generated based on the direction, and the process repeats until a successful point is found. By way of non-limiting example, the scores are plotted on a 3D graph, with an arrow leading from the origin to the shooter location. An example of a graph plotted using this method is shown in FIG. 36 and in which the theoretical shooter location was determined to be [48 −67 12]. A person having ordinary skill in the art will appreciate that practical aspects such as measurement errors may be integrated into the algorithm The initial search direction can be determined with just a slight modification to the array. First, instead of a regular tetrahedron, the sensors may be arranged as a rectangular tetrahedron as shown in FIG. 37.

The azimuth and elevation angles may be calculated in one equation each and in which $\Delta T_{XY}$ is the time of arrival difference between sensors X and Y. The azimuth angle is calculated from the equation:

$$\theta = \tan^{-1}(\Delta T_{02}/\Delta T_{01})$$

The elevation angle is calculated from the equation:

$$\varphi = |\tan^{-1}(\Delta T_{03}/\sqrt{(\Delta T_{01})^2 + (\Delta T_{02})^2})|$$

These equations are based on projections onto the X-Y and Z-θ planes and make small mathematical approximations. Brute force comparisons have demonstrated very small differences between the actual directions and the directions from these equations.

Improvements to the tetrahedral set-up may be considered to account for practical aspects such as measurement errors. The closer together the sensors are, the more likely they are to be poorly discretized and lose information by being clumped into the same time sample. If the sensors are farther away, the algorithm gets a more accurate reading of the TOAs, especially when the direction of the sound is near parallel to the vector between the two microphones in question.

Conversely, the rectangular tetrahedral system should not exceed a maximum distance of 0.39 meters between the sensors. This upper limit is likely due to the geometric approximations made, which lose validity as the sensors move farther apart. One way to increase the distance between sensors without losing the simplicity of the above equations is to add a second array. Then, the equations can still be used locally while TOA values can be cross-referenced against the distance between the arrays.

Shockwave detection with a sensor array only yields an uncertain azimuth prediction. However, in conjunction with muzzle blast detection, this information can yield azimuth, elevation, and distance.

The benefits of using four acoustic sensors are plentiful. By having two sets of azimuth and elevation angles, the system can find the crossing point and identify the absolute location of the shooter using just muzzle blast detection. Meanwhile, the shockwave information becomes much more relevant, even by itself. If the bullet passes between the two arrays, the system can determine azimuth, elevation, distance, bullet trajectory, and bullet speed.

Together, the shockwave and muzzle blast data increases the accuracy of the prediction of all of these values as described in FIG. 38. The jump from two arrays to three arrays yields improved accuracy. Likewise, any increase above that does the same. Regardless, as these arrays spread out and increase in number, the localization will continue to improve.

For any acoustic sensor (or array), the line-of-sight to the muzzle blast and shockwave is essential. This immediately eliminates putting the sensor or array on any inductive device face perpendicular to the ground, as these pressure waves will not propagate through the transformer and will simply be reflected. Thus, the solution is to place the sensor or array above the inductive device. However, further geometric considerations need to be made. For example, if the lowest sensor only has a two inch clearance above the top of the inductive device, both the muzzle blast and shockwave would have to arrive at extremely shallow angles to actually reach it, limiting short range detection.

While the muzzle blast will always launch from the location of the shot, it is a spherical wave so a signal will be sent in the direction from the gun to the sensor regardless. It should be noted that this signal is typically much weaker away from the line of fire, however, that direction is less relevant. Meanwhile, the shockwave will always deploy at roughly the same angle relative to the line of fire. This means that the shockwave detach point for the part of the shockwave that is directed at the sensor will occur farther away from the tank, allowing the signal to gain the height necessary to clear the obstacle.

Furthermore, consideration needs to be made for the location of multiple sensors or sensor arrays. If a second sensor is added, the most obvious response would be to place the two sensors above opposite corners of the top face for the same reasons as above. However, another choice could be to place the sensors on the ground on opposite corners of the inductive device so that each sensor (array) services two side walls of the tank. This would allow for better shockwave and muzzle blast detection, but would almost guarantee that only one sensor (array) would receive the signals.

Lastly, if four arrays are used, it is recommended that they be placed on the ground at the four corners of the inductive device. Now, every face has two arrays servicing it, meaning all information can be obtained regardless of the face that is struck. This also guarantees the bullet will pass between two arrays.

If four individual sensors are used, they are effectively serving as a tetrahedral array with whatever geometry they are given. It is best to follow the placement ideas for a single array, while weighing the benefits of having the sensors spread farther apart.

A next level of complexity for an accelerometer-based system is to have shot location triangulation based on when the impact arrives at different sensors. This is based on the fact that vibrations from the impact will propagate evenly in all directions. For the simplest case, it may be assumed that the electrical equipment enclosure or housing is made of a uniform material with no geometric irregularities.

First, the time delay between every pair of sensors is determined. While this phase delay calculation can be done with cross-correlation, it is simpler to do with threshold detection. This might suggest the use of the RMS sensor, but precision time data cannot be lost and the irregularity of these waveforms will be better seen by the cross-correlation using a raw vibration sensor.

Figure 40:
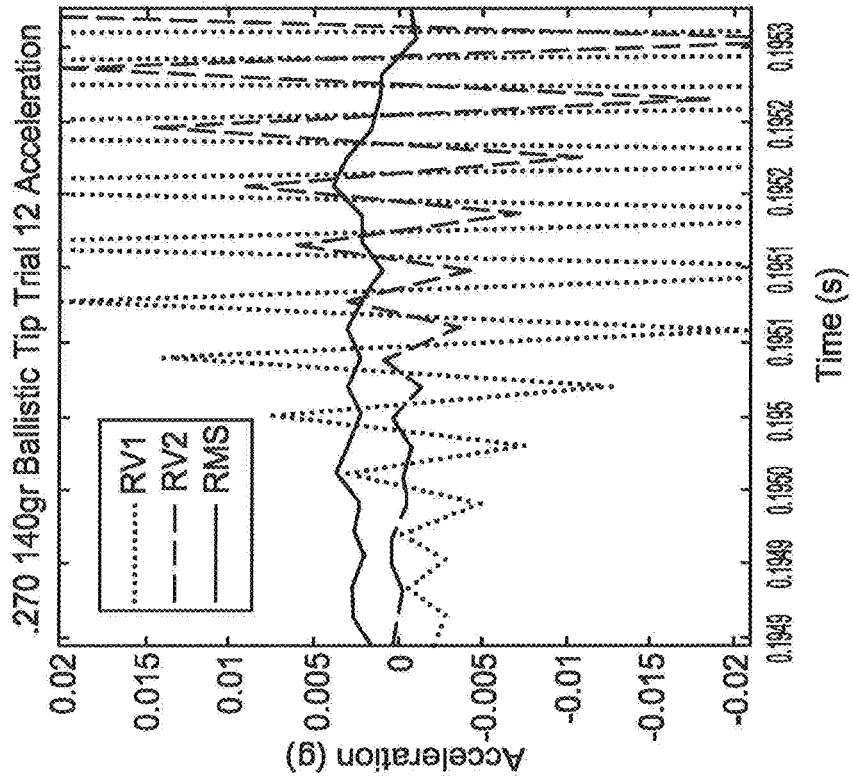
FIG. 40 is a plot of acceleration versus time for the bullet impact of trial 12 as measured by the raw vibration and RMS sensors.
Figure 39:
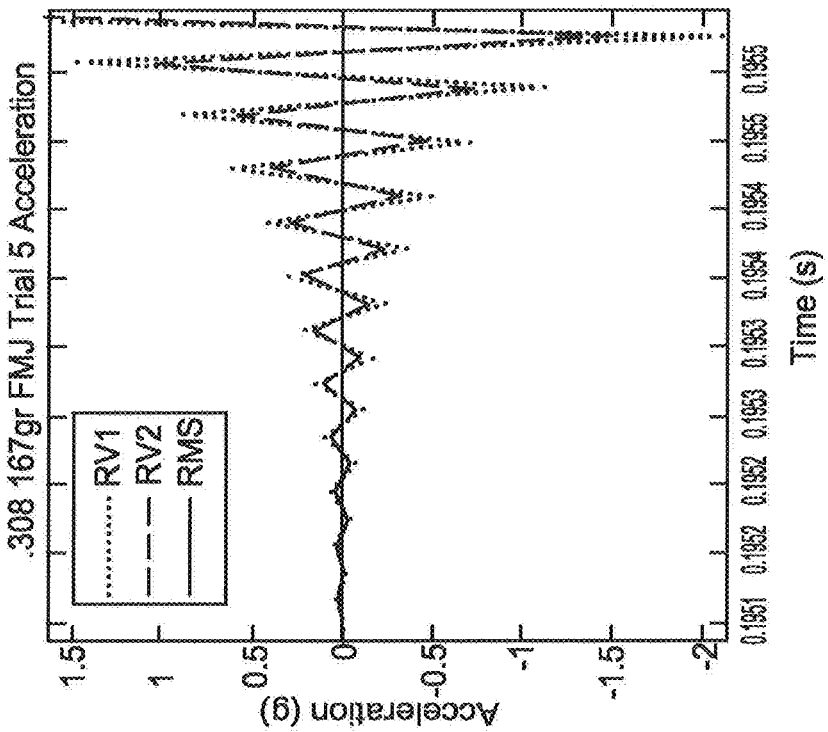
FIG. 39 is a plot of acceleration versus time for the bullet impact of trial 5 as measured by the raw vibration and RMS sensors.

By way of example and with reference to FIGS. 39 and 40, trials 5 and 12 may be analyzed on a threshold of 0.01 g. For Trial 5, the signal reached both sensors at the same time (or exactly one cycle behind, as this is what the threshold check yielded). The results suggest that the impact location was equidistant from the location of the two sensors. For Trial 12, the threshold is reached eight data points later for RV2 than RV1. This is a time delay of 156 μs, suggesting that the signal had to travel a longer distance to reach RV2 by an amount proportional to that delay.

The time delay can be converted to a distance difference by considering the speed of sound in the material of the electrical equipment. For example, the speed of sound in steel is 4512 m/s, meaning that a time delay of 156 μs corresponds to a distance difference of 0.70 m. The algorithm then generates a test grid of every point on the inductive device. As it iterates through each point, it calculates the distance to each sensor, and then the difference between the two distances. If that difference is within a certain tolerance of the calculated difference, the point is saved as the computer continues to iterate.

Figure 42:
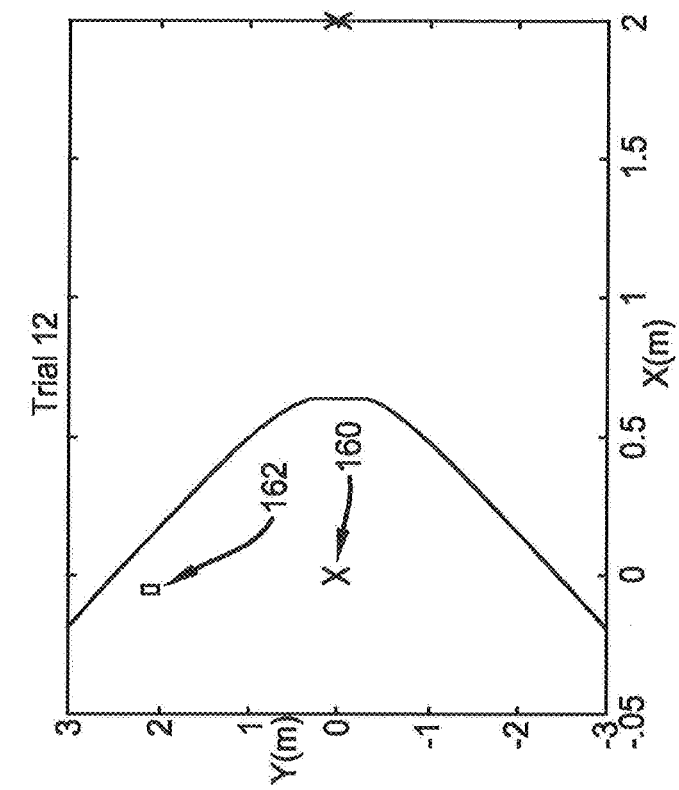
FIG. 42 is a plot of shot impact localization for projectile trial 12.
Figure 41:
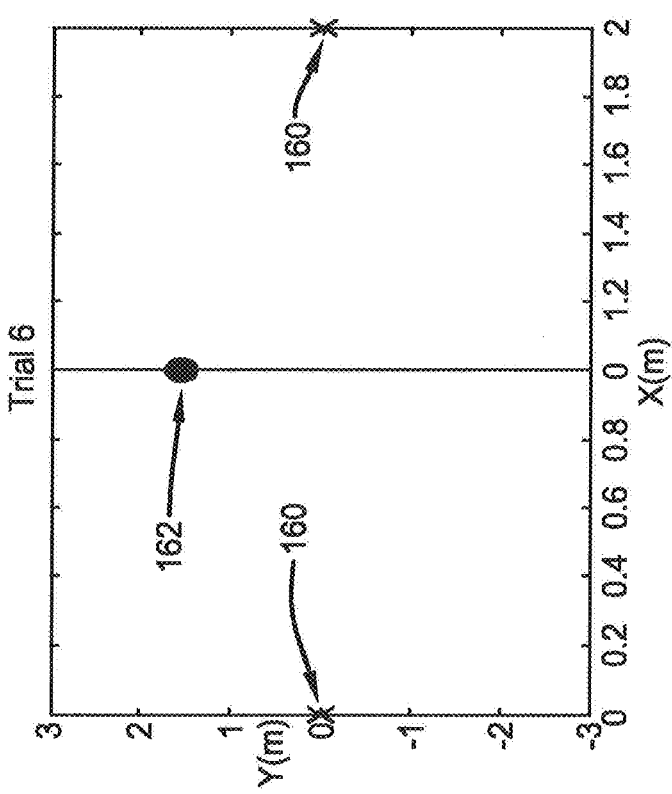
FIG. 41 is a plot of shot impact localization for projectile trial 6.

With only two sensors, the best precision achieved is a conic section instead of just a single point. The results from trials 5 and 12 are depicted in FIGS. 41 and 42. The X's in FIGS. 41 and 42 represent the sensor locations 160 and the O and square representing the actual shot origin locations 162 (based on estimation from pictures). In this particular implementation, the grid was created symmetrically around the sensors, instead of taking the geometry of the tank into account.

As expected, a time delay of 0 ms from Trial 5 corresponds to a straight line bisecting the two sensors (theoretically this is a conic section with infinite eccentricity). Meanwhile, Trial 12 has a much more defined curve, demonstrating all of the points that are 0.70 m closer to RV1 than RV2. The curve does approach the (approximated) impact location, although ultimately a specific point cannot be suggested. This would be solved by having a third RV sensor, which would yield two more conic sections. The intersection of these three curves would represent the point of impact. Theoretically this could still yield two possible points; however, given the known geometry of the inductive device, one would likely be easily eliminated. A fourth sensor could also be introduced to narrow down the region of uncertainty.

Referring now to FIG. 50, a table listing dry film thickness parameters for a multi-layered coating system according to another embodiment of the present disclosure is illustrated. The multi-layered coating includes a primer layer, a mid coat layer and a top coat layer. Each of the layers may include one or more component constituents mixed together before or during application. The term "layer" can include methods of formation whereby one pass or multiple passes of material additive techniques are used to build each layer to a desired thickness. When the term "about" is used with respect to range thicknesses, the range can include a reasonable distance outside of the defined range or alternatively can be limited to the number or numbers recited in the claims. The multi-layered coating system includes polyurea for use as an anti-corrosive and a high mechanical strength coating on housings exposed to corrosive compounds and high mechanical impacts in harsh environments. The multi-layered coating system described herein provides both the required mechanical strength and resistance to environmental factors to provide service in harsh environments. In one exemplary form of the coating system, commercial coatings having the properties required herein may be employed. For example, zinc rich primers may be used with a polyurea coating (LINE-X XS350) and a UV top-coat (LINE-X Ultra) in some embodiments.

The first layer or primer coating layer of the multi-layered coating system can be applied at a thickness that ranges from about 0.1 mils to 10 mils (mils=0.001 inch). In some forms the primer coat layer can range up to 60 mils. A preferred range of thickness for the primer layer is about 0.5 mils to 6 mils. The primer coat layer can be applied directly to an external wall of a housing, such as by way of example and not limitation, the tank 20 illustrated in FIG. 1.

The primer coating can include a zinc rich composition, an epoxy composition or a urethane composition so as to provide anti-corrosion protection to an exemplary housing. Exemplary commercial coatings can include Strathmore 4010 (Zinc rich primer), Cloverdale EF75006 (Epoxy primer) or LINE-X FCP, LINE-X XPM (Urethane primer). In one exemplary form, the primer coating includes a chemical composition defined by about 10 to 30 weight percent of Titanium Dioxide, about 1 to 5 weight percent of Magnesium Silicate (TALC), about 5 to 10 weight percent of Zinc Phosphate, about 1 to 5 weight percent of Xylene and mixed Isomers, about 1 to 5 weight percent of Toluene; about 1 to 5 weight percent of Methyl Amyl Ketone, about 1 to 5 weight percent of Methyl Isobutyl Ketone, about 5 to 10 weight percent of Methyl Ethyl Ketone, about 5 to 10 weight percent of N-Butyl Acetate, and about 1 to 5 weight percent of Ethylbenzene.

The mid coat layer may optionally be applied over the primer coat in the multi-layer coating system. The mid coat layer can be applied at a thickness that is greater than about 1 mil, and in a preferred form, the thickness is greater than about 5 mils. A maximum layer thickness of the mid coat is approximately 750 mils (0.75 inch). The mid coat is configured to provide mechanical support with anti-leakage properties to a wall of the housing. In one exemplary form, the mid coat layer includes a chemical composition defined by a first portion that is less than 45 weight percent of Diphenylmethane-4, 4'-diisocyanate (MDI) and less than 5 weight percent of Methylenediphenyl diisocyanate and a second portion defined by about 50 to 75 weight percent of alpha-(2-Aminomethylethyl)-omega-(2-aminomethylethoxy)-poly) oxy(methyl-1,2-ethanediyl)) and about 20.0 to about 25 weight percent of diethylmethylbenzenediamine.

The top coat layer may be applied over the mid coat layer in some embodiments of the multi-layer coating system. The top coat layer can be applied at a thickness that ranges from about 0.1 mils to 10 mils, and in a preferred form the thickness can range from about 0.5 mils to 8 mils. In some forms the top coat layer can range up to 60 mils. The top coat may include properties that can provide Ultraviolet light (UV) resistance to protect the underlying coating layers from certain forms of degradation. In one exemplary form, the top coat layer includes a chemical composition defined by about 25 to 50 weight percent of Barium Sulfate, about 10 to 25 weight percent of Siloxanes and Silicones, DI-ME, Methoxy PH, and Polymer; about 10 to 25 weight percent of 1, 6-Hexanediol diacrylate, about 10 to 25 weight percent of Acrylated Urethane Oligomer; about 1 to 10 weight percent of Isopropyl Alcohol, about 1 to 10 weight percent of Titanium Dioxide, about 1 to 10 weight percent of Xylenes (o-, m-, p-isomers) and about 1 to 10 weight percent of Propylene Glycol Monomethyl Ether Acetate.

Figure 51:
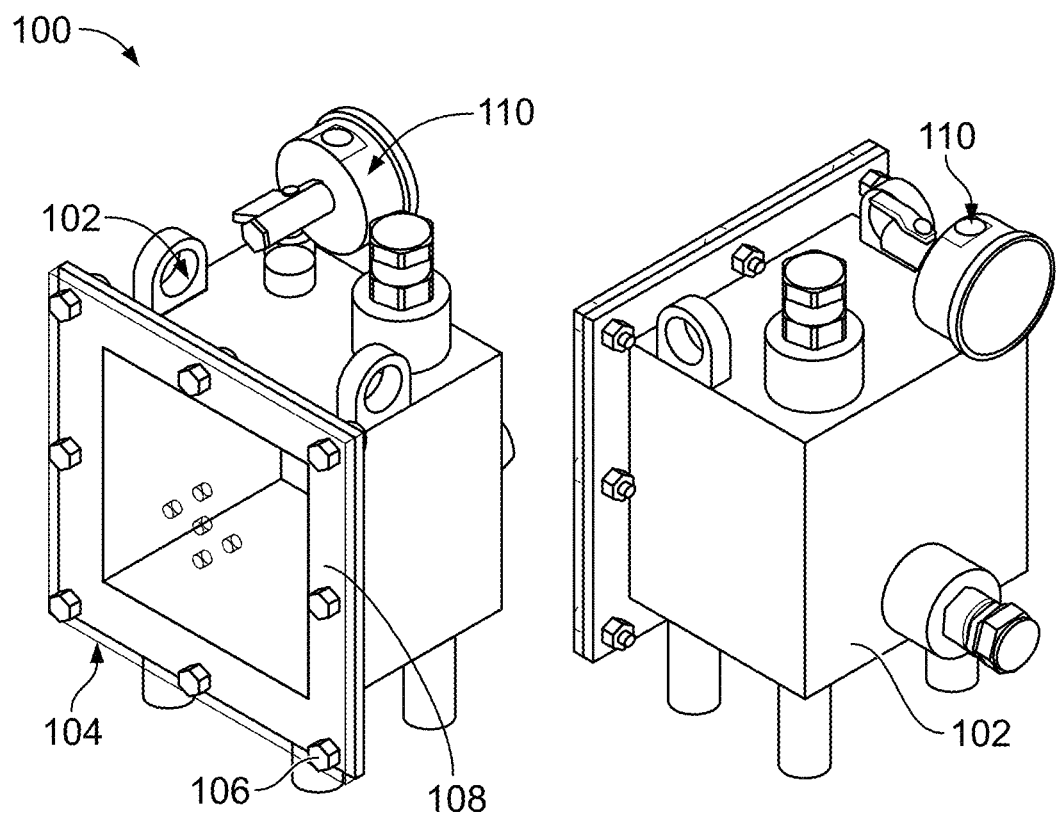
FIG. 51 are perspective views of a test apparatus according to one embodiment of the present disclosure.

Referring now to FIG. 51, perspective views of a test apparatus 100 for testing the effectiveness of the multilayer coating system in some simulated environments is illustrated therein. The test apparatus 100 includes tank 102 capable of holding a fluid internal thereto. A test plate 104 having the multi-layered coating applied thereto can be fastened to the tank 102 through bolt fastening means 106 in some embodiments. A gasket 108 can be positioned between the test plate 104 and the housing 102 to ensure a fluid tight seal therebetween. A pressure gauge 110 can be connected to the housing 102 to provide means for measuring internal pressure of the tank.

Figure 52:
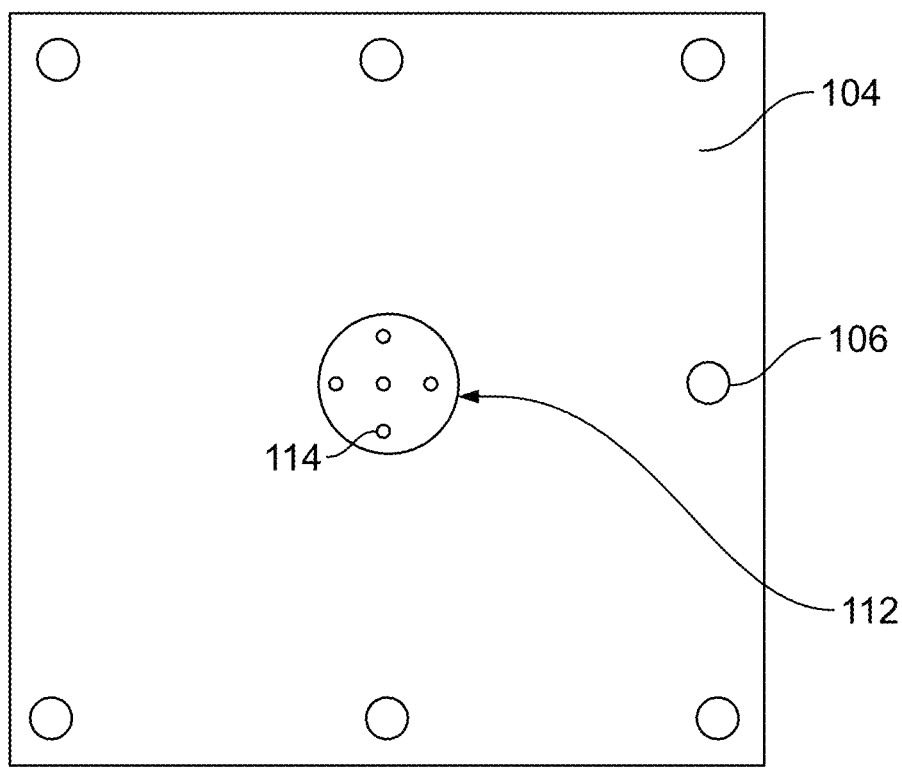
FIG. 52 is a view of a plate having a plurality of holes formed through the coating defined by the present disclosure.

Referring now to FIG. 52, an enlarged front view of the plate 104 is shown. The plate can be formed from a metal material or other materials that a fluid holding tank as described previously could be made from. A portion 112 of the plate 104 is coated with the multi-layered coating proximate the center thereof. One or more holes 114 are then formed through the coated portion 112 to test the capability of the multi-layered coating in resisting fluid loss through the holes.

Figure 53:
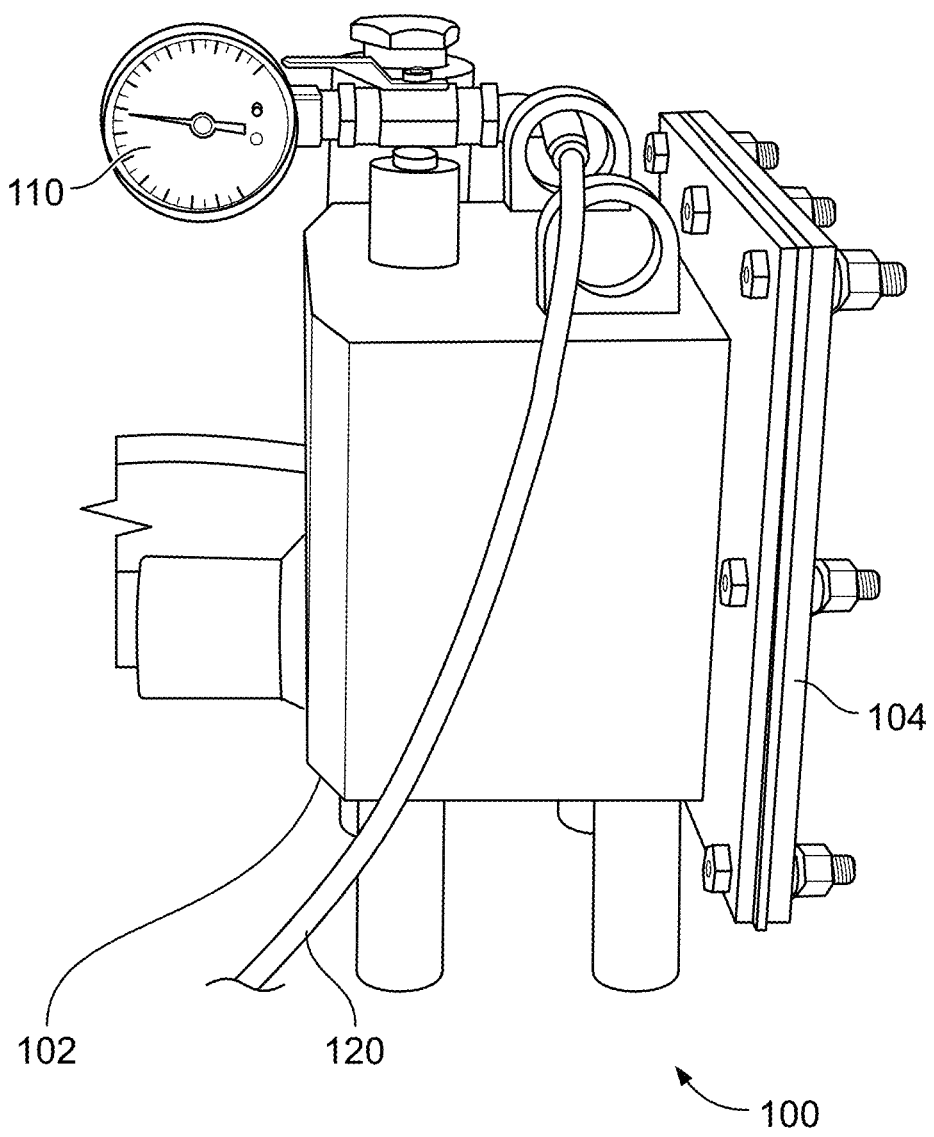
FIG. 53 is a perspective view of a test apparatus of FIG. 51 with the plate of FIG. 52 attached thereto.

Referring now to FIG. 53, the test apparatus 100 is shown with a pressurized fluid hose 120 operable for providing pressurized fluid into the housing 102. The pressure gauge 110 can be used to determine the rate of leakage through the holes 114 formed the plate 104. Experiments were run with various sizes and numbers of holes to determine the effectiveness of the multi-layer coating system. The results of the experiments showed that the multi-layer coating is effective in protecting the housing in a suitable manner. Some of the experimental results are described below.

The multi-layered coating system can be applied to steel substrates of various grades (mild, stainless, galvanized, and abrasion resistant) of thicknesses ranging from about 0.2 mm to 38.1 mm (1.5 inches) or greater. In some forms, the top coat may be omitted from the multi layered coating system.

One test standard for mechanical strength and anti-corrosion defines the highest rating attainable for testing coating effectiveness on transformers as C5I under International Standard ISO 12944. Passing the C5I standard qualifies use in the most extreme marine and industrial environments. The multi layered coating system was evaluated using different average layer thicknesses and passed evaluation criteria for mechanical strength and anticorrosion to qualify for the highest rating C5I.

Test plates with different hole configurations and sizes were tested to check for leak containment capabilities of the multi-layered coating. The process for testing leak resistance included installing one of the test plates 104 on the flanged face of the test apparatus 100. The apparatus 100 was then filled with mineral oil and pressurized. In one example, the apparatus 100 maintained pressure at 15 psig for 50 (fifty) hours with a test plate having 5 holes, each hole being 4 mm in diameter. In another example the apparatus 100 with the same plate maintained pressure at 10 psig for 78 days. During some of the testing procedures, the apparatus 100 was also placed outdoors to allow pressure increases and decreases resulting from changes in the ambient temperature.

Figure 54:
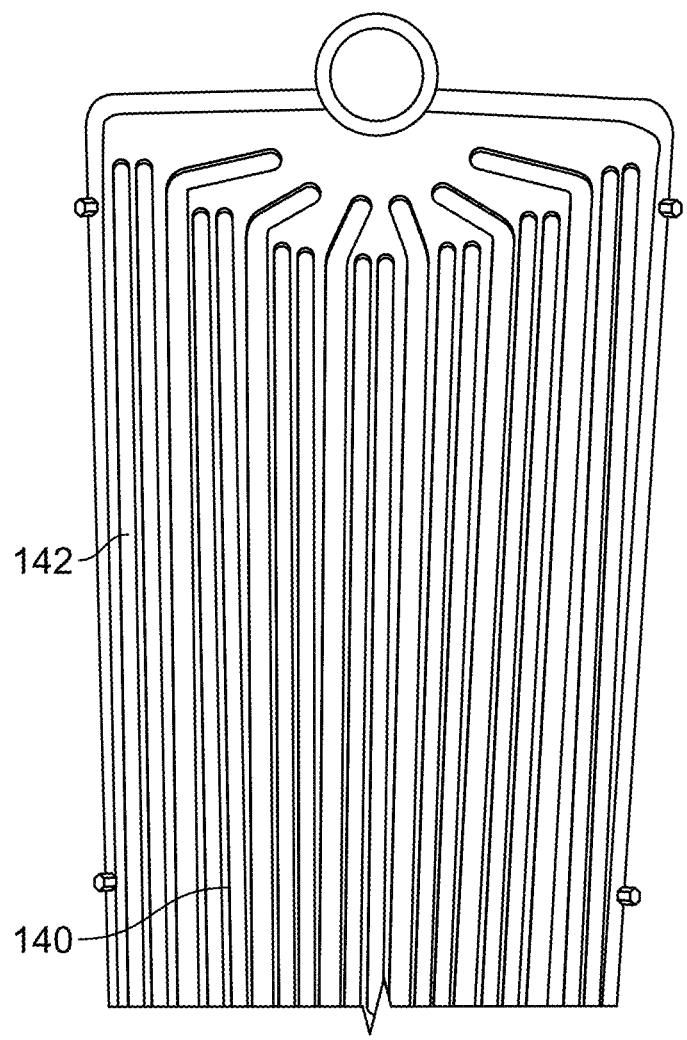
FIG. 54 is a front view of a portion of a radiator for a heat exchanger according to one embodiment of the present disclosure.

Referring now to FIG. 54, the multi-layered coating system can be applied to other fluid holding components such as a radiator 140 or the like. Plate type panel radiators are traditionally made using thin sheets of mild steel (1 mm thick) which are welded in pairs and pressed to form channels for oil flow. Because of the exposure and sharpness of the edges of the radiator panels, they are highly susceptible to mechanical damage and once a protective coating is breached, the steel substrate can be readily corroded by environmental agents. The multi-layered coating system can be applied to the edges 142 of the radiator 140 to protect the radiator 140 from handling or operation damage. In addition, the multi-layered coating can fill certain imperfections that may exist in welded joints along the edges of the panels and limit the likelihood of future leaks. It should be understood that the radiator device 140 shown in FIG. 54 is for illustrative purposes only and does not limit the types of apparatuses that the coating system as described herein can be used to protect. For example any type of housing, or portions of a housing such as doors, coverings, or any other feature associated therewith may be coated with the multi-layer coating.

Figure 55:
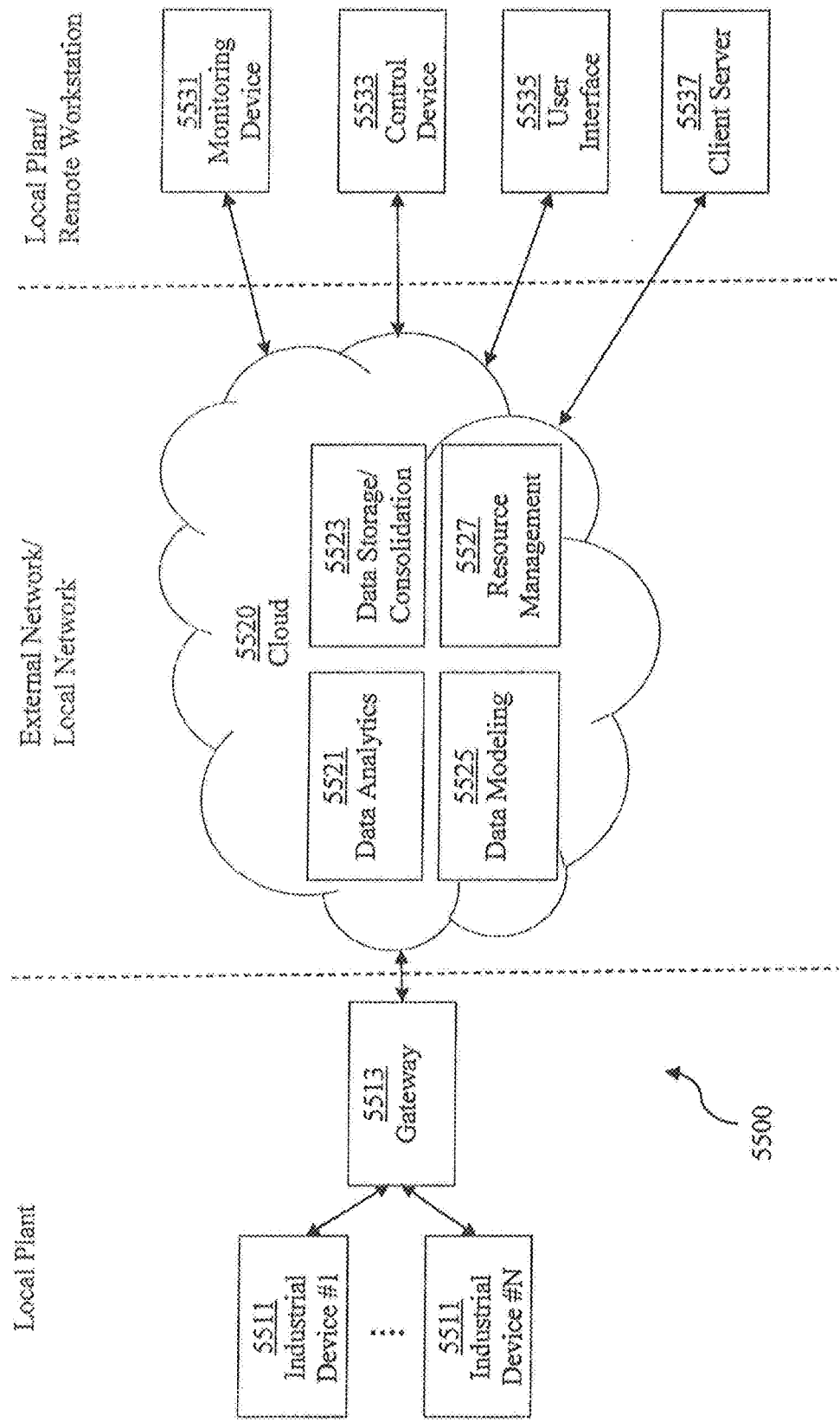
FIG. 55 is a schematic view of an exemplary communication system.

Referring now to FIG. 55, there is illustrated an exemplary device communication system 5500 including a plurality of local and/or remote devices structured to collect and analyze data observed at a local plant for control or monitoring purposes. Devices of system 5500 may communicate with other devices of system 5500 using wired or wireless communication channels. For example, the devices may include one or more of a network adapter, network card, interface, or a port (e.g., a USB port, serial port, parallel port, an analog port, a digital port, VGA, DVI, HDMI, FireWire, CAT 5, or any other type of port or interface). The communication channels may use a communication medium such as Wi-Fi, Bluetooth, BLE, Zigbee, RF, Ethernet/IP, TCP/IP, and microwave to name a few examples. In the illustrated embodiment, the communication channels are bidirectional. In other embodiments, some of the communication channels may be unidirectional.

System 5500 includes one or more industrial devices 5511 and a communication gateway 5513 located at a local plant. Industrial devices are structured to collect data and transmit the collected data to the gateway. For example, an industrial device may include a sensor structured to observe a physical characteristic of the industrial device or an operating environment.

Gateway 5513 is structured to receive the collected data from industrial devices 5511 and transmit the data to a cloud computing system 5520. In certain embodiments, gateway 5513 is structured to perform analysis or consolidation using the received data, then transmit the results of the analysis or consolidation to system 5520. Gateway 5513 may receive instructions from system 5520 to perform analysis or consolidation from system 5520.

Cloud computing system 5520 includes computing devices with a processing device and memory structured to receive the collected data from gateway 5513. System 5520 may be connected to gateway 5513 by way of a local network or an external, internet based network. The processing device can be of a programmable type, a dedicated, hardwired state machine, or a combination of these; and can further include multiple processors, Arithmetic-Logic Units (ALUs), Central Processing Units (CPUs), Digital Signal Processors (DSPs) or the like. For forms of the processing device with multiple processing units, distributed, pipelined, and/or parallel processing can be utilized as appropriate. The processing device may be dedicated to performance of just the operations described herein or may be utilized in one or more additional applications. In the depicted form, the processing device is of a programmable variety that executes algorithms and processes data in accordance with the operating logic as defined by programming instructions (such as software or firmware) stored in the memory. Alternatively or additionally, the operating logic for processing device is at least partially defined by hardwired logic or other hardware. The processing device can be comprised of one or more components of any type suitable to process the received signals and provide desired output signals. Such components may include digital circuitry, analog circuitry, or a combination of both. The memory may be of one or more types, such as a solid-state variety, electromagnetic variety, optical variety, to name but a few examples. Furthermore, the memory can be volatile, nonvolatile, or a combination of these types, and some or all of memory can be of a portable variety, such as a disk, tape, memory stick, cartridge, to name a few examples.

The illustrated system 5520 includes a plurality of modules which includes instructions stored on a non-transitory computer readable medium executable by the processing device. In other embodiments, system 5520 may include more or fewer modules. The illustrated modules include a data analytics module 5521 configured to analyze and/or summarize the collected data; a data storage and consolidation module 5523 configured to reduce the amount of memory required to store the collected data; and a data modeling module 5525 configured to convert the collected data to a system model. The plurality of modules may receive collected data in real time and perform certain functions in real time. System 5520 also includes a resource management module 5527 configured to divide the instructions to be executed between the processing device of system 5520 and gateway 5513.

Results from modules 5521, 5523, and 5525 are transmitted to devices located at the local plant or a remote workstation. In the illustrated embodiment, the devices include a monitoring device 5531 structured to monitor the operating conditions of industrial devices 5511, a control device 5533 structured to control industrial devices 5511 or other devices, a user interface 5535 configured to output the module results to a user, and a client server 5537 structured to receive and store the results from the modules.

The communication system 5500 can be operably coupled to one or more data sensors associated with an apparatus. The sensors are operable for determining a condition of a portion of the apparatus. In one form the sensors are smart sensors operable for collecting vibration, sound, pressure and/or temperature data and transmitting to a remote receiver. The sensed data is transmitted to a remote location via the communication system 5500, analyzed for optimizing performance and determining predictive maintenance. Data transmission means can includes dedicated signal lines, Wi-Fi signals, radio frequency signals, microwave signals and/or Bluetooth signals in communication with the World Wide Web.

In one aspect the present disclosure includes an apparatus including a housing configured to contain a fluid; a multi-layer coating applied to the housing; wherein the multi-layer coating includes: a layer of a primer coating; a layer of a mid coating including mechanical and chemical properties capable of at least partially closing a hole in the housing; and a layer of a top coating including properties that resist ultraviolet radiation from passing therethrough.

In refined aspects, the layer of primer coating includes a thickness in a range of about 0.0001 to 0.010 inches; wherein the layer of primer coating includes a thickness in a range of about 0.0005 to 0.006 inches; wherein the layer of primer coating includes a thickness in a range of about 0.005 to 0.006 inches; wherein the layer of mid coating includes a thickness greater than about 0.001 inches; wherein the layer of mid coating includes a thickness greater than about 0.005 inches; wherein the layer of mid coating includes a maximum thickness of about 0.750 inches; wherein the layer of top coating includes a thickness in a range of about 0.0001 to 0.060 inches; wherein the layer of top coating includes a thickness in a range of about 0.0001 to 0.010 inches; wherein the layer of top coating includes a thickness in a range of about 0.0005 to 0.008 inches; wherein a chemical composition of the primer coating material includes: about 10 to 30 weight percent of Titanium Dioxide; about 1 to 5 weight percent of Magnesium Silicate (TALC); about 5 to 10 weight percent of Zinc Phosphate; about 1 to 5 weight percent of Xylene and mixed Isomers; about 1 to 5 weight percent of Toluene; about 1 to 5 weight percent of Methyl Amyl Ketone; about 1 to 5 weight percent of Methyl Isobutyl Ketone; about 5 to 10 weight percent of Methyl Ethyl Ketone; about 5 to 10 weight percent of N-Butyl Acetate; and about 1 to 5 weight percent of Ethylbenzene; wherein a chemical composition of the mid coating material includes: a first portion defined by less than 60 weight percent of Diphenylmethane-4, 4'-diisocyanate (MDI) and less than 40 weight percent of Methylenediphenyl diisocyanate; and a second portion defined by about 50 to 75 weight percent of alpha-(2-Aminomethylethyl)-omega-(2-aminomethylethoxy)-poly (oxy(methyl-1,2-ethanediyl)) and about 20.0 to 25 weight percent of diethylmethylbenzenediamine; wherein a chemical composition of the top coating material includes: about 25 to 50 weight percent of Barium Sulfate; about 10 to 25 weight percent of Siloxanes and Silicones, DI-ME, Methoxy PH, Polyme; about 10 to 25 weight percent of 1, 6-Hexanediol diacrylate; about 10 to 25 weight percent of Acrylated Urethane Oligomer; about 1 to 10 weight percent of Isopropyl Alcohol; about 1 to 10 weight percent of Titanium Dioxide; about 1 to 10 weight percent of Xylenes (o-, m-, p-isomers); and about 1 to 10 weight percent of Propylene Glycol Monomethyl Ether Acetate; wherein the apparatus includes an electrical inductive device, a heat exchanger, a radiator, a valve, a tap changer, instrumentation, and/or an electrical machine; further comprising one or more sensors in sensed communication with the apparatus, the one or more sensors operable for determining a condition of a portion of the apparatus; wherein the sensors are smart sensors operable for collecting vibration, sound, pressure and/or temperature data; wherein the data is transmitted to a remote location, analyzed for optimizing performance and determining predictive maintenance; wherein data transmission means includes dedicated signal lines, Wi-Fi signals, radio frequency signals, microwave signals and/or Bluetooth signals in communication with the World Wide Web; wherein the primer coating includes anti-corrosive properties; wherein the multi-layer coating is operable for preventing leakage of fluid from the hole; and wherein the layer of primer coating includes a thickness in a range of about 0.0001 to 0.060 inches.

In another aspect, the present disclosure includes a housing configured to hold a fluid; a coating applied to an outer wall of the housing; and wherein the coating includes a primer layer applied to the outer wall and a polyurea mid coat layer applied over the primer layer.

In refined aspects, the coating is operable to prevent leakage of fluid from the housing for apertures sized to about 12.7 mm in diameter; wherein the primer layer includes a thickness in a range of about 0.0001 to 0.010 inches; wherein the primer layer includes a thickness in a range of about 0.0001 to 0.060 inches; wherein the primer layer includes a zinc rich composition; wherein the mid coat layer includes a thickness greater than about 0.001 inches; further comprising a UV resistant top coat layer applied over the mid coat layer, wherein the top coat layer includes a thickness in a range of about 0.0001 to 0.010 inches; wherein the housing is associated with an electrical inductive device, a heat exchanger, a radiator, a valve, a tap changer, instrumentation, and/or an electrical machine; further comprising one or more smart sensors operable for sensing a vibration, a sound, a pressure and/or a temperature; wherein the smart sensors transmit sensed data to a remote location for analysis; and wherein the sensed data is transmitted through one or more mediums including dedicated signal lines, Wi-Fi signals, radio frequency signals, microwave signals and/or Bluetooth signals.

In yet another aspect, the present disclosure includes a method for at least partially filling a housing with a fluid; applying a primer coating layer to an outer surface of the housing; applying a mid coating layer to the primer coating layer; applying a top coating layer to the mid coating layer; and wherein the primer coating layer includes corrosion inhibitors, the mid coating layer includes mechanical properties to prevent fluid leakage through a hole of up to approximately 12.7 mm, and the top coating includes UV resistant properties.

In refined aspects, the method further comprises sensing a pressure, a temperature, a sound and/or vibration with a sensor in sensed communication with the housing; and further comprising transmitting sensed data obtained by the sensor to a remote location via one or more mediums including dedicated signal lines, Wi-Fi signals, radio frequency signals, microwave signals and/or Bluetooth signals.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A system for detecting an object approaching and/or impacting electrical equipment, the system comprising:
    a housing for the electrical equipment;
    at least one acoustic sensor for measuring a sound pressure of the object approaching the housing, the at least one acoustic sensor disposed at a predetermined location at which the at least one acoustic sensor is not in contact with the housing;
    at least one vibration sensor for measuring an acceleration of a surface of the housing caused by the object striking the housing, the at least one vibration sensor disposed at a predetermined location at which the at least one vibration sensor is in contact with the housing;
    at least one computer processor; and
    a non-transitory computer readable storage medium having thereon a plurality of machine-readable instructions that when executed by the at least one computer processor cause the at least one computer processor to determine at least one of approach of the object for impact on the housing using comparisons of signal received from the at least one acoustic sensor against a threshold, and impact of the object to the housing using comparisons of signal received from the at least one vibration sensor against a threshold for the acceleration.

2. The system of claim 1, wherein the at least one computer processor carries out instructions to perform the following steps:
    a. determine a maximum amplitude and a decay duration of a raw vibration signal;
    b. compare the maximum amplitude and the decay duration of the raw vibration signal against thresholds for an amplitude and a duration of the raw vibration signal; and
    c. transmit an alarm signal if the thresholds for the amplitude and the duration of the raw vibration signal are met or exceeded.

3. The system of claim 1, wherein the at least one computer processor carries out instructions to perform the following steps:
    a. compare the sound pressure measurement of the at least one acoustic sensor with a threshold for the sound pressure; and
    b. transmit an alarm signal if the threshold for the sound pressure is met or exceeded.

4. The system of claim 1, wherein the at least one vibration sensor is an RMS accelerometer.

5. The system of claim 1, wherein the at least one vibration sensor is a raw vibration sensor.

6. The system of claim 1, wherein the predetermined location of the at least one acoustic sensor is above an outer surface of a top wall of the housing, and wherein the predetermined location at which the at least one vibration sensor is in contact with the housing is a location at which the at least one vibration sensor is in contact with the outer surface of the top wall.

7. The system of claim 1, wherein the at least one vibration sensor comprises four sensors, and wherein the housing comprises a plurality of sidewalls, each of the four sensors being disposed around a center of a different sidewall of the plurality of sidewalls of the housing.

8. The system of claim 1, wherein the at least one acoustic sensor comprises two acoustic sensors that are disposed at opposing corners of a base of the housing.

9. The system of claim 1, wherein the at least one acoustic sensor comprises two sensors that are each proximate to opposing corners of a top wall of the housing.

10. The system of claim 1, wherein the at least one acoustic sensor comprises four sensors that are each disposed proximate to opposing corners of a top wall of the housing.

11. The system of claim 1, wherein the electrical equipment is one of an inductive device, a switchgear, and a rotating machine.

12. The system of claim 1, wherein the housing comprises a plurality of walls comprising a top wall, a bottom wall, and at least one sidewall,
    wherein the at least one vibration sensor comprises at least two vibration sensors, the at least two vibration sensors being spaced apart from one another on a single wall of the plurality of walls of the housing;
    wherein the plurality of machine-readable instructions, when executed by the at least one computer processor, further cause the at least one computer processor to compare signals received from the at least two vibration sensors against thresholds for an acceleration to determine a location of an impact of the objection on the housing of the electrical equipment.

13. The system of claim 1,
    wherein the at least one acoustic sensor comprises a plurality of acoustic sensors arranged in a tetrahedral configuration, and
    wherein the plurality of machine-readable instructions, when executed by the at least one computer processor, cause the at least one computer processor to perform the following steps when one of an azimuth angle and an elevation angle in relation to an object origin is known:
determine the one of the azimuth angle and the elevation angle that is unknown based on at least one of a time of arrival of a muzzle blast and a time of arrival of a shockwave associated with the object with relation to each acoustic sensor of the at least one acoustic sensor; and
use the azimuth angle and the elevation angle to determine a distance to the object origin.

14. The system of claim 13, wherein the at least one acoustic sensor comprises three
acoustic sensors arranged in a configuration of a single tetrahedral array with relation to the housing.

15. The system of claim 13, wherein the at least one acoustic sensor comprises six acoustic sensors arranged in two tetrahedral arrays of three acoustic sensors each with relation to
the housing.

16. The system of claim 15, wherein only the time of arrival of the shockwave associated with the object with relation to each of the acoustic sensors in the two tetrahedral arrays is used to calculate the one of the azimuth angle and the elevation angle that is unknown, and from the azimuth angle and the elevation angle once known or calculated, a value is calculated for a member selected from a group consisting of distance to the object origin, an object trajectory and an object speed.

17. The system of claim 1, wherein the electrical equipment is an inductive device comprising:
a core having at least one core limb extending between a pair of yokes, at least one coil assembly mounted to the at least one core limb, and an insulating medium disposed in an internal volume of the housing, wherein the housing is a tank;
a measurement device that measures at least one of an insulating medium temperature, an insulating medium pressure, and an insulating medium level;
a primary cooling system and a secondary cooling system, each of the primary cooling system and the second cooling system comprising at least one fan, a radiator or cooler, and at least one valve to control a flow of the insulating medium;
wherein the plurality of machine-readable instructions, when executed by at least one computer processor, further cause the at least one computer processor to compare at least one of an oil temperature, an oil pressure, and an oil level as measured by the measurement device against a predetermined threshold for at least one of the insulating medium temperature, the insulating medium pressure, and the insulating medium level.

18. The system of claim 17, wherein the at least one computer processor carries out
instructions to perform the following steps:
determine whether a measurement by the measurement device for at least one of the insulating medium temperature, the insulating medium pressure, and the insulating medium level is actionable, and if actionable;
close the at least one valve of the primary cooling system; and
open the at least one valve of the secondary cooling system.

19. The system of claim 1, wherein the at least one acoustic sensor and the at least one vibration sensor are positioned at a local plant, and wherein the system further includes a gateway structured to receive data from the at least one acoustic sensor and the at least one vibration sensor and transmit the received data to a cloud computing system configured to perform at least one of data analysis, data modeling, data storage and resource management, and to provide the results to devices located at the local plant or at a remote workstation.

20. The system of claim 1, wherein the system further comprises a data processing unit and a substation monitoring and surveillance system, the data processing unit including the at least one computer processor and configured to generate a trigger signal that triggers the substation monitoring and surveillance system to perform at least one of recording details of the impact of the housing by the object both before and during the impact, and directing surveillance camera at the substation to the power equipment that has been struck or is in the path of the projectile and the vicinity around the power equipment.

21. A system for detecting an object approaching and/or impacting electrical equipment, the system comprising:
a housing for the electrical equipment;
at least one acoustic sensor for measuring a sound pressure of the object approaching the housing, the at least one acoustic sensor disposed at a predetermined location at which the at least one acoustic sensor is not in contact with the housing;
at least one vibration sensor for measuring an acceleration of a surface of the housing caused by the object striking the housing, the at least one vibration sensor disposed at a predetermined location at which the at least one vibration sensor is in contact with the housing;
at least one computer processor; and
a non-transitory computer readable storage medium having thereon a plurality of machine-readable instructions that when executed by the at least one computer processor cause the at least one computer processor to determine at least one of approach of the object for impact on the housing using comparisons of signal received from the at least one acoustic sensor against a threshold, and impact of the object to the housing using comparisons of signal received from the at least one vibration sensor against a threshold for the acceleration,
wherein the at least one computer processor carries out instructions to perform the following steps:
a. determining that the signal received from at least one of the at least one acoustic sensor and the at least one vibration sensor is at an actionable level;
b. closing, upon determining the received signal is at an actionable level, valves to a primary cooling system of the electrical equipment; and
c. opening, upon closing of the valves of the primary cooling system in response to determining the received signal is an actionable level, valves to a secondary cooling system of the electrical equipment.

22. The system of claim 21, further comprising actuating fans of the secondary cooling system of the electrical equipment.

* * * * *